United States Patent
Lee et al.

(10) Patent No.: US 12,170,307 B2
(45) Date of Patent: Dec. 17, 2024

(54) DISPLAY DEVICE AND TILED DISPLAY DEVICE INCLUDING THE SAME

(71) Applicant: Samsung Display Co., Ltd., Yongin-si (KR)

(72) Inventors: Seung Min Lee, Hwaseong-si (KR); Kwang Young Choi, Incheon (KR); Sae Hee Ryu, Hwaseong-si (KR); Sol Ip Jeong, Cheonan-si (KR); Sang Ho Park, Hwaseong-si (KR); Jin Yool Kim, Anyang-si (KR); Cheon Jae Maeng, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 531 days.

(21) Appl. No.: 17/452,763

(22) Filed: Oct. 28, 2021

(65) Prior Publication Data
US 2022/0302202 A1 Sep. 22, 2022

(30) Foreign Application Priority Data
Mar. 17, 2021 (KR) .................. 10-2021-0034951

(51) Int. Cl.
| | |
|---|---|
| H01L 27/15 | (2006.01) |
| G09G 3/32 | (2016.01) |
| H01L 33/50 | (2010.01) |
| H01L 33/64 | (2010.01) |

(52) U.S. Cl.
CPC ............ *H01L 27/156* (2013.01); *G09G 3/32* (2013.01); *H01L 33/50* (2013.01); *H01L 33/64* (2013.01); *G09G 2300/0426* (2013.01); *G09G 2310/08* (2013.01); *G09G 2330/02* (2013.01)

(58) Field of Classification Search
CPC ....... H01L 27/156; H01L 33/50; H01L 33/64; H01L 25/167; H01L 33/62; H01L 25/0753; H01L 27/124; G09G 3/32; G09G 2300/0426; G09G 2310/08; G09G 2330/02; G09G 3/3225; G09G 3/3266; G09G 3/3275; H10K 59/18; H10K 59/131; H10K 59/87; H10K 59/123; H10K 59/1213; H10K 59/1315; H10K 59/1275; H10K 59/38
See application file for complete search history.

(56) References Cited

U.S. PATENT DOCUMENTS

| | | |
|---|---|---|
| 9,515,131 B2 | 12/2016 | Mathew et al. |
| 10,181,507 B2 | 1/2019 | Bower et al. |
| 2019/0164487 A1* | 5/2019 | Lee ............... H10K 59/131 |
| 2020/0091270 A1 | 3/2020 | Jang |
| 2020/0127073 A1 | 4/2020 | Ke et al. |

(Continued)

FOREIGN PATENT DOCUMENTS

| | | |
|---|---|---|
| JP | 10-104651 A | 4/1998 |
| JP | 2016-091001 A | 5/2016 |

(Continued)

*Primary Examiner* — Jonathan Han
(74) *Attorney, Agent, or Firm* — Lewis Roca Rothgerber Christie LLP

(57) ABSTRACT

A display device comprises a first substrate, a first power bottom line on the first substrate, a second substrate on the first power bottom line, the second substrate having a first power connection hole to expose the first power bottom line, and a pixel driving unit including a plurality of switching elements on the second substrate.

39 Claims, 56 Drawing Sheets

(56) References Cited

U.S. PATENT DOCUMENTS

| | | | |
|---|---|---|---|
| 2020/0211929 A1 | 7/2020 | Son et al. | |
| 2020/0219961 A1 | 7/2020 | Managaki | |
| 2020/0243006 A1 | 7/2020 | Kim et al. | |
| 2020/0350476 A1* | 11/2020 | Lee | G02B 27/0006 |
| 2021/0074769 A1 | 3/2021 | Park et al. | |
| 2021/0226174 A1* | 7/2021 | Kim | G06F 3/0412 |

FOREIGN PATENT DOCUMENTS

| | | |
|---|---|---|
| JP | 2017-161887 A | 9/2017 |
| KR | 10-2014-0135565 A | 11/2014 |
| KR | 10-2018-0100013 A | 9/2018 |
| KR | 10-2019-0048642 A | 5/2019 |
| KR | 10-2019-0068112 A | 6/2019 |
| KR | 10-2020026 B1 | 9/2019 |
| KR | 10-2049735 B1 | 11/2019 |
| KR | 10-2064806 B1 | 1/2020 |
| KR | 10-2020-0031468 A | 3/2020 |
| KR | 10-2020-0083713 A | 7/2020 |
| WO | WO 2016/041907 A1 | 3/2016 |

\* cited by examiner

DISPLAY DEVICE AND TILED DISPLAY DEVICE INCLUDING THE SAME

CROSS-REFERENCE TO RELATED APPLICATION

This application claims priority to and the benefit of Korean Patent Application No. 10-2021-0034951, filed on Mar. 17, 2021, in the Korean Intellectual Property Office (KIPO), the entire content of which is incorporated by reference herein.

BACKGROUND

1. Field

The present disclosure relates to a display device and a tiled display device including the same.

2. Description of the Related Art

As the information society develops, the demand for display devices for displaying images is increasing in various forms. For example, display devices are used in various electronic devices such as smartphones, digital cameras, notebook computers, navigation devices, and smart televisions. The display devices may be flat panel display devices such as liquid crystal display devices, field emission display devices, and organic light emitting display devices. In a light emitting display device among the flat panel display devices, each pixel of a display panel includes a light emitting element that can emit light by itself. Thus, the light emitting display device can display an image without a backlight unit that provides light to the display panel.

When a display device is manufactured to have a large size, a defect rate of light emitting elements may increase due to an increase in the number of pixels, and productivity or reliability may be reduced. Therefore, a tiled display device may be implemented to provide a large screen by connecting a plurality of relatively small display devices (e.g., display devices with a lower number of pixels than a large size display device). The tiled display device may include a seam between display devices adjacent to each other. When one image is displayed on the entire screen, the seam between the display devices may give a sense of separation when viewing the entire screen, thereby reducing the degree of immersion in the image.

SUMMARY

Aspects of some embodiments of the present disclosure are directed toward a display device that can eliminate or reduce a sense of separation between display devices adjacent to each other in a tiled display device and improve the degree of immersion in images by preventing or substantially preventing a seam between the adjacent display devices from being recognized.

Aspects of some embodiments of the present disclosure are directed toward a tiled display device which can eliminate or reduce a sense of separation between display devices adjacent to each other and improve the degree of immersion in images by preventing or substantially preventing a seam between the adjacent display devices from being recognized.

However, embodiments of the present disclosure are not limited to those set forth herein. The above and other embodiments of the present disclosure will become more apparent to one of ordinary skill in the art to which the present disclosure pertains by referencing the detailed description of the present disclosure given below.

According to some embodiments of the present disclosure, a display device includes a first substrate, a first power bottom line on the first substrate, a second substrate on the first power bottom line, the second substrate having a first power connection hole to expose the first power bottom line, and a pixel driving unit including a plurality of switching elements on the second substrate.

The first power connection hole may not overlap the pixel driving unit in a thickness direction of the second substrate.

The first substrate may have a first power pad hole to expose the first power bottom line.

The display device may further include a circuit board including a bump electrically connected to the first power bottom line through the first power pad hole, and a conductive adhesive between the first power bottom line and the bump.

The display device may further include a heat dissipation layer under the first substrate, the heat dissipation layer including a metal material.

The heat dissipation layer may be on the circuit board.

A first power supply voltage may be applied to the first power bottom line.

The display device may further include a first power line on the second substrate, the first power line being electrically connected to the first power bottom line.

The display device may further include a first power connection unit protruding from the first power line, the first power connection unit being connected to the first power bottom line through the first power connection hole.

The display device may further include a first power connection electrode overlapping the first power line, the first power connection electrode being connected to the first power line through a first power contact hole.

The display device may further include a first power connection unit protruding from the first power connection electrode, the first power connection unit being connected to the first power bottom line through the first power connection hole.

The display device may further include a scan line extending in a first direction, and a vertical scan line extending in a second direction intersecting the first direction, the vertical scan line being connected to the scan line through a scan contact hole. The first power connection unit may overlap the vertical scan line in a thickness direction of the second substrate.

The display device may further include a second power connection electrode overlapping the first power line and the first power connection electrode, the second power connection electrode being connected to the first power line through a second power contact hole.

The display device may further include a first power connection unit protruding from the second power connection electrode, the first power connection unit being connected to the first power bottom line though the first power connection hole.

The display device may further include a scan line extending in a first direction, and a vertical scan line extending in a second direction intersecting the first direction, the vertical scan line being connected to the scan line through a scan contact hole. The first power connection unit may overlap the vertical scan line in a thickness direction of the second substrate.

The display device may further include a second power bottom line on the first substrate and to which a second power supply voltage different from the first power supply voltage may be applied.

The second substrate may have a second power connection hole to expose the second power bottom line.

The second power connection hole may not overlap the pixel driving unit in a thickness direction of the second substrate.

The first substrate may have a second power pad hole to expose the second power bottom line.

The display device may further include a second power line on the second substrate, the second power line being electrically connected to the second power bottom line, and a second power connection electrode overlapping the second power line, the second power connection electrode being connected to the second power line through a second power contact hole.

The display device may further include a second power connection unit protruding from the second power connection electrode, the second power connection unit being connected to the second power bottom line through the second power connection hole.

The display device may further include a scan line extending in a first direction, and a vertical scan line extending in a second direction intersecting the first direction, the vertical scan line being connected to the scan line through a scan contact hole. The second power connection unit overlaps the vertical scan line in a thickness direction of the second substrate.

The display device may further include a light emitting unit on the pixel driving unit, the light emitting unit being configured to emit light, a wavelength conversion layer on the light emitting unit, the wavelength conversion layer being configured to convert a wavelength of light emitted from the light emitting unit, a color filter layer on the wavelength conversion layer, the color filter layer being configured to transmit light having a wavelength in a range, and an antireflection layer on the color filter layer.

The antireflection layer may include a first inorganic layer, a second inorganic layer, and an organic layer, the first inorganic layer and the second inorganic layer including different materials from each other.

The display device may further include an overcoat layer on the antireflection layer, and a window on the overcoat layer.

The display device may further include a data bottom line on the first substrate and to which a data voltage may be applied.

The second substrate may have a first data connection hole to expose the data bottom line.

The first data connection hole may not overlap the pixel driving unit in a thickness direction of the second substrate.

The first substrate may have a data pad hole to expose the data bottom line.

The display device may further include a data connection unit connected to the data bottom line through the first data connection hole.

The display device may further include a data line on the second substrate, the data line being electrically connected to the data bottom line through the data connection unit.

The data connection unit may overlap the first power line in a thickness direction of the second substrate.

The display device may further include a scan line extending in a first direction, and a vertical scan line extending in a second direction intersecting the first direction, the vertical scan line being connected to the scan line through a scan contact hole. The data connection unit may overlap the vertical scan line in a thickness direction of the second substrate.

According to some embodiments of the present disclosure, a display device includes a first substrate, a second substrate on the first substrate, a conductive bottom line on the second substrate, a first barrier layer which is disposed on the conductive bottom line, the first barrier layer having a conductive connection hole to expose the conductive bottom line, and a pixel driving unit including a plurality of switching elements on the first barrier layer.

The conductive connection hole may not overlap the pixel driving unit in a thickness direction of the second substrate.

The first substrate and the second substrate have a conductive pad hole to expose the conductive bottom line.

The display device may further include a second barrier layer on the second substrate, the second barrier layer being under the conductive bottom line.

According to some embodiments of the present disclosure, a tiled display device includes a plurality of display devices and a coupling area between the display devices. Each of the display devices includes a substrate, a pixel driving unit including a plurality of switching elements on a surface of the substrate, a first power bottom line on the surface of the substrate and to which a first power supply voltage may be applied, a first power line on the surface of the substrate or the other surface of the substrate, the first power line being electrically connected to the first power bottom line, and a first power connection unit protruding from the first power line, the first power connection unit being connected to the first power bottom line though a first power connection hole. The first power connection hole does not overlap the pixel driving unit in a thickness direction of the substrate.

The tiled display device may further include a second power bottom line on a surface of a first substrate and to which a second power supply voltage different from the first power supply voltage may be applied, a second power line on the surface of the first substrate or an other surface of the first substrate, the second power line being electrically connected to the second power bottom line, and a second power connection unit protruding from the second power line, the second power connection unit contacting the second power bottom line through a second power connection hole. The second power connection hole does not overlap the pixel driving unit in the thickness direction of the substrate.

Aspects of some embodiments of the present disclosure are directed toward a display device and a tile-type display device including the same where the scan circuit board and the source circuit board are connected to the power lines, the scan lines, and the data lines through connection holes on the rear surface of the display device. Thus, the scan circuit board and the source circuit board may not be disposed on the front surface and/or side surfaces of the display device. Therefore, in the tile-type display device, because the width of the coupling area disposed between the plurality of display devices can be minimized or reduced, it is possible to prevent or substantially prevent the coupling area from being recognized by the user. Accordingly, it is possible to remove or reduce a sense of disconnection between the plurality of display devices and to improve immersion in an image.

Aspects of some embodiments of the present disclosure are directed toward a display device and a tile-type display device including the same where the conductive connection holes do not overlap the pixel driver in a third direction (e.g., a Z-axis direction or a thickness direction). Also, the conductive connection holes may not overlap the conductive wirings in the third direction (e.g., the Z-axis direction). Therefore, it is possible to prevent or reduce a step difference between the switching elements and the conductive lines of the pixel driver due to the conductive connection holes. Accordingly, it is possible to prevent or substantially prevent cracks from occurring in the switching elements and the conductive wires of the pixel driver due to the pressure applied when the circuit board is attached.

BRIEF DESCRIPTION OF THE DRAWINGS

The above and other embodiments and features of the present disclosure will become more apparent by describing embodiments thereof with reference to the attached drawings, in which.

DETAILED DESCRIPTION

Figure 1:
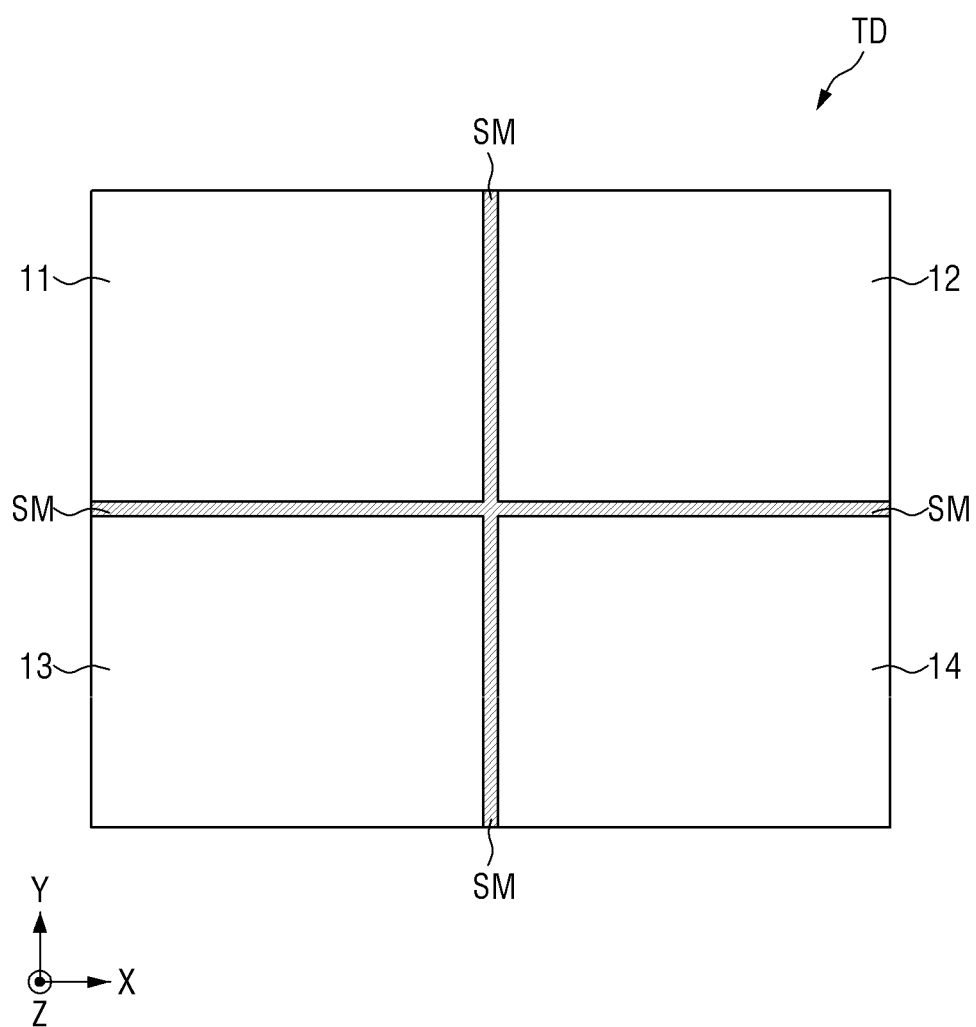
FIG. 1 is a plan view of a tiled display device according to one or more embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure might not be described.

Unless otherwise noted, like reference numerals, characters, or combinations thereof denote like elements throughout the attached drawings and the written description, and thus, descriptions thereof may not be repeated. Further, parts not related to the description of some embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane" or "plan view" refers to viewing a target portion from the top, and the phrase "on a cross-section" refers to viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. In other words, the x-axis, the y-axis, and the z-axis may cross each other. The same applies to a first direction, a second direction, and/or a third direction.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" may refer to within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate.

Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of some embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present disclosure, and should not be interpreted in an idealized or overly formal sense, unless expressly so defined herein.

FIG. 1 is a plan view of a tiled display device TD according to one or more embodiments of the present disclosure.

Referring to FIG. 1, the tiled display device TD may include a plurality of display devices 11, 12, 13, and 14. For example, the tiled display device TD may include a first display device 11, a second display device 12, a third display device 13, and a fourth display device 14.

The display devices 11, 12, 13, and 14 may be arranged in a grid shape. For example, the first display device 11 and the second display device 12 may be disposed in or along a first direction (e.g., an X-axis direction). The first display device 11 and the third display device 13 may be disposed in or along a second direction (e.g., a Y-axis direction). The third display device 13 and the fourth display device 14 may be disposed in or along the first direction (e.g., the X-axis direction). The second display device 12 and the fourth display device 14 may be disposed in or along the second direction (e.g., the Y-axis direction).

The number and arrangement of the display devices 11, 12, 13, and 14 in the tiled display device TD are not limited to those illustrated in FIG. 1. The number and arrangement of the display devices 11, 12, 13, and 14 in the tiled display device TD may be determined by the size of each of the display devices 11, 12, 13, and 14 of the tiled display device TD and the shape as well as the resolution of the tiled display device TD.

The display devices 11, 12, 13, and 14 may have the same size, but the present disclosure is not limited thereto. For example, the display devices 11, 12, 13, and 14 may also have different sizes from each other.

Each of the display devices 11, 12, 13, and 14 may be shaped like a rectangle including long sides and short sides. The long sides or short sides of the display devices 11, 12, 13, and 14 may be connected to each other. Some or all of the display devices 11, 12, 13, and 14 may be disposed at an edge of the tiled display device TD to form a side of the tiled display device TD. At least one of the display devices 11, 12, 13, and 14 may be disposed at at least one corner of the tiled display device TD and may form two adjacent sides of the tiled display device TD. At least one of the display devices 11, 12, 13, and 14 may be around (e.g., surrounded by) other display devices.

The overall shape of the tiled display device TD may be a planar shape, but the present disclosure is not limited thereto. The tiled display device TD may also have a three-dimensional (3D) shape to provide a 3D effect to a user. For example, when the tiled display device TD has a 3D shape, at least one of the display devices 11, 12, 13, and 14 may have a curved shape. Alternatively, the display devices 11, 12, 13, and 14 may each have a planar shape but may be connected to each other at an angle (e.g., a predetermined angle) so that the tiled display device TD can have a 3D shape.

The tiled display device TD may include a coupling area SM disposed between the display devices 11, 12, 13, and 14. For example, the coupling area SM may be disposed between the first display device 11 and the second display device 12, between the first display device 11 and the third display device 13, between the second display device 12 and the fourth display device 14, and between the third display device 13 and the fourth display device 14. The display devices 11, 12, 13, and 14 may be connected to each other through a coupling member or an adhesive member disposed in the coupling area SM.

A width of the coupling area SM may be very small to prevent or substantially prevent the coupling area SM from being recognized by a user. For example, the coupling area SM may not be recognized due to an image displayed by the display devices 11, 12, 13, and 14.

In addition, external light reflectance of each of the display devices 11, 12, 13, and 14 and external light reflectance of the coupling area SM may be substantially equal. Therefore, the tiled display device TD may eliminate or reduce a sense of separation between the display devices 11, 12, 13, and 14 and improve the degree of immersion in images by preventing or substantially preventing the coupling area SM between the display devices 11, 12, 13, and 14 from being recognized by a user.

Figure 2:
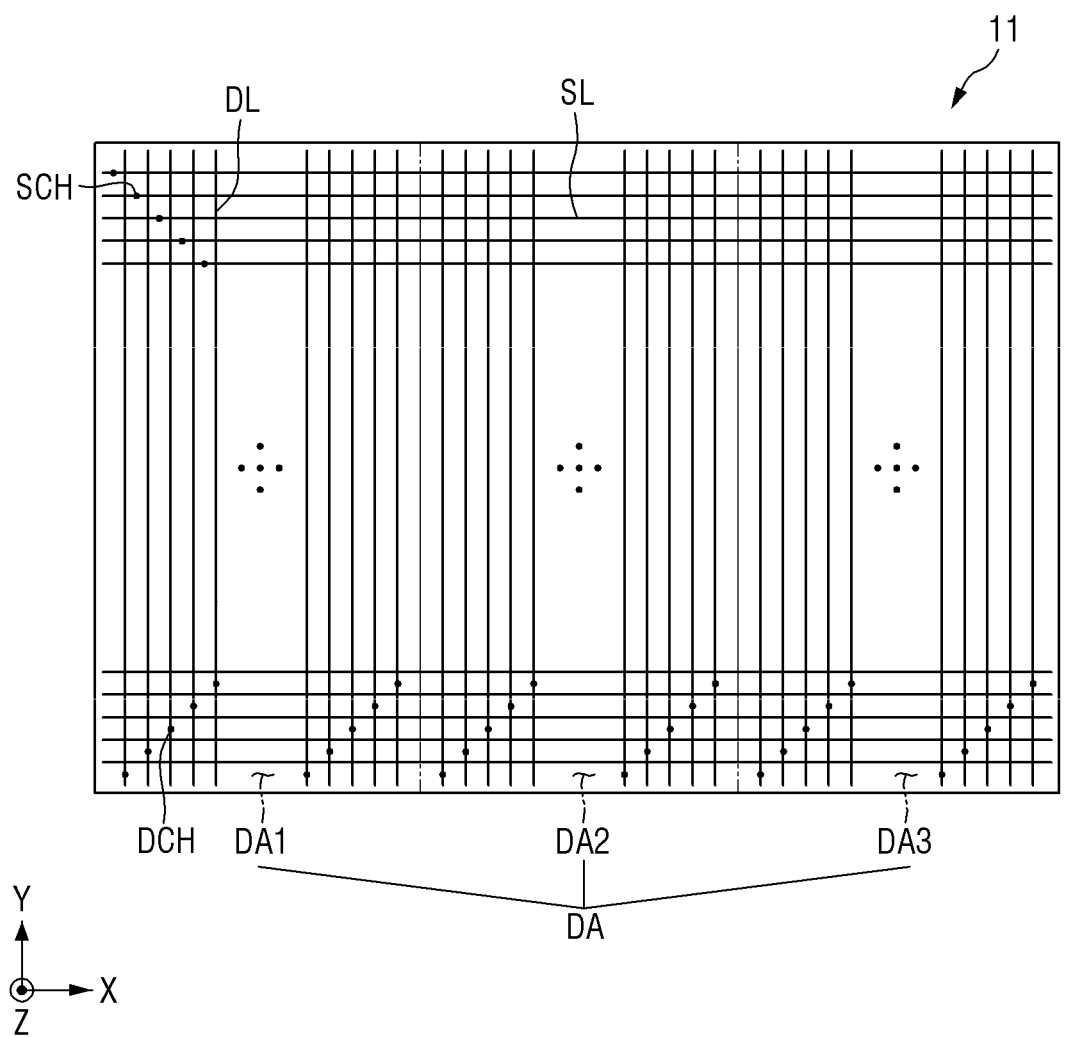
FIG. 2 is a plan view of a first display device according to one or more embodiments of the present disclosure.

FIG. 2 is a plan view of a first display device 11 according to one or more embodiments of the present disclosure.

Referring to FIG. 2, the first display device 11 according to one or more embodiments may include a first display area DA1, a second display area DA2, and a third display area DA3. The first display area DA1, the second display area DA2, and the third display area DA3 may be disposed in or along the first direction (e.g., the X-axis direction). The first display area DA1 may be disposed on a leftmost side, the third display area DA3 may be disposed on a rightmost side, and the second display area DA2 may be disposed between the first display area DA1 and the third display area DA3. The first display area DA1 may be defined as an area in which data lines DL are connected to a first source circuit board DCB1 (e.g., see FIG. 3A). The second display area DA2 may be defined as an area in which data lines DL are connected to a second source circuit board DCB2 (e.g., see FIG. 3A). The third display area DA3 may be defined as an area in which data lines DL are connected to a third source circuit board DCB3 (e.g., see FIG. 3A).

The first display device 11 according to one or more embodiments includes scan lines SL and the data lines DL.

The scan lines SL may extend in the first direction (e.g., the X-axis direction) and may be disposed in or along the second direction (e.g., the Y-axis direction). Each of the scan lines SL may be disposed in the first display area DA1, the second display area DA2, and the third display area DA3. Each of the scan lines SL may be connected to a corresponding scan bottom line SBL (e.g., see FIG. 3B) through a corresponding scan connection hole SCH on a side (e.g., a left side) of the first display device 11. That is, the scan lines SL may correspond one-to-one to the scan connection holes SCH.

Although the scan connection holes SCH are disposed on a side (e.g., the left side) of the first display device 11 in FIG. 2, the present disclosure is not limited thereto. In addition, although the scan connection holes SCH are disposed in the first display area DA1 in FIG. 2, the present disclosure is not limited thereto. The scan connection holes SCH may penetrate a substrate of the first display device 11. In this case, in order to prevent or substantially prevent cracks from being generated in the substrate of the first display device 1 by the scan connection holes SCH, scan connection holes SCH adjacent to each other may not overlap in the first direction (e.g., the X-axis direction) and the second direction (e.g., the Y-axis direction).

The data lines DL may extend in the second direction (e.g., the Y-axis direction) and may be disposed in or along the first direction (e.g., the X-axis direction). The data lines DL may be disposed in the first display area DA1, the second display area DA2, and the third display area DA3. Each of the data lines DL may be disposed in any one of the first display area DA1, the second display area DA2, and the third display area DA3. Each of the data lines DL may be connected to a corresponding data bottom line DBL (e.g., see FIG. 3A) through a corresponding data connection hole DCH on a side (e.g., a lower side) of the first display device 11. That is, the data lines DL may correspond one-to-one to the data connection holes DCH.

Although the data connection holes DCH are disposed on a side (e.g., the lower side) of the first display device 11, the present disclosure is not limited thereto. The data connection holes DCH may be disposed in the first display area DA1, the second display area DA2, and the third display area DA3. The data connection holes DCH may penetrate the substrate of the first display device 11. In this case, in order to prevent or substantially prevent cracks from being generated in the substrate of the first display device 1 by the data connection holes DCH, data connection holes DCH adjacent to each other may not overlap in the first direction (e.g., the X-axis direction) and the second direction (e.g., the Y-axis direction).

The first display device 11 does not include a non-display area disposed outside the first display area DA1, the second display area DA2, and the third display area DA3. Therefore, it is possible to prevent or substantially prevent the coupling area SM illustrated in FIG. 1 from being recognized by a user.

In addition, the first display device 11 may include first power lines VSL (e.g., see FIG. 4) and second power lines VDL (e.g., see FIG. 4) although not illustrated in FIG. 2 for ease of description. The first power lines VSL (e.g., see FIG. 4) and the second power lines VDL (e.g., see FIG. 4) may be disposed in the first display area DA1, the second display area DA2, and the third display area DA3.

Figure 3A:
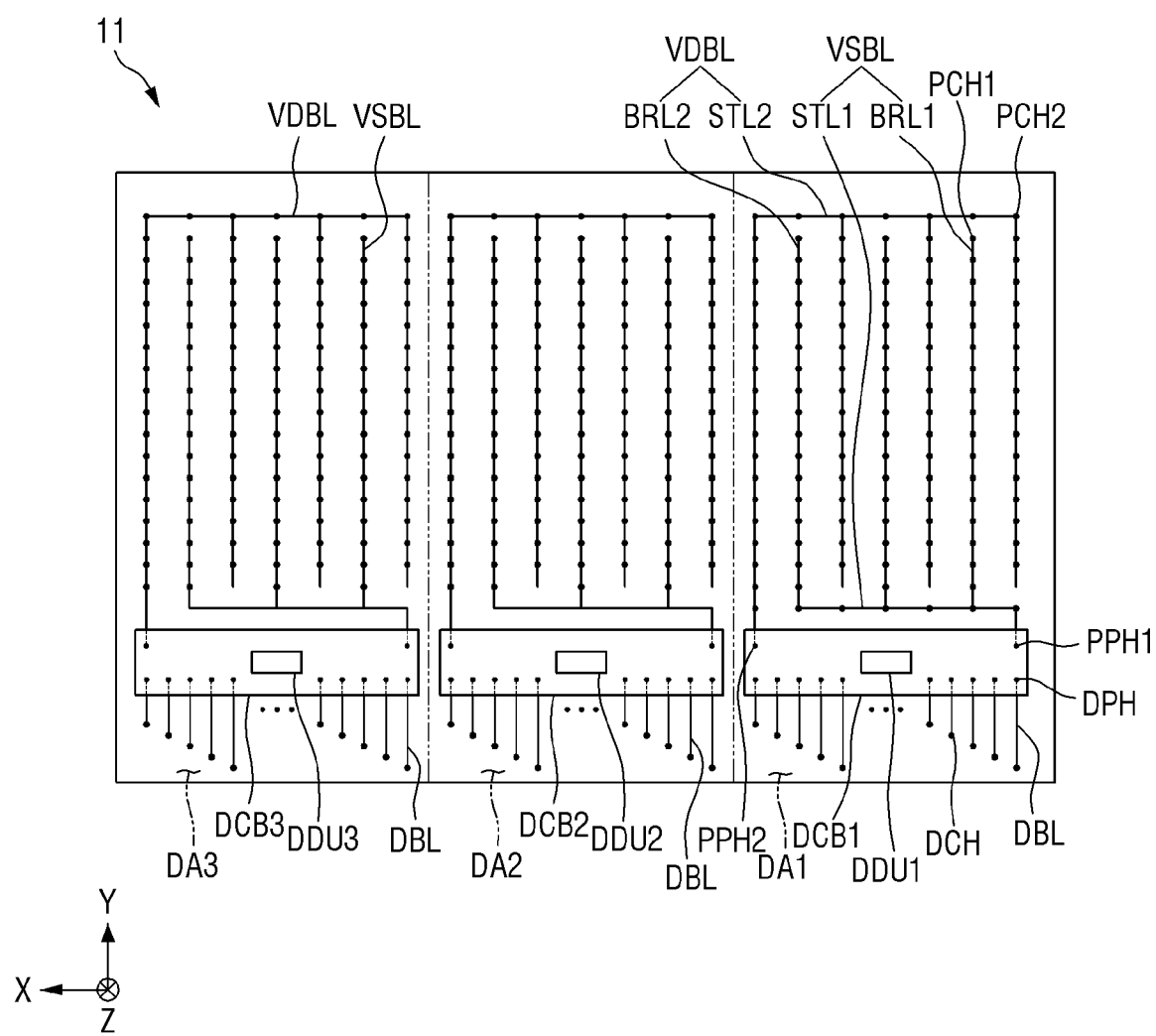
FIGS. 3A and 3B are bottom views of the first display device according to one or more embodiments of the present disclosure.
Figure 3B:
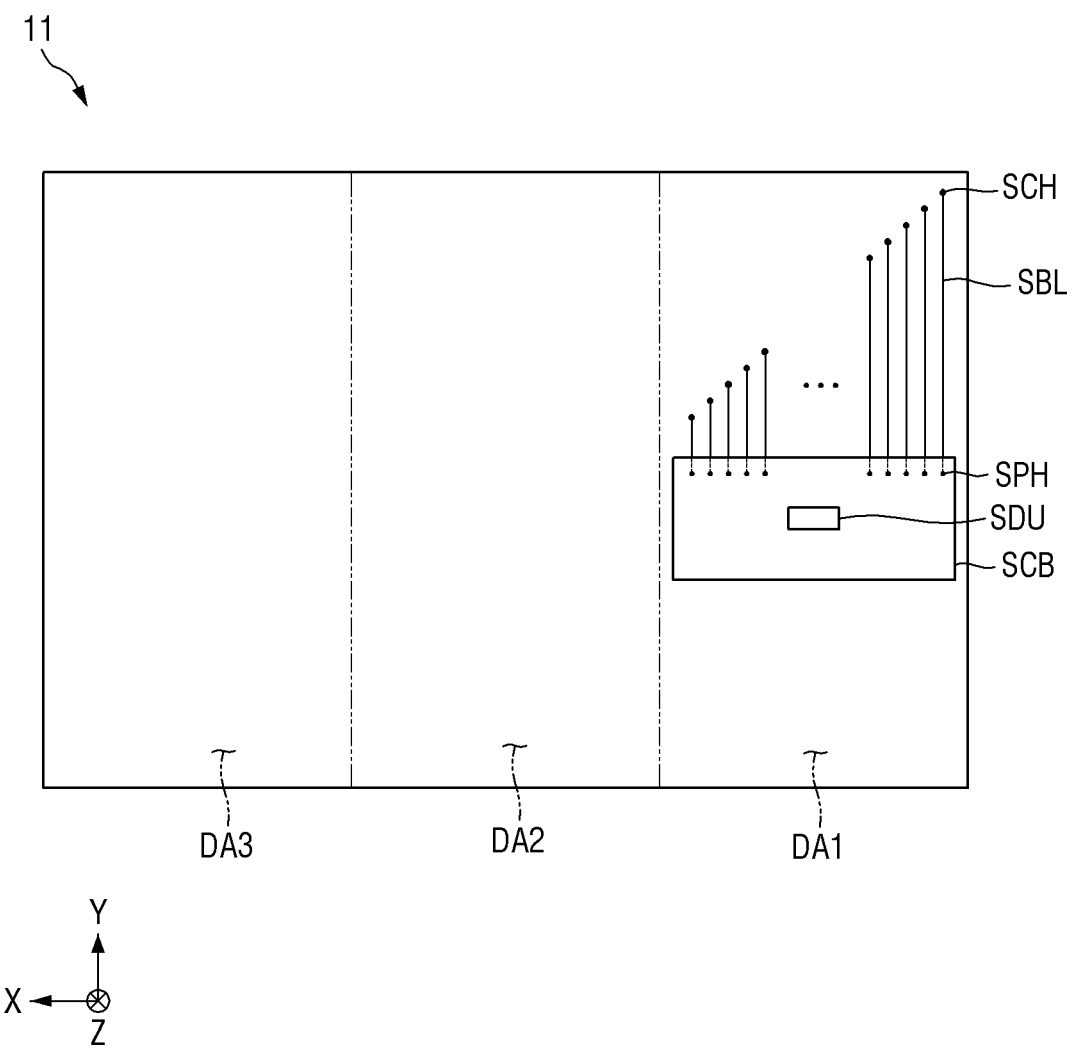

FIGS. 3A and 3B are bottom views of the first display device 11 according to one or more embodiments of the present disclosure. In FIG. 3A, the data bottom lines DBL, the data connection holes DCH, data pad holes DPH, first power bottom lines VSBL, first power connection holes PCH1, first power pad holes PPH1, second power bottom lines VDBL, second power connection holes PCH2, second power pad holes PPH2, the first source circuit board DCB1, the second source circuit board DCB2, the third source circuit board DCB3, a first source driving unit DDU1, a second source driving unit DDU2, and a third source driving unit DDU3 are illustrated for ease of description. In FIG. 3B, the scan bottom lines SBL, the scan connection holes SCH, scan pad holes SPH, a scan circuit board SCB, and a scan driving unit SDU are illustrated for ease of description.

Referring to FIGS. 3A and 3B, the first display device 11 according to one or more embodiments includes the scan bottom lines SBL, the data bottom lines DBL, the first power bottom lines VSBL, the second power bottom lines VDBL, the scan circuit board SCB, the first source circuit board DCB1, the second source circuit board DCB2, the third source circuit board DCB3, the scan driving unit SDU, the first source driving unit DDU1, the second source driving unit DDU2, and the third source driving unit DDU3.

Each of the scan bottom lines SBL may be connected to a corresponding scan line SL (e.g., see FIG. 2) through a corresponding scan connection hole SCH. That is, the scan bottom lines SBL may correspond one-to-one to the scan connection holes SCH. Each of the scan bottom lines SBL may be connected to a bump of the scan circuit board SCB through a corresponding scan pad hole SPH. That is, the scan bottom lines SBL may correspond one-to-one to the bumps of the scan circuit board SCB.

Accordingly, the scan lines SL may be connected (e.g., electrically connected) to the scan circuit board SCB through the scan connection holes SCH and the scan bottom lines SBL. Therefore, scan signals of the scan circuit board SCB may be transmitted to the scan lines SL through the scan bottom lines SBL and the scan connection holes SCH.

Each of the data bottom lines DBL may be connected to a corresponding data line DL (e.g., see FIG. 2) through a corresponding data connection hole DCH. That is, the data bottom lines DBL may correspond one-to-one to the data connection holes DCH. Each of the data bottom lines DBL may be connected to a bump of any one of the first source circuit board DCB1, the second source circuit board DCB2, and the third source circuit board DCB3 through a corresponding data pad hole DPH. That is, the data bottom lines DBL may correspond one-to-one to the bumps of the first source circuit board DCB1, the second source circuit board DCB2, and the third source circuit board DCB3.

Accordingly, the data lines DL may be connected (e.g., electrically connected) to the first source circuit board DCB1, the second source circuit board DCB2, and the third source circuit board DCB3 through the data connection holes DCH and the data bottom lines DBL. Therefore, data voltages of the first source circuit board DCB1, the second source circuit board DCB2, and the third source circuit board DCB3 may be applied to the data lines DL through the data bottom lines DBL and the data connection holes DCH.

Each of the first power bottom lines VSBL may include a first stem line STL1 extending in the first direction (e.g., the X-axis direction) and first branch lines BRL1 protruding from the first stem line STL1 and extending in the second direction (e.g., the Y-axis direction). Any one of the first branch lines BRL1 may be connected to a bump of any one of the first source circuit board DCB1, the second source circuit board DCB2, and the third source circuit board DCB3 through a corresponding first power pad hole PPH1.

Each of the first power bottom lines VSBL may be connected (e.g., electrically connected) to the first power lines VSL (e.g., see FIG. 4) through a plurality of first power connection holes PCH1. Accordingly, a first power supply voltage of the first source circuit board DCB1, the second source circuit board DCB2, and the third source circuit board DCB3 may be applied to the first power lines VSL (e.g., see FIG. 4) through the first power bottom lines VSBL and the first power connection holes PCH1.

The first power connection holes PCH1 may be arranged in the first direction (e.g., the X-axis direction) and the second direction (e.g., the Y-axis direction). The first power connection holes PCH1 may be arranged at equal or different intervals in the first direction (e.g., the X-axis direction). A distance between the first power connection holes PCH1 adjacent in the first direction (e.g., the X-axis direction) may be different from a distance between the first power connection holes PCH1 adjacent in the second direction (e.g., the Y-axis direction).

Each of the second power bottom lines VDBL may include a second stem line STL2 extending in the first direction (e.g., the X-axis direction) and second branch lines BRL2 protruding from the second stem line STL2 and extending in the second direction (e.g., the Y-axis direction). Any one of the second branch lines BRL2 may be connected to a bump of any one of the first source circuit board DCB1, the second source circuit board DCB2, and the third source circuit board DCB3 through a corresponding second power pad hole PPH2.

Each of the second power bottom lines VDBL may be connected (e.g., electrically connected) to the second power lines VDL (e.g., see FIG. 4) through a plurality of second power connection holes PCH2. Accordingly, a second power supply voltage of the first source circuit board DCB1, the second source circuit board DCB2, and the third source circuit board DCB3 may be applied to the second power lines VDL (e.g., see FIG. 4) through the second power bottom lines VDBL and the second power connection holes PCH2.

The second power connection holes PCH2 may be arranged in the first direction (e.g., the X-axis direction) and the second direction (e.g., the Y-axis direction). The second power connection holes PCH2 may be arranged at equal or different intervals in the first direction (e.g., the X-axis direction). A distance between the second power connection holes PCH2 adjacent in the first direction (e.g., the X-axis direction) may be different from a distance between the second power connection holes PCH2 adjacent in the second direction (e.g., the Y-axis direction).

The scan circuit board SCB may be disposed adjacent to the left side of the first display device 11 on which the scan connection holes SCH are disposed. Circuit lines may be patterned on the scan circuit board SCB, and the scan driving unit SDU may be mounted thereon. The scan driving unit SDU may overlap the first display area DA1. The scan circuit board SCB may be a flexible film, a chip on film, a flexible printed circuit board, or a printed circuit board.

The scan driving unit SDU may generate scan signals according to a scan timing control signal. The scan driving unit SDU may output the scan signals to the scan lines SL through the scan bottom lines SBL and the scan connection holes SCH. The scan driving unit SDU may be an integrated circuit.

The first source circuit board DCB1, the second source circuit board DCB2, and the third source circuit board DCB3 may be disposed adjacent to the lower side of the first display device 11 on which the data connection holes DCH are disposed. The first source circuit board DCB1 may overlap the first display area DA1, the second source circuit board DCB2 may overlap the second display area DA2, and the third source circuit board DCB3 may overlap the third display area DA3. Each of the first source circuit board DCB1, the second source circuit board DCB2, and the third source circuit board DCB3 may be a flexible film, a chip on film, a flexible printed circuit board, or a printed circuit board.

Each of the first source driving unit DDU1, the second source driving unit DDU2, and the third source driving unit DDU3 may generate data voltages according to a data timing control signal. Each of the first source driving unit DDU1, the second source driving unit DDU2, and the third source driving unit DDU3 may output the data voltages to the data lines DL through the data bottom lines DBL and the data connection holes DCH. Each of the first source driving unit DDU1, the second source driving unit DDU2, and the third source driving unit DDU3 may be an integrated circuit.

As illustrated in FIGS. 2, 3A and 3B, the scan lines SL may be connected (e.g., electrically connected) to the scan driving unit SDU of the scan circuit board SCB through the scan connection holes SCH and the scan bottom lines SBL. In addition, the data lines DL may be connected (e.g., electrically connected) to the first source driving unit DDU1, the second source driving unit DDU2, and the third source driving unit DDU3 of the first source circuit board DCB1, the second source circuit board DCB2, and the third source circuit board DCB3 through the data connection holes DCH and the data bottom lines DBL. In addition, the first power lines VSL (e.g., see FIG. 4) may be connected (e.g., electrically connected) to the first source circuit board DCB1, the second source circuit board DCB2, and the third source circuit board DCB3 through the first power connection holes PCH1 and the first power bottom lines VSBL. Further, the second power lines VDL (e.g., see FIG. 4) may be connected (e.g., electrically connected) to the first source circuit board DCB1, the second source circuit board DCB2, and the third source circuit board DCB3 through the second power connection holes PCH2 and the second power bottom lines VDBL. Therefore, the scan circuit board SCB, the first source circuit board DCB1, the second source circuit board DCB2, and the third source circuit board DCB3 are disposed only on a rear surface of the first display device 11 and are not disposed on a front surface and/or side surfaces of the first display device 11. For this reason, the first display device 11 may not include the non-display area, thereby minimizing the width of the coupling area SM. Accordingly, this may eliminate or reduce a sense of separation between the display devices 11, 12, 13, and 14 and improve the degree of immersion in images by preventing or substantially preventing the coupling area SM between the display devices 11, 12, 13, and 14 in the tiled display device TD from being recognized by a user.

The second display device 12, the third display device 13, and the fourth display device 14 illustrated in FIG. 1 are substantially the same as the first display device 11 described with reference to FIGS. 2, 3A and 3B. Therefore, a redundant description of the second display device 12, the third display device 13, and the fourth display device 14 may not be repeated.

Figure 4:
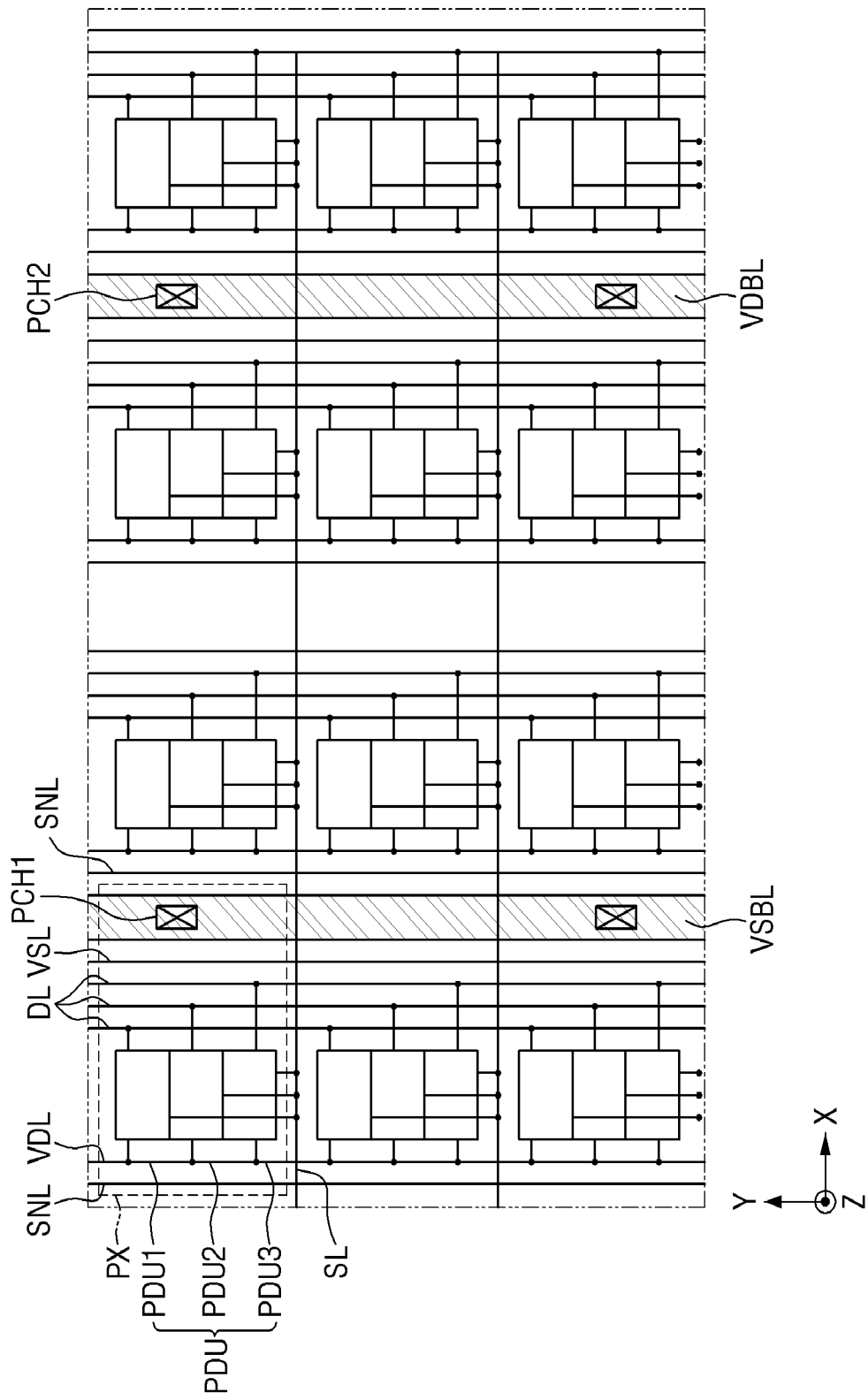
FIG. 4 is a layout view illustrating subpixels of the first display device according to one or more embodiments of the present disclosure.

FIG. 4 is a layout view illustrating subpixels of the first display device 11 according to one or more embodiments of the present disclosure.

In FIG. 4, pixels PX, the scan lines SL, the data lines DL, sensing lines SNL, the first power lines VSL, the second power lines VDL, the first power connection holes PCH1, the second power connection holes PCH2, a first power bottom line VSBL, and a second power bottom line VDBL are illustrated for ease of description.

Referring to FIG. 4, the pixels PX may be arranged along the first direction (e.g., the X-axis direction) and the second direction (e.g., the Y-axis direction). Each of the pixels PX may include a first subpixel PX1 emitting first light, a second subpixel emitting second light, and a third subpixel emitting third light.

Figure 5:
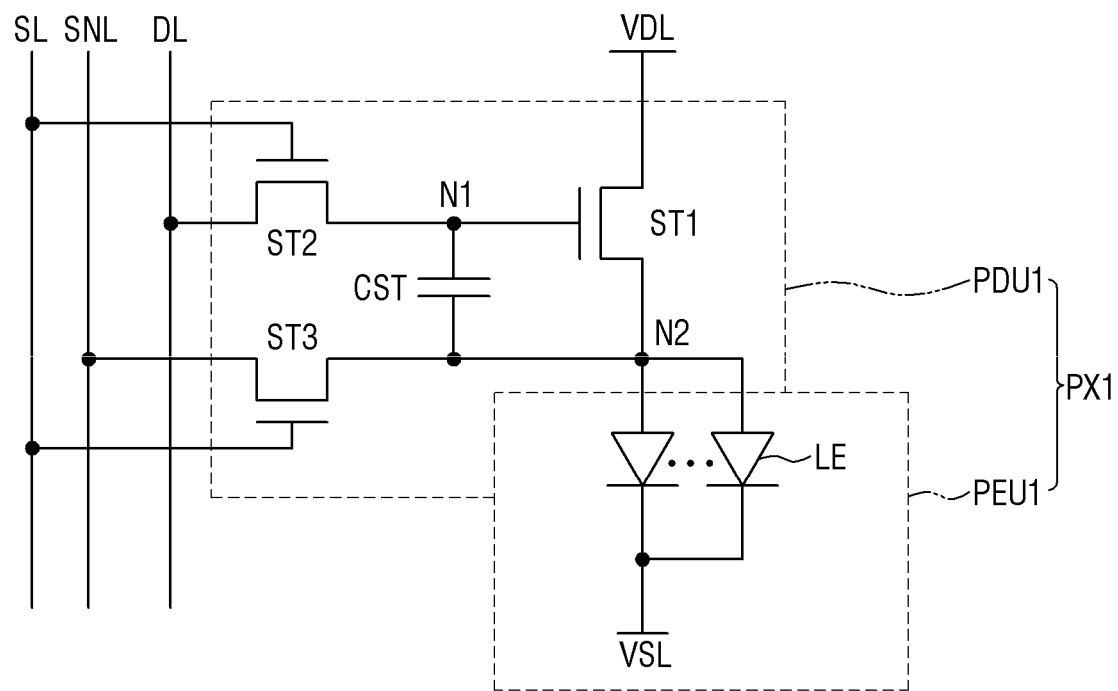
FIG. 5 is a circuit diagram of an example of a subpixel of FIG. 4.

The first subpixel PX1 (e.g., see FIG. 5) may include a first subpixel driving unit PDU1 and a first subpixel light emitting unit PEU1 (e.g., see FIG. 5). The second subpixel may include a second subpixel driving unit PDU2 and a second subpixel light emitting unit. The third subpixel may include a third subpixel driving unit PDU3 and a third subpixel light emitting unit. It should be noted that the first subpixel driving unit PDU1, the second subpixel driving unit PDU2 and the third subpixel driving unit PDU3 of each pixel PX are illustrated in FIG. 4, but the first subpixel light emitting unit PEU1 (e.g., see FIG. 5), the second subpixel light emitting unit and the third subpixel light emitting unit are not illustrated for ease of description. The first subpixel driving unit PDU1, the second subpixel driving unit PDU2, and the third subpixel driving unit PDU3 may be referred to as pixel driving units PDU.

Each of the first subpixel driving unit PDU1, the second subpixel driving unit PDU2, and the third subpixel driving unit PDU3 may be connected to a scan line SL, a data line DL, and a second power line VDL. The first subpixel driving unit PDU1, the second subpixel driving unit PDU2, and the third subpixel driving unit PDU3 may be connected to the same scan line SL as each other. The first subpixel driving unit PDU1, the second subpixel driving unit PDU2, and the third subpixel driving unit PDU3 may be connected to different data lines DL from each other. When a scan signal is transmitted to the scan line SL, each of the first subpixel driving unit PDU1, the second subpixel driving unit PDU2, and the third subpixel driving unit PDU3 may receive a data voltage of a corresponding data line DL.

Each of the first subpixel driving unit PDU1, the second subpixel driving unit PDU2, and the third subpixel driving unit PDU3 may include a plurality of transistors and at least one capacitor. For example, each of the first subpixel driving unit PDU1, the second subpixel driving unit PDU2, and the third subpixel driving unit PDU3 may include three transistors and one capacitor. A non-limiting example of the first subpixel driving unit PDU1 including three transistors and one capacitor is illustrated in FIG. 5.

Each of the first subpixel light emitting unit PEU1 (e.g., see FIG. 5), the second subpixel light emitting unit, and the third subpixel light emitting unit may include light emitting elements LE (e.g., see FIG. 5) that emit light (e.g., predetermined light). The light emitting elements LE (e.g., see FIG. 5) may emit light with a brightness (e.g., a predetermined brightness) according to a driving current of a corresponding one of the first subpixel light emitting unit PEU1 (e.g., see FIG. 5), the second subpixel light emitting unit, or the third subpixel light emitting unit.

The first subpixel driving unit PDU1 and the first subpixel light emitting unit PEU1 (e.g., see FIG. 5) will be described in more detail later with reference to FIG. 5.

The scan lines SL may extend in the first direction (e.g., the X-axis direction) and may be disposed in or along the second direction (e.g., the Y-axis direction). The data lines DL, the sensing lines SNL, the first power lines VSL, and the second power lines VDL may extend in the second direction (e.g., the Y-axis direction) and may be disposed in or along the first direction (e.g., the X-axis direction). A scan line SL, three data lines DL, a sensing line SNL, a first power line VSL, and a second power line VDL may overlap each pixel PX. However, the present disclosure is not limited thereto.

The first power bottom line VSBL and the second power bottom line VDBL may extend in the second direction (e.g., the Y-axis direction). The first power bottom line VSBL and the second power bottom line VDBL may not overlap the pixel driving units PDU, the first power lines VSL, the second power lines VDL, and the data lines DL.

The first power bottom line VSBL may be disposed between the first power line VSL of any one pixel PX and the sensing line SNL of another pixel PX neighboring the pixel PX in the first direction (e.g., the X-axis direction). The first power bottom line VSBL may overlap a first power connection hole PCH1. The first power bottom line VSBL may be connected (e.g., electrically connected) to the first power line VSL through the first power connection hole PCH1.

The second power bottom line VDBL may be disposed between the first power line VSL of any one pixel PX and the sensing line SNL of another pixel PX neighboring the pixel PX in the first direction (e.g., the X-axis direction). The second power bottom line VDBL may overlap a second power connection hole PCH2. The second power bottom line VDBL may be connected (e.g., electrically connected) to the second power line VDL through the second power connection hole PCH2.

Each of the first power connection holes PCH1 may be a hole for connecting (e.g., electrically connecting) a corresponding first power line VSL to the first power bottom line VSBL. Because the first power connection holes PCH1 are deep, the size of the first power connection holes PCH1 may be large. When a first power connection hole PCH1 overlaps switching elements of a pixel driving unit PDU, a scan line SL, a data line DL, a sensing line SNL, a first power line VSL, and a second power line VDL in a third direction (e.g., a Z-axis direction), a step height of the switching elements of the pixel driving unit PDU, the scan line SL, the data line DL, the sensing line SNL, the first power line VSL, and the second power line VDL may be large due to the first power connection hole PCH1. For example, there may be a large step difference between the switching elements of the pixel driving unit PDU, the scan line SL, the data line DL, the sensing line SNL, the first power line VSL and the second power line VDL disposed in or at the first power connection hole PCH1 and the switching elements of the pixel driving unit PDU, the scan line SL, the data line DL, the sensing line SNL, the first power line VSL and the second power line VDL not disposed in or at the first power connection hole PCH1.

As described with reference to FIGS. 2, 3A and 3B, the scan circuit board SCB, the first source circuit board DCB1, the second source circuit board DCB2, and/or the third source circuit board DCB3 may be attached to the rear surface of the first display device 11. When a step height of switching elements of a pixel driving unit PDU, a scan line SL, a data line DL, a sensing line SNL, a first power line VSL, or a second power line VDL is large due to a first power connection hole PCH1, cracks may be generated in the switching elements of the pixel driving unit PDU, the scan line SL, the data line DL, the sensing line SNL, the first power line VSL, or the second power line VDL by the pressure applied when the circuit boards (e.g., the scan circuit board SCB, the first source circuit board DCB1, the second source circuit board DCB2, and/or the third source circuit board DCB3) are attached.

Therefore, the first power connection holes PCH1 may not overlap the pixel driving units PDU in the third direction (e.g., the Z-axis direction). In addition, the first power connection holes PCH1 may not overlap the scan lines SL, the data lines DL, the sensing lines SNL, the first power lines VSL, and the second power lines VDL in the third direction (e.g., the Z-axis direction). In addition, the first power connection holes PCH1 may not overlap the light emitting units PEU1 (e.g., see FIG. 5) in the third direction (e.g., the Z-axis direction). Therefore, it is possible to prevent or substantially prevent the switching elements of the pixel driving units PDU, the scan lines SL, the data lines DL, the sensing lines SNL, the first power lines VSL, and the second power lines VDL from being stepped due to the first power connection holes PCH1. Accordingly, it is possible to prevent or substantially prevent cracks from being generated in the switching elements of the pixel driving units PDU, the scan lines SL, the sensing lines SNL, the first power lines VSL, the data lines DL, and the second power lines VDL by the pressure applied when the circuit boards (e.g., the scan circuit board SCB, the first source circuit board DCB1, the second source circuit board DCB2, and/or the third source circuit board DCB3) are attached.

Each of the second power connection holes PCH2 may be a hole for connecting (e.g., electrically connecting) a corresponding second power line VDL to the second power bottom line VDBL. Because the second power connection holes PCH2 are deep, the size of the second power connection holes PCH2 may be large. In this case, when a second power connection hole PCH2 overlaps switching elements of a pixel driving unit PDU, a scan line SL, a data line DL, a sensing line SNL, a first power line VSL, or a second power line VDL in the third direction (e.g., the Z-axis direction), a step height of the switching elements of the pixel driving unit PDU, the scan line SL, the data line DL, the sensing line SNL, the first power line VSL, or the second power line VDL may be large due to the second power connection hole PCH2.

As described with reference to FIGS. 2, 3A and 3B, the scan circuit board SCB, the first source circuit board DCB1, the second source circuit board DCB2, and/or the third source circuit board DCB3 may be attached to the rear surface of the first display device 11. When a step height of switching elements of a pixel driving unit PDU, a scan line SL, a data line DL, a sensing line SNL, a first power line VSL, or a second power line VDL is large due to a second power connection hole PCH2, cracks may be generated in the switching elements of the pixel driving unit PDU, the scan line SL, the data line DL, the sensing line SNL, the first power line VSL, or the second power line VDL by the pressure applied when the circuit boards (e.g., the scan circuit board SCB, the first source circuit board DCB1, the second source circuit board DCB2, and/or the third source circuit board DCB3) are attached.

Therefore, the second power connection holes PCH2 may not overlap the pixel driving units PDU in the third direction (e.g., the Z-axis direction). In addition, the second power connection holes PCH2 may not overlap the scan lines SL, the data lines DL, the sensing lines SNL, the first power lines VSL, and the second power lines VDL in the third direction (e.g., the Z-axis direction). In addition, the second power connection holes PCH2 may not overlap the light emitting units PEU1 (e.g., see FIG. 5) in the third direction (e.g., the Z-axis direction). Therefore, it is possible to prevent or substantially prevent the switching elements of the pixel driving units PDU, the scan lines SL, the data lines DL, the sensing lines SNL, the first power lines VSL, and the second power lines VDL from being stepped due to the second power connection holes PCH2. Accordingly, it is possible to prevent or substantially prevent cracks from being generated in the switching elements of the pixel driving units PDU, the scan lines SL, the first power lines VSL, the data lines DL, the sensing lines SNL, and the second power lines VDL by the pressure applied when the circuit boards (e.g., the scan circuit board SCB, the first source circuit board DCB1, the second source circuit board DCB2, and/or the third source circuit board DCB3) are attached.

In a pixel PX disposed at a left edge of the first display device 11, a first power connection hole PCH1 or a second power connection hole PCH2 may be disposed on a right side of a pixel driving unit PDU. That is, the closer the first power connection hole PCH1 or the second power connection hole PCH2 is to the left edge of the first display device 11, the higher the probability of cracking of a second substrate SUB2. Therefore, the first power connection hole PCH1 or the second power connection hole PCH2 may be disposed farther away from the left edge of the first display device 11 than the pixel driving unit PDU is from the left edge of the first display device 11. Accordingly, the probability of cracking of the second substrate SUB2 due to the first power connection hole PCH1 or the second power connection hole PCH2 may be reduced.

In addition, in a pixel PX disposed at a right edge of the first display device 11, a first power connection hole PCH1 or a second power connection hole PCH2 may be disposed on a left side of a pixel driving unit PDU. That is, the closer the first power connection hole PCH1 or the second power connection hole PCH2 is to the right edge of the first display device 11, the higher the probability of cracking of the second substrate SUB2. Therefore, the first power connection hole PCH1 or the second power connection hole PCH2 may be disposed farther away from the right edge of the first display device 11 than the pixel driving unit PDU is from the right edge of the first display device 11. Accordingly, the probability of cracking of the second substrate SUB2 due to the first power connection hole PCH1 or the second power connection hole PCH2 may be reduced.

FIG. 5 is a circuit diagram of an example of a first subpixel PX1 according to one or more embodiments of the present disclosure.

Referring to FIG. 5, the first subpixel PX1 according to one or more embodiments may include a first pixel driving unit PDU1 and a first light emitting unit PEU1.

The first pixel driving unit PDU1 may supply a driving current to the first light emitting unit PEU1 according to a data voltage of a data line DL. The first pixel driving unit PDU1 may include a first switching element ST1, a second switching element ST2, a third switching element ST3, and a capacitor CST. Each of the first switching element ST1, the second switching element ST2, and the third switching element ST3 may be a transistor.

The first light emitting unit PEU1 may emit light according to the driving current of the first pixel driving unit PDU1. The first light emitting unit PEU1 may include a plurality of light emitting elements LE.

The first switching element ST1 may control a driving current supplied to the light emitting elements LE. The first switching element ST1 may generate the driving current based on a voltage of a first node N1. A gate electrode of the first switching element ST1 may be connected to the first node N1. That is, the gate electrode of the first switching element ST1 may be connected to a source electrode of the second switching element ST2 and a first electrode of the capacitor CST. A drain electrode of the first switching element ST1 may be connected to a second power line VDL. The drain electrode of the first switching element ST1 may receive the second power supply voltage from the second power line VDL. A source electrode of the first switching element ST1 may be connected to a second node N2. That is, the source electrode of the first switching element ST1 may be connected to a source electrode of the third switching element ST3, a second electrode of the capacitor CST, and first electrodes of the light emitting elements LE.

The second switching element ST2 may supply a data voltage to the first node N1 based on a scan signal of a scan line SL. A gate electrode of the second switching element ST2 may be connected to the scan line SL to receive the scan signal. A drain electrode of the second switching element ST2 may be connected to the data line DL to receive the data voltage. The source electrode of the second switching element ST2 may be connected to the first node N1. That is, the source electrode of the second switching element ST2 may be connected to the gate electrode of the first switching element ST1 and the first electrode of the capacitor CST.

The third switching element ST3 may connect a sensing line SNL to the second node N2 based on the scan signal of the scan line SL. The third switching element ST3 may supply an initialization voltage to the second node N2 or supply a voltage of the second node N2 to the sensing line SNL. A gate electrode of the third switching element ST3 may be connected to the scan line SL to receive the scan signal. A drain electrode of the third switching element ST3 may be connected to the sensing line SNL to receive the initialization voltage. The source electrode of the third switching element ST3 may be connected to the second node N2. That is, the source electrode of the third switching element ST3 may be connected to the source electrode of the first switching element ST1, the second electrode of the capacitor CST, and the first electrodes of the light emitting elements LE.

The capacitor CST may be connected between the first node N1 and the second node N2. For example, the first electrode of the capacitor CST may be connected to the first node N1, and the second electrode of the capacitor CST may be connected to the second node N2. Therefore, a potential difference between the first node N1 and the second node N2 may be maintained by the capacitor CST.

The light emitting elements LE may emit light in response to the driving current. The light emitting elements LE may be connected in parallel. The first electrode of each of the light emitting elements LE may be connected to the second node N2, and a second electrode of each of the light emitting elements LE may be connected to a first power line VSL. The amount of light emission or light emission luminance of each of the light emitting elements LE may be proportional to the magnitude of the driving current. Each of the light emitting elements LE may be an organic light emitting diode, a micro light emitting diode, a quantum dot light emitting diode, or an inorganic light emitting diode.

A second subpixel may include a second pixel driving unit PDU2 (e.g., see FIG. 4) and a second light emitting unit, and a third subpixel may include a third pixel driving unit PDU3 (e.g., see FIG. 4) and a third light emitting unit. The second pixel driving unit PDU2 (e.g., see FIG. 4) and the third pixel driving unit PDU3 (e.g., see FIG. 4) may be substantially the same as the first pixel driving unit PDU1 described with reference to FIG. 5, and thus a redundant description of the second pixel driving unit PDU2 (e.g., see FIG. 4) and the third pixel driving unit PDU3 (e.g., see FIG. 4) may not be repeated. In addition, the second light emitting unit and the third light emitting unit may be substantially the same as the first light emitting unit PEU1 described with reference to FIG. 5, and thus a redundant description of the second light emitting unit and the third light emitting unit may not be repeated.

Figure 6:
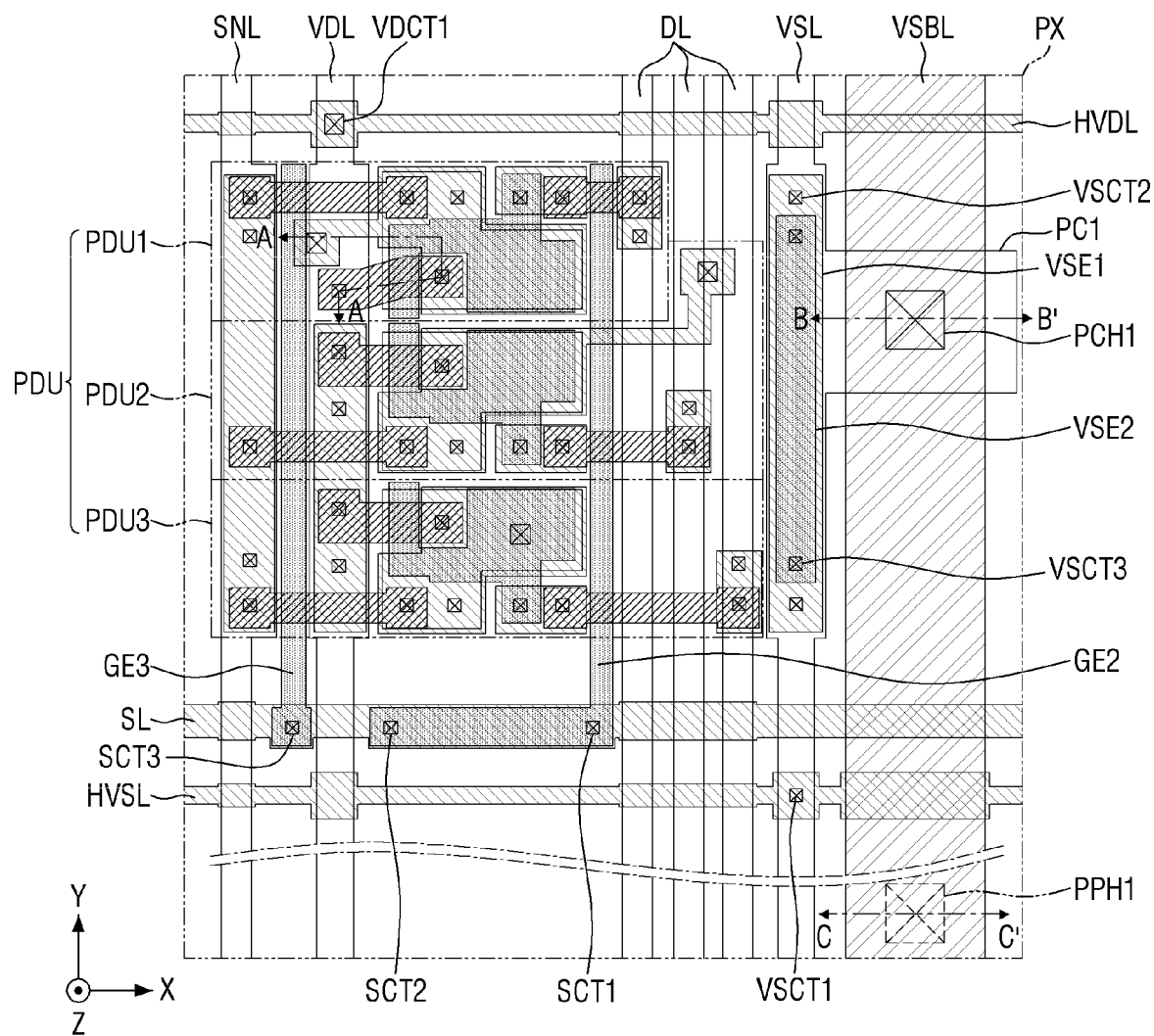
FIG. 6 is a layout view illustrating an example of a first pixel driving unit, a second pixel driving unit, a third pixel driving unit, a first power connection hole, and a first power pad hole of FIG. 4.
Figure 7:
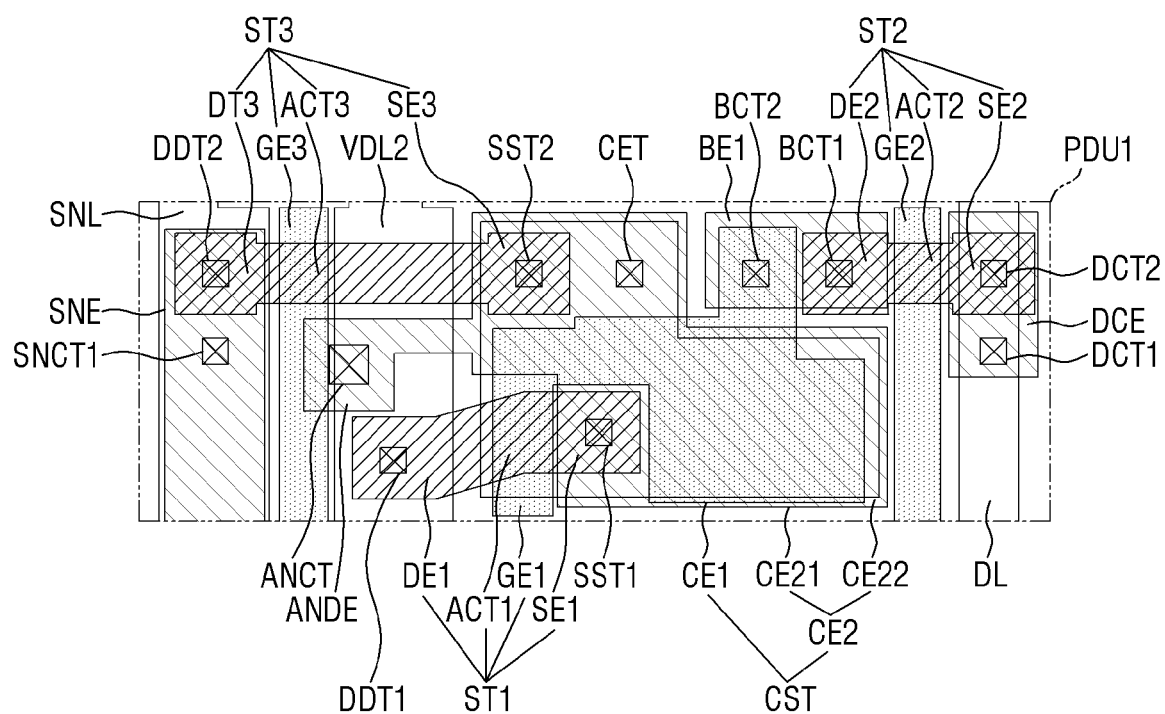
FIG. 7 is a detailed layout view of the first pixel driving unit of FIG. 6.
Figure 8:
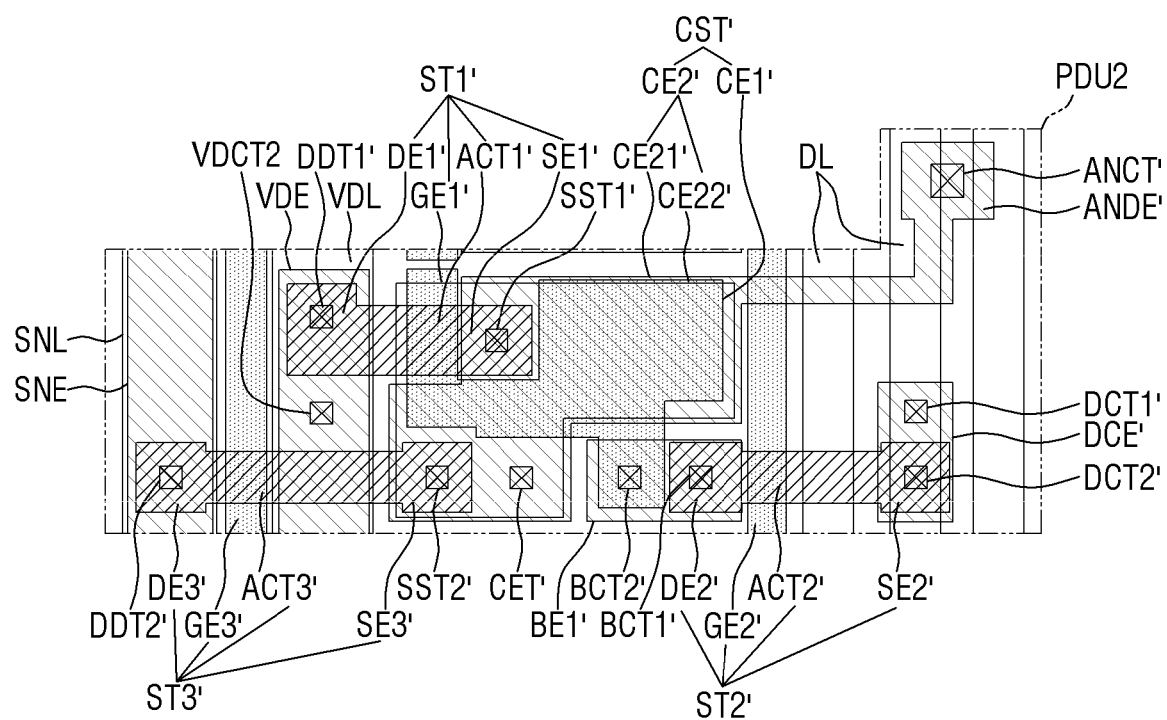
FIG. 8 is a detailed layout view of the second pixel driving unit of FIG. 6.
Figure 9:
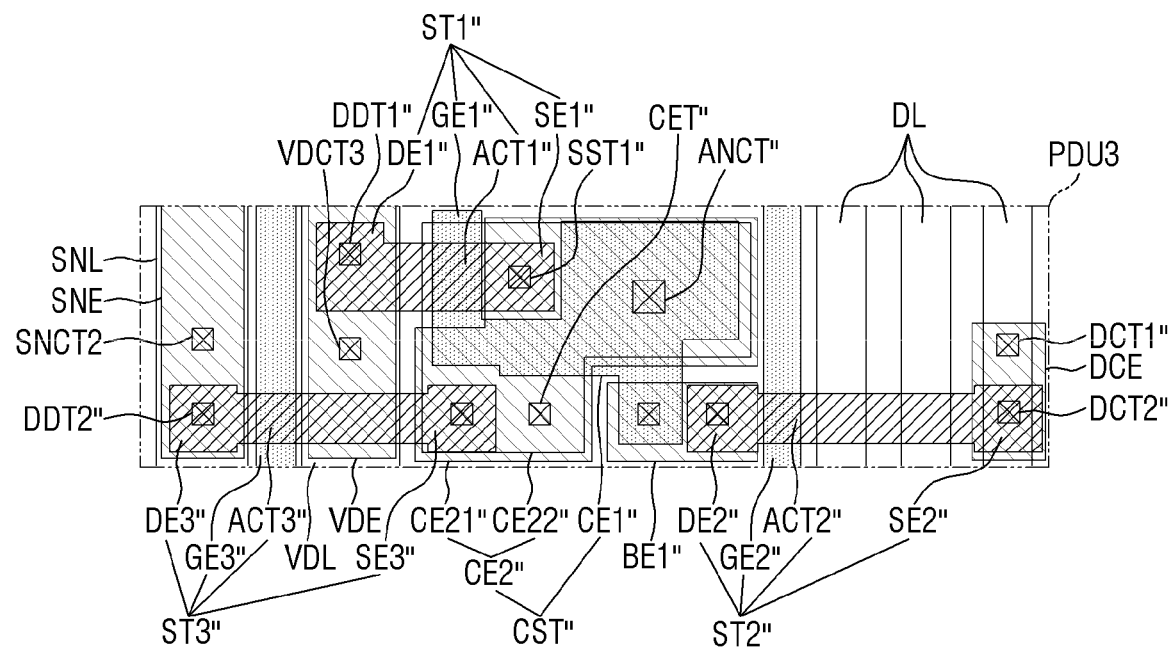
FIG. 9 is a detailed layout view of the third pixel driving unit of FIG. 6.

FIG. 6 is a layout view illustrating an example of a first pixel driving unit PDU1, a second pixel driving unit PDU2, a third pixel driving unit PDU3, a first power connection hole PCH1, and a first power pad hole PPH1 of FIG. 4. FIG. 7 is a detailed layout view of the first pixel driving unit PDU1 of FIG. 6. FIG. 8 is a detailed layout view of the second pixel driving unit PDU2 of FIG. 6. FIG. 9 is a detailed layout view of the third pixel driving unit PDU3 of FIG. 6.

Referring to FIGS. 6-9, a scan line SL, a first horizontal power line HVSL, and a second horizontal power line HVDL may extend in the first direction (e.g., the X-axis direction). The scan line SL, the first horizontal power line HVSL, and the second horizontal power line HVDL may be disposed parallel to each other. The scan line SL, the first horizontal power line HVSL, and the second horizontal power line HVDL may be spaced from each other in the second direction (e.g., the Y-axis direction).

Data lines DL, a first power line VSL, a second power line VDL, a sensing line SNL, and a first power bottom line VSBL may extend in the second direction (e.g., the Y-axis direction). The data lines DL, the first power line VSL, the second power line VDL, the sensing line SNL, and the first power bottom line VSBL may be disposed parallel to each other. The data lines DL, the first power line VSL, the second power line VDL, the sensing line SNL, and the first power bottom line VSBL may be spaced from each other in the first direction (e.g., the X-axis direction).

The first power line VSL may be connected to the first horizontal power line HVSL through a first power contact hole VSCT1. Therefore, the first horizontal power line HVSL may have substantially the same electric potential as the first power line VSL. That is, the first horizontal power line HVSL may be supplied with the first power supply voltage.

The first power line VSL may be connected to a first power connection electrode VSE1 through at least one second power contact hole VSCT2. The first power line VSL may be connected to a second power connection electrode VSE2 through at least one third power contact hole VSCT3. The first power line VSL, the first power connection electrode VSE1, and the second power connection electrode VSE2 may overlap in the third direction (e.g., the Z-axis direction). Because the first power line VSL is connected to the first power connection electrode VSE1 and the second power connection electrode VSE2, the resistance of the first power line VSL may be lowered.

A first power connection unit PC1 may protrude from the first power line VSL. For example, the first power connection unit PC1 may extend or protrude in the first direction (e.g., the X-axis direction). The first power connection unit PC1 and the first power line VSL may be integrally formed. The first power connection unit PC1 may be connected to the first power bottom line VSBL through a first power connection hole PCH1.

The first power connection hole PCH1 may not overlap the pixel driving units PDU, the scan line SL, the data lines DL, the sensing line SNL, the first power line VSL, and the second power line VDL. Therefore, it is possible to prevent or substantially prevent the pixel driving units PDU, the scan line SL, the data lines DL, the sensing line SNL, the first power line VSL, and the second power line VDL from being stepped due to the first power connection hole PCH1. Accordingly, it is possible to prevent or substantially prevent cracks from being generated in switching elements of the pixel driving units PDU, the scan line SL, the first power line VSL, the data lines DL, the sensing line SNL, and the second power line VDL by the pressure applied when the circuit boards are attached.

The first power bottom line VSBL may be connected to a bump of any one of the first source circuit board DCB1 (e.g., see FIG. 3A), the second source circuit board DCB2 (e.g., see FIG. 3A), and the third source circuit board DCB3 through a first power pad hole PPH1.

The second power line VDL may be connected to the second horizontal power line HVDL through at least one fourth power contact hole VDCT1. Therefore, the second horizontal power line HVDL may have substantially the same electric potential as the second power line VDL. That is, the second horizontal power line HVDL may be supplied with the second power supply voltage.

The second power line VDL may be connected to a third power connection electrode VDE through at least one fifth power contact hole VDCT2. The second power line VDL and the third power connection electrode VDE may overlap in the third direction (e.g., the Z-axis direction). Because the second power line VDL is connected to the third power connection electrode VDE, the resistance of the second power line VDL may be lowered.

The scan line SL may be connected to a second gate electrode GE2 through a first scan contact hole SCT1 and a second scan contact hole SCT2. The first scan contact hole SCT1 and the second scan contact hole SCT2 may be spaced from each other. In one or more embodiments, any one of the first scan contact hole SCT1 and the second scan contact hole SCT2 may be omitted. The second gate electrode GE2 may include a first extending part extending in the first direction (e.g., the X-axis direction) and a second extending part extending in the second direction (e.g., the Y-axis direction). The first extending part of the second gate electrode GE2 may overlap the scan line SL in the third direction (e.g., the Z-axis direction). The second extending part of the second gate electrode GE2 may be disposed adjacent to a leftmost data line from among the data lines DL. For example, the second extending part of the second gate electrode GE2 may be on the left of the leftmost data line from among the data lines DL.

The scan line SL may be connected to a third gate electrode GE3 through a third scan contact hole SCT3. The third gate electrode GE3 may extend in the second direction (e.g., the Y-axis direction).

The sensing line SNL may be connected to a sensing connection electrode SNE through at least one sensing contact hole SNCT1. The sensing line SNL and the sensing connection electrode SNE may overlap in the third direction (e.g., the Z-axis direction). Because the sensing line SNL is connected to the sensing connection electrode SNE, the resistance of the sensing line SNL may be lowered.

The first pixel driving unit PDU1, the second pixel driving unit PDU2, and the third pixel driving unit PDU3 may be disposed in the second direction (e.g., the Y-axis direction). The first pixel driving unit PDU1, the second pixel driving unit PDU2, and the third pixel driving unit PDU3 may overlap at least one of the data lines DL, the second power line VDL, and the sensing line SNL in the third direction (e.g., the Z-axis direction).

The first pixel driving unit PDU1, the second pixel driving unit PDU2, and the third pixel driving unit PDU3 may not overlap the first power line VSL and the first power bottom line VSBL in the third direction (e.g., the Z-axis direction). In addition, the first pixel driving unit PDU1, the second pixel driving unit PDU2, and the third pixel driving unit PDU3 may not overlap the scan line SL, the first horizontal power line HVSL, and the second horizontal power line HVDL in the third direction (e.g., the Z-axis direction). The first pixel driving unit PDU1, the second pixel driving unit PDU2, and the third pixel driving unit PDU3 may be disposed between the scan line SL and the second horizontal power line HVDL2.

The first pixel driving unit PDU1 may include a first switching element ST1, a second switching element ST2, a third switching element ST3, and a capacitor CST. The first switching element ST1 may be referred to as a first transistor, the second switching element ST2 as a second transistor, and the third switching element ST3 as a third transistor. The first pixel driving unit PDU1 will now be described with reference to FIG. 7.

The first switching element ST1 may include a first gate electrode GE1, a first active layer ACT1, a first source electrode SE1, and a first drain electrode DE1. The first gate electrode GE1 may be integrally formed with a first electrode CE1 of the capacitor CST. The first active layer ACT1 may overlap the first gate electrode GE1 in the third direction (e.g., the Z-axis direction). The first source electrode SE1 may be disposed on a side (e.g., a right side of the first active layer ACT1). The first source electrode SE1 may be connected to a first anode connection electrode ANDE and a first sub electrode CE21 of a second electrode CE2 of the capacitor CST through a first source contact hole SST1. The first drain electrode DE1 may be disposed on the other side (e.g., a left side of the first active layer ACT1). For example, the first source electrode SE1 and the first drain electrode DE1 may be at opposite sides of the first active layer ACT1. The first drain electrode DE1 may be connected to the second power line VDL through a first drain contact hole DDT1. The anode connection electrode ANDE may be connected to first electrodes of light emitting elements LE (e.g., see FIG. 5) through an anode contact hole ANCT.

The second switching element ST2 may include a second gate electrode GE2, a second active layer ACT2, a second source electrode SE2, and a second drain electrode DE2. The second active layer ACT2 may overlap the second gate electrode GE2 in the third direction (e.g., the Z-axis direction). The second source electrode SE2 may be disposed on a side (e.g., a right side of the second active layer ACT2). The second source electrode SE2 may be connected to a data connection electrode DCE through a second data contact hole DCT2. The data connection electrode DCE may be connected to any one of the data lines DL through a first data contact hole DCT1. The second drain electrode DE2 may be disposed on the other side (e.g., a left side of the second active layer ACT2). For example, the second source electrode SE2 and the second drain electrode DE2 may be at opposite sides of the second active layer ACT2. The second drain electrode DE2 may connect a first power connection hole BCT1 to a connection electrode BD. The connection electrode BE1 may be connected to the first gate electrode GE1 and the first electrode CE1 of the capacitor CST through a second power connection hole BCT2.

The third switching element ST3 may include a third gate electrode GE3, a third active layer ACT3, a third source electrode SE3, and a third drain electrode DE3. The third active layer ACT3 may overlap the third gate electrode GE3 in the third direction (e.g., the Z-axis direction). The third source electrode SE3 may be disposed on a side (e.g., a right side of the third active layer ACT3). The third source electrode SE3 may be connected to the first anode connection electrode ANDE and the first sub electrode CE21 of the second electrode CE2 of the capacitor CST through a second source contact hole SST2. The third drain electrode DE3 may be disposed on the other side (e.g., a left side of the third active layer ACT3). For example, the third source electrode SE3 and the third drain electrode DE3 may be at opposite sides of the third active layer ACT3. The third drain electrode DE3 may be connected to the sensing connection electrode SNE through a second drain contact hole DDT2.

The capacitor CST may include the first electrode CE1 and the second electrode CE2. The first electrode CE1 may be integrally formed with the first gate electrode GE1. The second electrode CE2 may include the first sub electrode CE21 and a second sub electrode CE22. The first sub electrode CE21 may be integrally formed with the anode connection electrode ANDE. The second sub electrode CE22 may be connected to the first sub electrode CE21 through a capacitor contact hole CET. The first electrode CE1, the first sub electrode CE21, and the second sub electrode CE22 of the capacitor CST may overlap in the third direction (e.g., the Z-axis direction). The first electrode CE1 of the capacitor CST may be disposed between the first sub electrode CE21 and the second sub electrode CE22 in the third direction (e.g., the Z-axis direction). The capacitor CST may be formed by the overlap of the first electrode CE1 and the first sub electrode CE21 and the overlap of the first electrode CE1 and the second sub electrode CE22.

The second pixel driving unit PDU2 may include a first switching element ST1', a second switching element ST2', a third switching element ST3', and a capacitor CST'. The first switching element ST1' may be referred to as a first transistor, the second switching element ST2' as a second transistor, and the third switching element ST3' as a third transistor. The second pixel driving unit PDU2 will now be described with reference to FIG. 8.

The first switching element ST1' may include a first gate electrode GE1', a first active layer ACT1', a first source electrode SE1', and a first drain electrode DE1'. The first gate electrode GE1', the first active layer ACT1', the first source electrode SE1', and the first drain electrode DE1' of the first switching element ST1' are substantially the same as the first gate electrode GE1, the first active layer ACT1, the first source electrode SE1, and the first drain electrode DE1 of the first switching element ST1 described with reference to FIG. 7, and thus a redundant description thereof may not be repeated.

The second switching element ST2' may include a second gate electrode GE2', a second active layer ACT2', a second source electrode SE2', and a second drain electrode DE2'. The second gate electrode GE2', the second active layer ACT2', the second source electrode SE2', and the second drain electrode DE2' of the second switching element ST2' are substantially the same as the second gate electrode GE2, the second active layer ACT2, the second source electrode SE2, and the second drain electrode DE2 of the second switching element ST2 described with reference to FIG. 7, and thus a redundant description thereof may not be repeated.

The third switching element ST3' may include a third gate electrode GE3', a third active layer ACT3', a third source electrode SE3', and a third drain electrode DE3'. The third gate electrode GE3', the third active layer ACT3', the third source electrode SE3', and the third drain electrode DE3' of the third switching element ST3' are substantially the same as the third gate electrode GE3, the third active layer ACT3, the third source electrode SE3, and the third drain electrode DE3 of the third switching element ST3 described with reference to FIG. 7, and thus a redundant description thereof may not be repeated.

The capacitor CST' may include a first electrode CE1' and a second electrode CE2'. The second electrode CE2' may include a first sub electrode CE21' and a second sub electrode CE22'. The first electrode CE1' of the capacitor CST' and the first sub electrode CE21' and the second sub electrode CE22' of the second electrode CE2' of the capacitor CST' are substantially the same as the first electrode CE1 of the capacitor CST and the first sub electrode CE21 and the second sub electrode CE22 of the second electrode CE2 of the capacitor CST described with reference to FIG. 7, and thus a redundant description thereof may not be repeated.

In addition, a connection electrode BE1', a data connection electrode DCE', an anode connection electrode ANDE' and contact holes DCT1', DCT2', BCT1', BCT2', SST1', SST2', DDT1', DDT2', ANCT' and CET' of the second pixel driving unit PDU2 are substantially the same as the connection electrode BE1, the data connection electrode DCE, the anode connection electrode ANDE and the contact holes DCT1, DCT2, BCT1, BCT2, SST1, SST2, DDT1, DDT2, ANCT and CET of the first pixel driving unit PDU1 described with reference to FIG. 7, and thus a redundant description thereof may not be repeated.

The third pixel driving unit PDU3 may include a first switching element ST1", a second switching element ST2", a third switching element ST3", and a capacitor CST". The first switching element ST1" may be referred to as a first transistor, the second switching element ST2" as a second transistor, and the third switching element ST3" as a third transistor. The third pixel driving unit PDU3 will now be described with reference to FIG. 9.

The first switching element ST1" may include a first gate electrode GE1", a first active layer ACT1", a first source electrode SE1", and a first drain electrode DE1". The first gate electrode GE1", the first active layer ACT1", the first source electrode SE1", and the first drain electrode DE1" of the first switching element ST1" are substantially the same as the first gate electrode GE1, the first active layer ACT1, the first source electrode SE1, and the first drain electrode DE1 of the first switching element ST1 described with reference to FIG. 7, and thus a redundant description thereof may not be repeated.

The second switching element ST2" may include a second gate electrode GE2", a second active layer ACT2", a second source electrode 5E2", and a second drain electrode DE2". The second gate electrode GE2", the second active layer ACT2", the second source electrode 5E2", and the second drain electrode DE2" of the second switching element ST2" are substantially the same as the second gate electrode GE2, the second active layer ACT2, the second source electrode SE2, and the second drain electrode DE2 of the second switching element ST2 described with reference to FIG. 7, and thus a redundant description thereof may not be repeated.

The third switching element ST3" may include a third gate electrode GE3", a third active layer ACT3", a third source electrode 5E3", and a third drain electrode DE3". The third gate electrode GE3", the third active layer ACT3", the third source electrode 5E3", and the third drain electrode DE3" of the third switching element ST3" are substantially the same as the third gate electrode GE3, the third active layer ACT3, the third source electrode SE3, and the third drain electrode DE3 of the third switching element ST3 described with reference to FIG. 7, and thus a redundant description thereof may not be repeated.

The capacitor CST" may include a first electrode CE1" and a second electrode CE2". The second electrode CE2" may include a first sub electrode CE21" and a second sub electrode CE22". The first electrode CE1" of the capacitor CST" and the first sub electrode CE21" and the second sub electrode CE22" of the second electrode CE2" of the capacitor CST" are substantially the same as the first electrode CE1 of the capacitor CST and the first sub electrode CE21 and the second sub electrode CE22 of the second electrode CE2 of the capacitor CST described with reference to FIG. 7, and thus a redundant description thereof may not be repeated.

In addition, a connection electrode BE1", a data connection electrode DCE", an anode connection electrode ANDE" and contact holes DCT1", DCT2", BCT1", BCT2", SST1", SST2", DDT1", DDT2", ANCT" and CET" of the third pixel driving unit PDU3 are substantially the same as the connection electrode BE1, the data connection electrode DCE, the anode connection electrode ANDE and the contact holes DCT1, DCT2, BCT1, BCT2, SST1, SST2, DDT1, DDT2, ANCT and CET of the first pixel driving unit PDU1 described with reference to FIG. 7, and thus a redundant description thereof may not be repeated.

Figure 10:
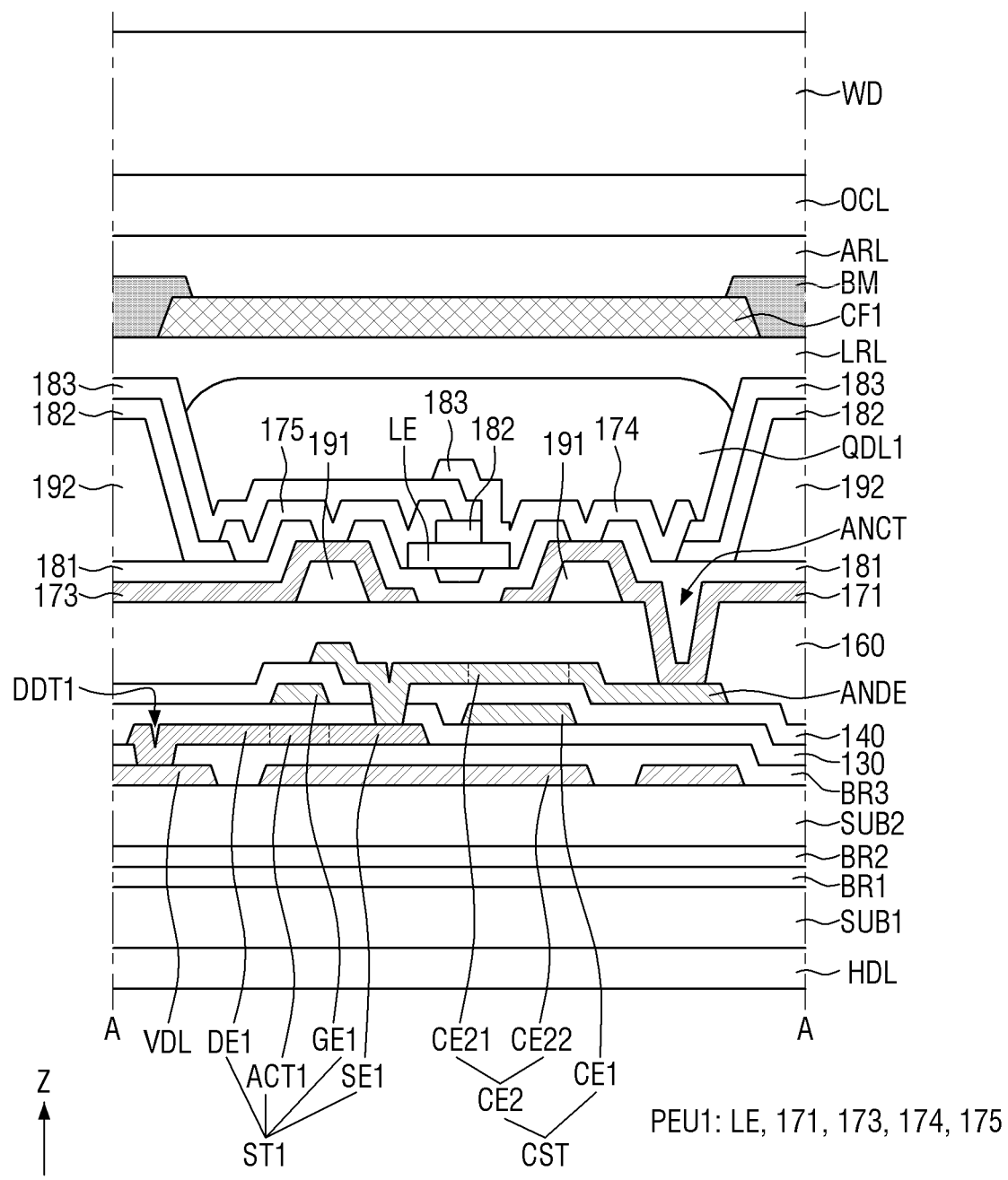
FIG. 10 is a cross-sectional view of an example of the first display device taken along the line A-A' of FIGS. 6 and 7.
Figure 11:
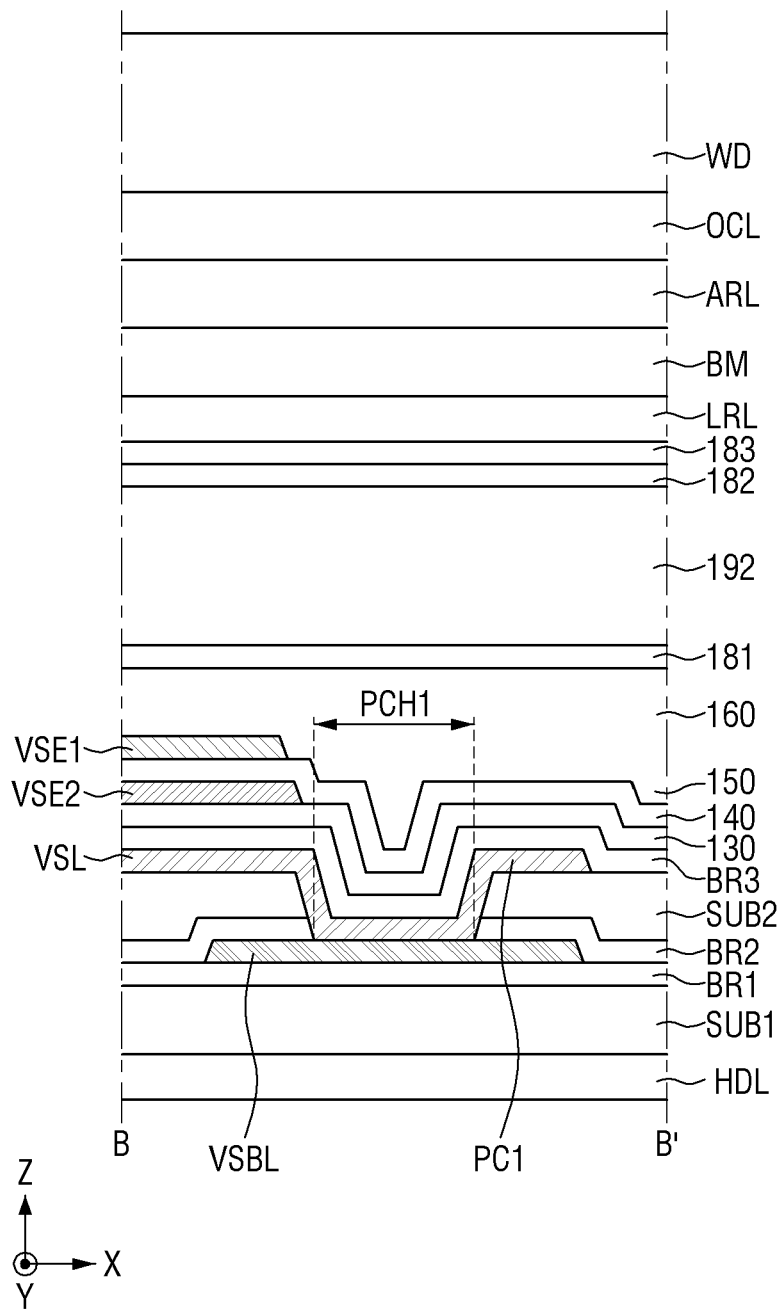
FIG. 11 is a cross-sectional view of an example of the first display device taken along the line B-B' of FIG. 6.
Figure 12:
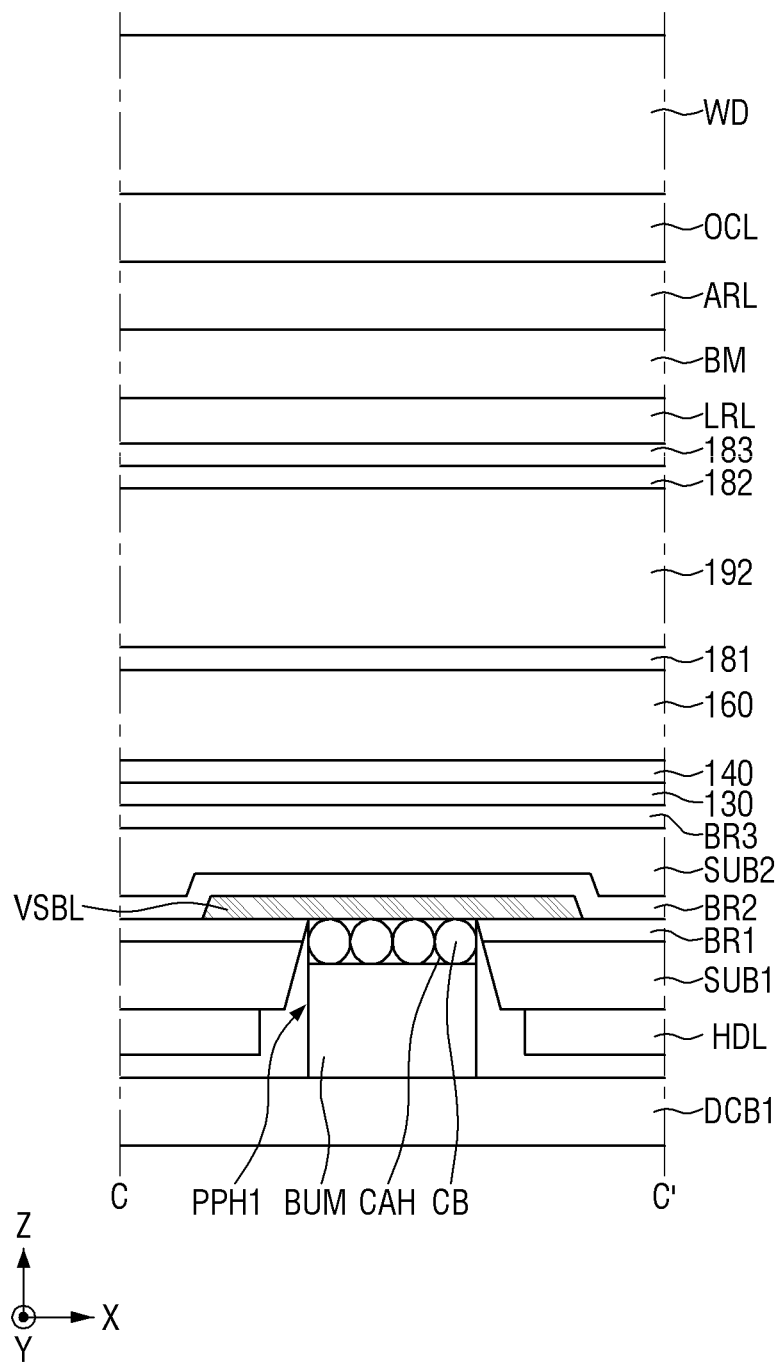
FIG. 12 is a cross-sectional view of an example of the first display device taken along the line C-C' of FIG. 6.

FIG. 10 is a cross-sectional view of an example of the first display device 11 taken along the line A-A' of FIGS. 6 and 7. FIG. 11 is a cross-sectional view of an example of the first display device 11 taken along the line B-B' of FIG. 6. FIG. 12 is a cross-sectional view of an example of the first display device 11 taken along the line C-C' of FIG. 6.

Referring to FIGS. 10-12, a first substrate SUB1 may be made of an insulating material. For example, the first substrate SUB1 may include an organic material such as polyimide.

A first barrier layer BR1 may be disposed on the first substrate SUB1. The first barrier layer BR1 is a layer for protecting switching elements ST1 and light emitting elements LE from moisture that may be introduced through the first substrate SUB1 which is vulnerable to moisture permeation. The first barrier layer BR1 may include at least one inorganic layer. For example, the first barrier layer BR1 may be a multilayer in which inorganic layers including at least one of silicon oxide ($SiO_x$), silicon nitride ($SiN_x$), and silicon oxynitride (SiON) are alternately stacked.

A rear conductive layer including a first power bottom line VSBL may be disposed on the first barrier layer BR1. The rear conductive layer may be a single layer or a multilayer made of one or more of molybdenum (Mo), aluminum (Al), chromium (Cr), gold (Au), titanium (Ti), nickel (Ni), neodymium (Nd), copper (Cu), and/or alloys of the same.

A second barrier layer BR2 may be disposed on the first power bottom line VSBL. The second barrier layer BR2 is a layer for protecting the switching elements ST1 and the light emitting elements LE from moisture that may be introduced through the first substrate SUB1 which is vulnerable to moisture permeation. The second barrier layer BR2 may include at least one inorganic layer. For example, the second barrier layer BR2 may be a multilayer in which inorganic layers including at least one of silicon oxide ($SiO_x$), silicon nitride ($SiN_x$), and silicon oxynitride (SiON) are alternately stacked.

A second substrate SUB2 may be disposed on the second barrier layer BR2. The second substrate SUB2 may be made of an insulating material. For example, the second substrate SUB2 may include an organic material such as polyimide.

A first metal layer including a first power line VSL, a first power connection unit PC1, a second power line VDL, and a second sub electrode CE22 of a second electrode CE2 of a capacitor CST may be disposed on the second substrate SUB2. The first power connection unit PC1 may extend from the first power line VSL. The first power connection unit PC1 and the first power line VSL may be integrally formed. The first power connection unit PC1 may be connected to the first power bottom line VSBL through a first power connection hole PCH1 penetrating the second barrier layer BR2 and the second substrate SUB2. The first metal layer may further include data lines DL and sensing lines SNL. The first metal layer may be a single layer or a multilayer made of one or more of molybdenum (Mo), aluminum (Al), chromium (Cr), gold (Au), titanium (Ti), nickel (Ni), neodymium (Nd), copper (Cu), and/or alloys of the same.

A third barrier layer BR3 may be disposed on the first metal layer. The third barrier layer BR3 is a layer for protecting the switching elements ST1 and the light emitting elements LE from moisture that may be introduced through the second substrate SUB2 which is vulnerable to moisture permeation. The third barrier layer BR3 may include at least one inorganic layer. For example, the third barrier layer BR3 may be a multilayer in which inorganic layers including at least one of silicon oxide ($SiO_x$), silicon nitride ($SiN_x$), and silicon oxynitride (SiON) are alternately stacked.

A semiconductor layer including a first active layer ACT1, a first source electrode SE1 and a first drain electrode DE1 of a first switching element ST1 may be disposed on the third barrier layer BR3. The semiconductor layer may further include a second active layer ACT2, a second source electrode SE2, and a second drain electrode DE2 of a second switching element ST2. In addition, the semiconductor layer may further include a third active layer ACT3, a third source electrode SE3, and a third drain electrode DE3 of a third switching element ST3. The first drain electrode DE1 may be connected to the second power line VDL through a first drain contact hole DDT1 penetrating the third barrier layer BR3.

The semiconductor layer includes polycrystalline silicon, monocrystalline silicon, low-temperature polycrystalline silicon, amorphous silicon, and/or an oxide semiconductor. The first source electrode SE1 and the first drain electrode DE1 may be formed to have conductivity by doping a silicon semiconductor or an oxide semiconductor with ions or impurities. The first active layer ACT1 may be overlapped by a first gate electrode GE1 in the third direction (e.g., the Z-axis direction) which is a thickness direction of the first substrate SUB1 or a thickness direction of the second substrate SUB2, and the first source electrode SE1 and the first drain electrode DE1 may not be overlapped by the first gate electrode GE1 in the third direction (e.g., the Z-axis direction).

A gate insulating layer 130 may be disposed on the semiconductor layer. The gate insulating layer 130 may include an inorganic layer, for example, silicon oxide ($SiO_x$), silicon nitride ($SiN_x$), and/or silicon oxynitride (SiON).

A second metal layer including the first gate electrode GE1 of the first switching element ST1 and a first electrode CE1 of the capacitor CST may be disposed on the gate insulating layer 130. The second metal layer may further include a second gate electrode GE2 of the second switching element ST2, a third gate electrode GE3 of the third switching element ST3, and a second power connection electrode VSE2. The second metal layer may be a single layer or a multilayer made of one or more of molybdenum (Mo), aluminum (Al), chromium (Cr), gold (Au), titanium (Ti), nickel (Ni), neodymium (Nd), copper (Cu), and/or alloys of the same.

An interlayer insulating film 140 may be disposed on the second metal layer. The interlayer insulating film 140 may include an inorganic layer, for example, silicon oxide ($SiO_x$), silicon nitride ($SiN_x$), and/or silicon oxynitride (SiON).

A third metal layer including an anode connection electrode ANDE and a first sub electrode CE21 of the second electrode CE2 of the capacitor CST may be disposed on the interlayer insulating film 140. The third metal layer may further include a first horizontal power line HVSL, a second horizontal power line HVDL, a scan line SL, a data connection electrode DCE, a connection electrode BE1, a first power connection electrode VSE1, a third power connection electrode VDE, and a sensing connection electrode SNE. The anode connection electrode ANDE may be connected to the first source electrode SE1 through a first source contact hole SST1 penetrating the gate insulating layer 130 and the interlayer insulating film 140. The third metal layer may be a single layer or a multilayer made of one or more of molybdenum (Mo), aluminum (Al), chromium (Cr), gold (Au), titanium (Ti), nickel (Ni), neodymium (Nd), copper (Cu), and/or alloys of the same.

A planarization layer 160 may be disposed on the third metal layer to planarize steps formed by the switching elements ST1. The planarization layer 160 may be made of an organic layer such as acryl resin, epoxy resin, phenolic resin, polyamide resin, and/or polyimide resin.

A first light emitting unit PEU1 may be disposed on the planarization layer 160. The first light emitting unit PEU1 may include a pixel electrode 171, a common electrode 173, a first contact electrode 174, a second contact electrode 175, and the light emitting elements LE.

The pixel electrode 171, the common electrode 173, and inner banks 191 may be disposed on the planarization layer 160.

The inner banks 191 may be disposed in an opening OA defined by an outer bank 192. The light emitting elements LE may be disposed between the inner banks 191 adjacent to each other. Each of the inner banks 191 may include a lower surface contacting the planarization layer 160, an upper surface opposite to (e.g., facing away from) the lower surface, and side surfaces between the upper surface and the lower surface. The inner banks 191 may have, but not be limited to, a trapezoidal cross-sectional shape.

The inner banks 191 may be made of an organic layer such as photosensitive resin, acryl resin, epoxy resin, phenolic resin, polyamide resin, and/or polyimide resin. For example, when the inner banks 191 are made of photosensitive resin, they may be positive photoresists or negative photoresists.

The pixel electrode 171 and the common electrode 173 may be disposed on the planarization layer 160 and the inner banks 191. The pixel electrode 171 and the common electrode 173 may be spaced from each other and may be electrically separated from each other.

The pixel electrode 171 may be disposed on at least one side surface and the upper surface of an inner bank 191. For example, the pixel electrode 171 may contact at least one side surface and the upper surface of an inner bank 191. The pixel electrode 171 may be connected to the anode connection electrode ANDE through an anode contact hole ANCT penetrating the planarization layer 160. The common electrode 173 may be disposed on at least one side surface and the upper surface of an inner bank 191. For example, the common electrode 173 may contact at least one side surface and the upper surface of an inner bank 191.

The pixel electrode 171 and the common electrode 173 may include a conductive material having high reflectivity. For example, the pixel electrode 171 and the common electrode 173 may include a metal such as silver (Ag), copper (Cu), or aluminum (Al). Therefore, of light emitted from the light emitting elements LE, light traveling to the pixel electrode 171 and the common electrode 173 may be reflected by the pixel electrode 171 and the common electrode 173 to above the light emitting elements LE.

A first insulating layer 181 may be disposed on the pixel electrode 171 and the common electrode 173. The first insulating layer 181 may be disposed on the planarization layer 160 exposed without being covered by the pixel electrode 171 and the common electrode 173. The first insulating layer 181 may include an inorganic layer, for example, silicon oxide (SiO$_x$), silicon nitride (SiN$_x$), and/or silicon oxynitride (SiON).

The outer bank 192 may be disposed on the first insulating layer 181. The outer bank 192 may define the opening OA. The outer bank 192 may not overlap the inner banks 191.

The outer bank 192 may include a lower surface contacting the first insulating layer 181, an upper surface opposite to (e.g., facing away from) the lower surface, and side surfaces between the upper surface and the lower surface. The outer bank 192 may have, but not be limited to, a trapezoidal cross-sectional shape.

The outer bank 192 may be made of an organic layer such as photosensitive resin, acryl resin, epoxy resin, phenolic resin, polyamide resin, and/or polyimide resin. For example, when the outer bank 192 is made of photosensitive resin, it may be a positive photoresist or a negative photoresist.

The light emitting elements LE may be disposed on the first insulating layer 181. Each of the light emitting elements LE may be an inorganic semiconductor element. Each of the light emitting elements LE may be shaped like a rod, a wire, a tube, or the like. For example, each of the light emitting elements LE may be shaped like a cylinder or a rod. Alternatively, each of the light emitting elements LE may be shaped like a polyhedron such as a cube or a rectangular parallelepiped or a polygonal prism such as a hexagonal prism. Alternatively, each of the light emitting elements LE may be shaped like a truncated cone extending in one direction and having a partially inclined outer surface. A length of each of the light emitting elements LE may be in a range of 1 μm to 10 μm or 2 μm to 6 μm, preferably, in the range of 3 μm to 5 μm. In addition, a diameter of each of the light emitting elements LE may be in a range of 300 nm to 700 nm, and an aspect ratio of each of the light emitting elements LE may be 1.2 to 100.

A second insulating layer 182 may be disposed on the light emitting elements LE. In addition, the second insulating layer 182 may be disposed on the outer bank 192. For example, the second insulating layer 182 may contact the outer bank 192. The second insulating layer 182 may include an inorganic layer, for example, silicon oxide (SiO$_x$), silicon nitride (SiN$_x$), and/or silicon oxynitride (SiON).

The first contact electrode 174 may be connected to the pixel electrode 171 through a first hole CCT1 penetrating the first insulating layer 181. The first hole CCT1 may overlap an inner bank 191 in the third direction (e.g., the Z-axis direction). The first contact electrode 174 may contact an end of each of the light emitting elements LE. Therefore, the end of each of the light emitting elements LE may be connected (e.g., electrically connected) to the pixel electrode 171 through the first contact electrode 174. The first contact electrode 174 may be disposed on the second insulating layer 182.

A third insulating layer 183 may be disposed on the first contact electrode 174. The third insulating layer 183 may cover the first contact electrode 174 to electrically separate the first contact electrode 174 and the second contact electrode 175. In addition, the third insulating layer 183 may cover the second insulating layer 182 disposed on the outer bank 192. The third insulating layer 183 may include an inorganic layer, for example, silicon oxide (SiO$_x$), silicon nitride (SiN$_x$), and/or silicon oxynitride (SiON).

The second contact electrode 175 may be connected to the common electrode 173 through a second hole CCT2 penetrating the first insulating layer 181. The second hole CCT2 may overlap an inner bank 191 in the third direction (e.g., the Z-axis direction). The second contact electrode 175 may contact an end of each of the light emitting elements LE. Therefore, the end of each of the light emitting elements LE may be connected (e.g., electrically connected) to the common electrode 173 through the second contact electrode 175. The second contact electrode 175 may be disposed on the third insulating layer 183.

The first contact electrode 174 and the second contact electrode 175 may be made of a transparent conductive oxide (TCO) capable of transmitting light, such as indium tin oxide (ITO) and/or indium zinc oxide (IZO). Therefore, it is possible to prevent or substantially prevent light emitted from the light emitting elements LE from being blocked by the first contact electrode 174 and the second contact electrode 175.

An end of each of the light emitting elements LE is connected (e.g., electrically connected) to the first drain electrode DE1 of the first switching element ST1 through the first contact electrode 174 and the pixel electrode 171, and the other end is connected to the first power line VSL through the second contact electrode 175 and the common electrode 173. Therefore, each of the light emitting elements LE may emit light according to a current flowing from an end to the other end.

A first wavelength conversion layer QDL1 may be disposed in a first subpixel PX1, a second wavelength conversion layer may be disposed in a second subpixel, and a transparent insulating layer may be disposed in a third subpixel. The light emitting elements LE of each of the first subpixel PX1, the second subpixel, and the third subpixel may emit third light. The third light may be short-wavelength light such as blue light or ultraviolet light having a central wavelength band of 370 nm to 490 nm.

The first wavelength conversion layer QDL1 may convert the third light emitted from the light emitting elements LE of the first subpixel PX1 into first light. The first light may be red light having a central wavelength band of 600 nm to 750 nm.

The second wavelength conversion layer may convert the third light emitted from the light emitting elements LE of the second subpixel into second light. The second light may be green light having a central wavelength band of 480 nm to 560 nm.

Each of the first wavelength conversion layer QDL1 and the second wavelength conversion layer may include a base resin, wavelength shifters, and/or scatterers.

The base resin may be a material having high light transmittance and superior dispersion properties for the wavelength shifters and the scatterers. For example, the base resin may include an organic material such as epoxy resin, acrylic resin, cardo resin, and/or imide resin.

The wavelength shifters may convert or shift the wavelength range of incident light. The wavelength shifters may be quantum dots, quantum rods, and/or phosphors. The quantum dot size of the first wavelength conversion layer QDL1 and the quantum dot size of the second wavelength conversion layer may be different from each other.

The scatterers may scatter incident light in random directions without substantially converting the wavelength of the light passing through the first wavelength conversion layer QDL1 or the second wavelength conversion layer. Accordingly, this may increase the length of the path of the light passing through the first wavelength conversion layer QDL1 or the second wavelength conversion layer, thereby increasing color conversion efficiency by the wavelength shifters. The scatterers may be light scattering particles. For example, the scatterers may be metal oxide particles such as titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), and/or tin oxide ($SnO_2$). Alternatively, the scatterers may be organic particles such as acrylic resin and/or urethane resin.

The transparent insulating layer may pass short-wavelength light such as blue light or ultraviolet light as is. The transparent insulating layer may be made of an organic layer having high transmittance. For example, the transparent insulating layer may be made of an organic layer such as photosensitive resin, acryl resin, epoxy resin, phenolic resin, polyamide resin, and/or polyimide resin.

The first wavelength conversion layer QDL1 may be disposed on the second contact electrode 175 and the third insulating layer 183 in the first subpixel PX1. The placement of the second wavelength conversion layer in the second subpixel is substantially the same as that of the first wavelength conversion layer QDL1, and thus a redundant description of the placement of the second wavelength conversion layer may not be repeated.

A low refractive index layer LRL may be disposed on the first wavelength conversion layer QDL1, the second wavelength conversion layer, and the transparent insulating layer. A refractive index of the low refractive index layer LRL may be lower than a refractive index of the base resin of the first wavelength conversion layer QDL1, a refractive index of the base resin of the second wavelength conversion layer, and a refractive index of the transparent insulating layer. The low refractive index layer LRL may be made of an organic layer such as photosensitive resin, acryl resin, epoxy resin, phenolic resin, polyamide resin, and/or polyimide resin.

A first color filter CF1, a second color filter, a third color filter, and a black matrix BM may be disposed on the low refractive index layer LRL.

The first color filter CF1 may overlap the first wavelength conversion layer QDL1 in the third direction (e.g., the Z-axis direction). The first color filter CF1 may transmit the first light, for example, light in a red wavelength band and may not transmit light other than the first light. Therefore, of short-wavelength light emitted from the light emitting elements LE of the first subpixel PX1, light not converted into the first light may be unable to pass through the first color filter CF1. In contrast, light converted into the first light by the first wavelength conversion layer QDL1 may pass through the first color filter CF1.

The second color filter may overlap the second wavelength conversion layer in the third direction (e.g., the Z-axis direction). The second color filter may transmit the second light, for example, light in a green wavelength band and may not transmit light other than the second light. Therefore, of short-wavelength light emitted from the light emitting elements LE of the second subpixel, light not converted into the second light may be unable to pass through the second color filter. In contrast, light converted into the second light by the second wavelength conversion layer may pass through the second color filter.

The third color filter may overlap the transparent insulating layer in the third direction (e.g., the Z-axis direction). The third color filter may transmit the third light, for example, light in a blue wavelength band and may not transmit light other than the third light. Therefore, short-wavelength light emitted from the light emitting elements LE of the third subpixel may pass through the third color filter.

The black matrix BM may be disposed between the first color filter CF1 and the second color filter, between the first color filter CF1 and the third color filter, and between the second color filter and the third color filter. The black matrix BM may cover edges of the first color filter CF1, edges of the second color filter, and edges of the third color filter. The black matrix BM may include a light-blocking material capable of blocking light. In this case, the black matrix BM may include an inorganic black pigment such as carbon black or an organic black pigment.

An antireflection layer ARL may be disposed on the first color filter, the second color filter, the third color filter, and the black matrix BM. The antireflection layer ARL may include a first inorganic layer, a second inorganic layer, and an organic layer. Here, the second inorganic layer may be disposed on the first inorganic layer, and the first inorganic layer and the second inorganic layer may include different materials from each other. For example, the first inorganic layer may include SiON, and the second inorganic layer may include $SiO_x$. In this case, light refracted at an interface between the first inorganic layer and the organic layer and light reflected at an interface between the organic layer and the second inorganic layer may be canceled by destructive interference. Therefore, the antireflection layer ARL can reduce a decrease in visibility of an image due to reflection of external light. In one or more embodiments, the antireflection layer ARL may be omitted. Alternatively, the antireflection layer ARL may be replaced with a polarizing film. In this case, the polarizing film may be disposed on an overcoat layer OCL.

The overcoat layer OCL may be disposed on the antireflection layer ARL and may be a planarization layer for planarization. The overcoat layer OCL may be made of an organic layer such as acryl resin, epoxy resin, phenolic resin, polyamide resin, and/or polyimide resin.

A window WD may be disposed on the overcoat layer OCL. The window WD may be an inorganic material such as glass and/or an organic material such as plastic and/or a polymer material. The window WD may be designed to protect the front surface of the first display device 11. In one or more embodiments, the window WD may be omitted.

A heat dissipation layer HDL may be disposed under the first substrate SUB1. The heat dissipation layer HDL may include a metal material such as copper foil or copper to easily dissipate heat transferred to the first substrate SUB1 in the first display device 11.

A first power pad hole PPH1 may be a hole that penetrates the first barrier layer BR1 and the first substrate SUB1 to expose the first power bottom line VSBL. The first power pad hole PPH1 does not overlap the heat dissipation layer HDL in the third direction (e.g., the Z-axis direction).

A bump BUM of a first source circuit board DCB1, a second source circuit board DCB2, or a third source circuit board DCB3 may be disposed in the first power pad hole PPH1. The bump BUM of the first source circuit board DCB1, the second source circuit board DCB2, or the third source circuit board DCB3 may be connected to the first power bottom line VSBL through a conductive adhesive CAH such as an anisotropic conductive film including a plurality of conductive balls CB.

As illustrated in FIGS. 10-12, the first power connection hole PCH1 may not overlap the switching elements of pixel driving units PDU, the scan line SL, the data lines DL, the first power line VSL, and the second power line VDL. Therefore, it is possible to prevent or substantially prevent the switching elements of the pixel driving units PDU, the scan line SL, the data lines DL, the first power line VSL, and the second power line VDL from being stepped due to the first power connection hole PCH1. Accordingly, it is possible to prevent or substantially prevent cracks from being generated in the switching elements of the pixel driving units PDU, the scan line SL, the first power line VSL, the data lines DL, and the second power line VDL by the pressure applied when the circuit boards are attached.

Figure 13:
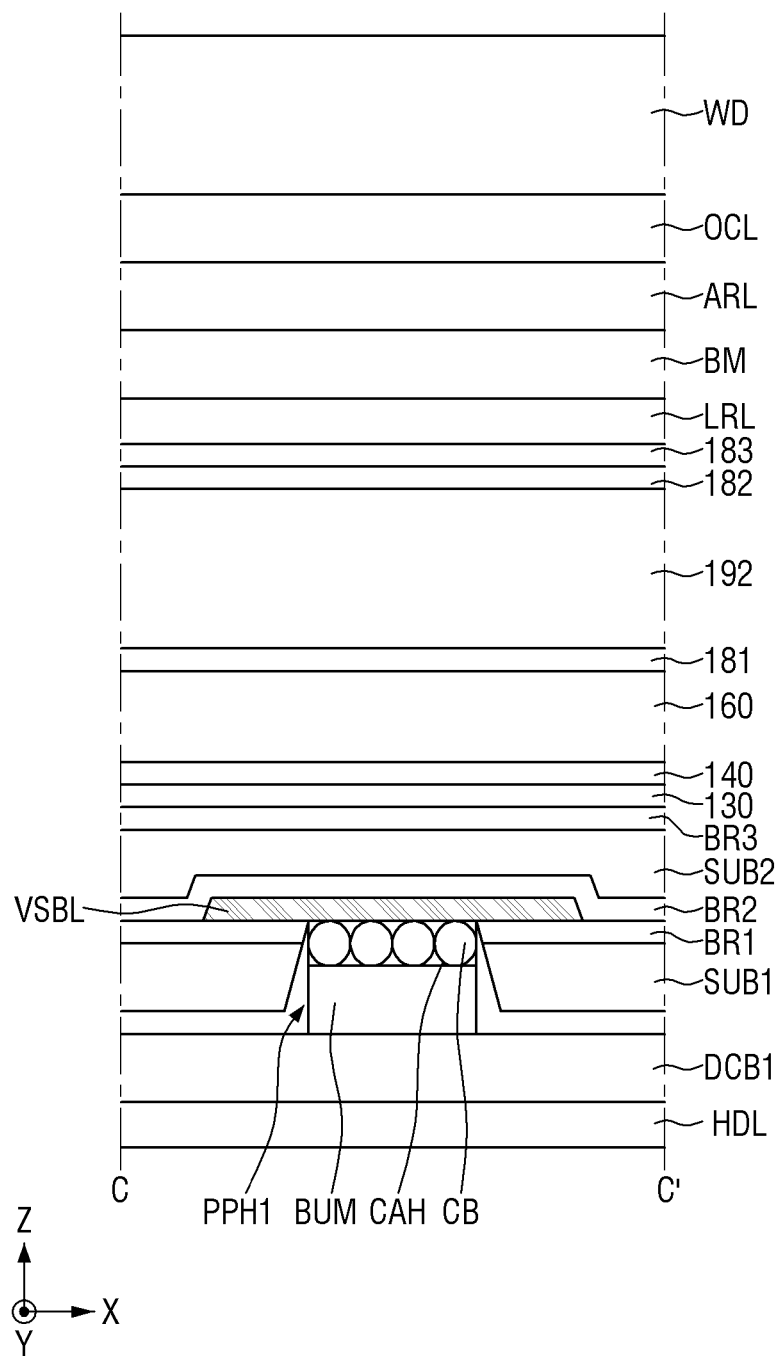
FIG. 13 is a cross-sectional view of an example of the first display device taken along the line C-C' of FIG. 6.

FIG. 13 is a cross-sectional view of an example of the first display device 11 taken along the line C-C' of FIG. 6.

The embodiment of FIG. 13 is different from the embodiment of FIG. 12 in that a heat dissipation layer HDL is disposed not under a first substrate SUB1 but under a first source circuit board DCB1 in an area in which the first source circuit board DCB1 is disposed. Therefore, in the embodiment of FIG. 13, not only the heat transferred to the first substrate SUB1 but also the heat of the first source circuit board DCB1 may be easily dissipated.

Figure 14:
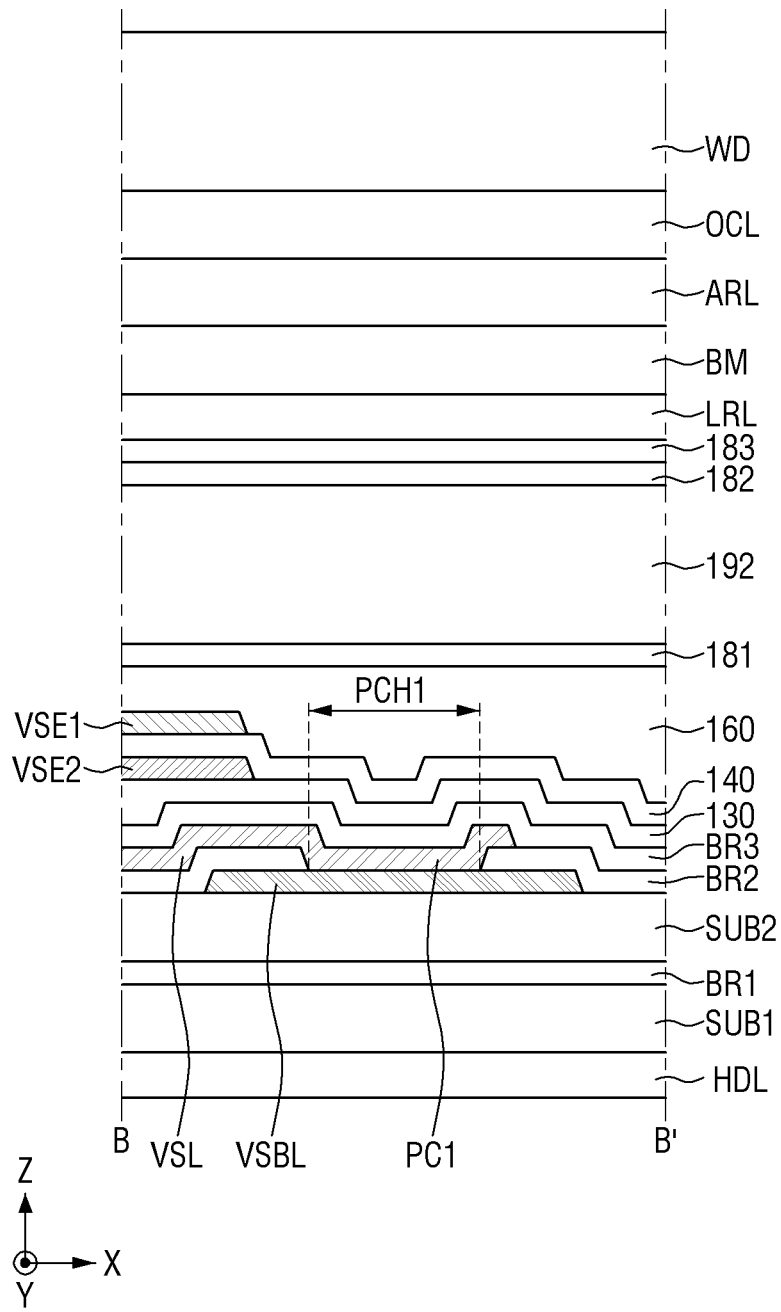
FIG. 14 is a cross-sectional view of an example of the first display device taken along the line B-B' of FIG. 6.
Figure 15:
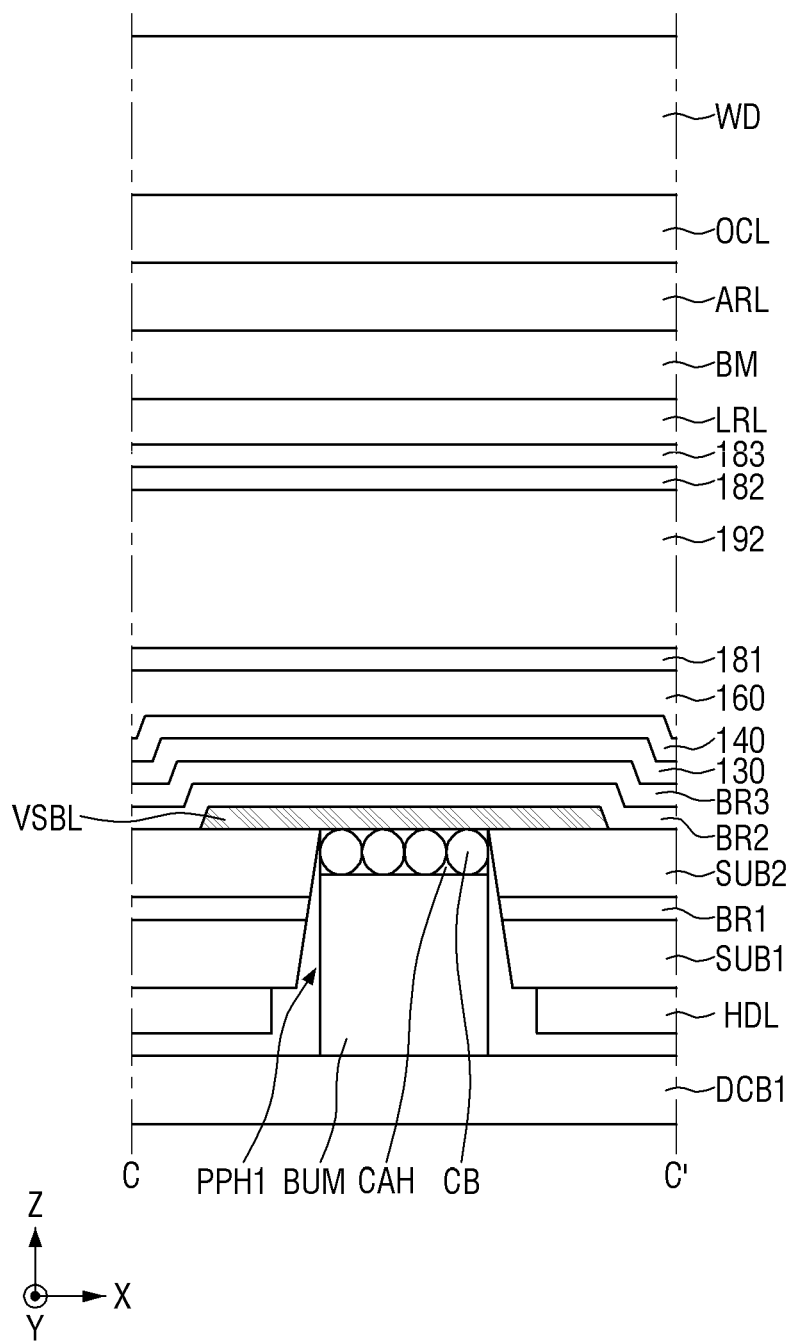
FIG. 15 is a cross-sectional view of an example of the first display device taken along the line C-C' of FIG. 6.

FIG. 14 is a cross-sectional view of an example of the first display device 11 taken along the line B-B' of FIG. 6. FIG. 15 is a cross-sectional view of an example of the first display device 11 taken along the line C-C' of FIG. 6.

The embodiment of FIGS. 14 and 15 is different from the embodiment of FIGS. 11 and 12 in that a first power bottom line VSBL is disposed on a second substrate SUB2. With reference to FIGS. 14 and 15, differences from the embodiment of FIGS. 11 and 12 will be primarily described.

Referring to FIGS. 14 and 15, the first power bottom line VSBL is not disposed between a first substrate SUB1 and the second substrate SUB2. The first power bottom line VSBL may be disposed on the second substrate SUB2, and a second barrier layer BR2 may be disposed on the first power bottom line VSBL.

A first metal layer including a first power line VSL, a first power connection unit PC1, a second power line VDL, and a second sub electrode CE22 of a second electrode CE2 of a capacitor CST may be disposed on the second barrier layer BR2. The first power line VSL may be connected to the first power bottom line VSBL through a first power connection hole PCH1 penetrating the second barrier layer BR2.

The first power bottom line VSBL may be connected to a bump BUM of a first source circuit board DCB1, a second source circuit board DCB2, or a third source circuit board DCB3 through a first power pad hole PPH1 penetrating the second substrate SUB2, a first barrier layer BR1, and the first substrate SUB1.

As illustrated in FIGS. 14 and 15, when the first power bottom line VSBL is disposed not between the first substrate SUB1 and the second substrate SUB2 but on the second substrate SUB2, the first power connection hole PCH1 may not be deep (e.g., deep relative to when the first power bottom line VSBL is disposed between the first substrate SUB1 and the second substrate SUB2). Thus, the size of the first power connection hole PCH1 may be reduced.

Figure 16:
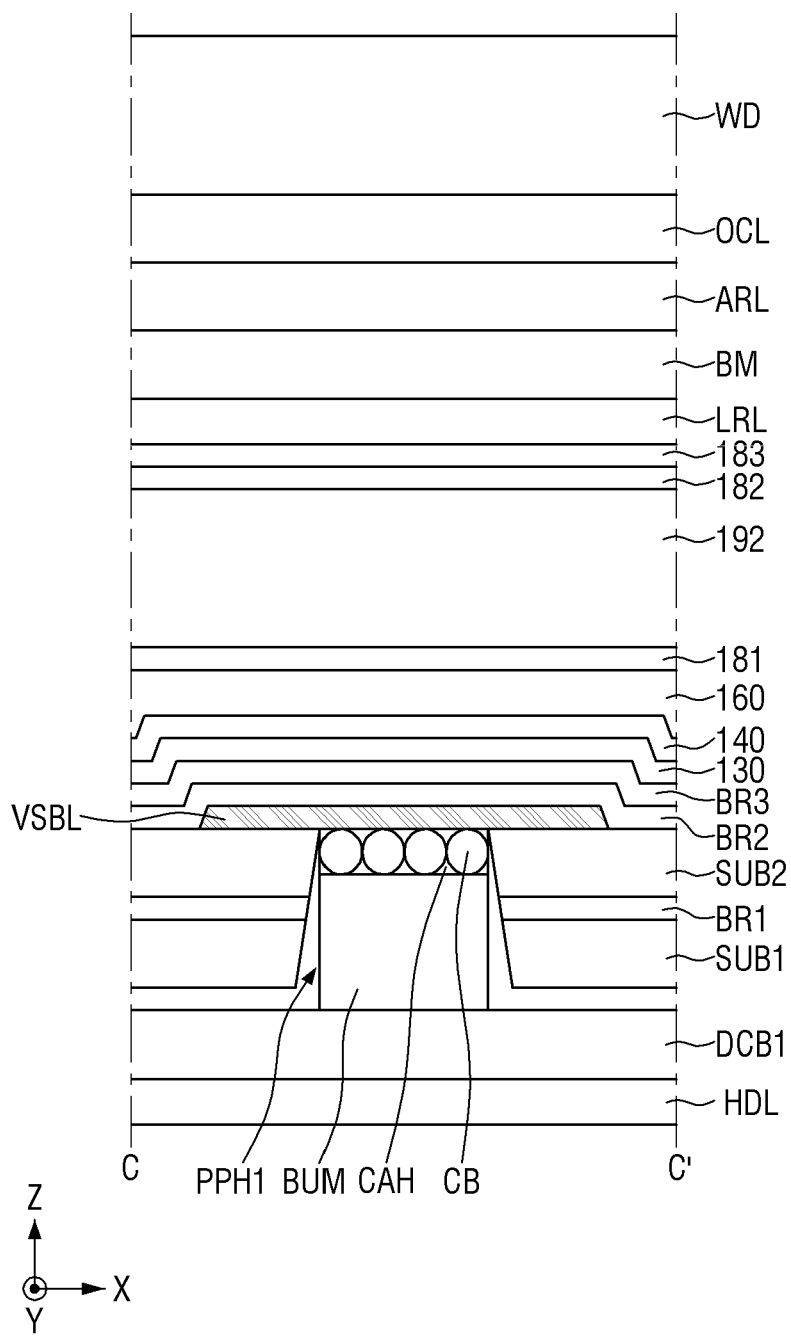
FIG. 16 is a cross-sectional view of an example of the first display device taken along the line C-C' of FIG. 6.

FIG. 16 is a cross-sectional view of an example of the first display device 11 taken along the line C-C' of FIG. 6.

The embodiment of FIG. 16 is different from the embodiment of FIG. 15 in that a heat dissipation layer HDL is disposed not under a first substrate SUB1 but under a first source circuit board DCB1 in an area in which the first source circuit board DCB1 is disposed. Therefore, in the embodiment of FIG. 16, not only the heat transferred to the first substrate SUB1 but also the heat of the first source circuit board DCB1 may be easily dissipated.

Figure 17:
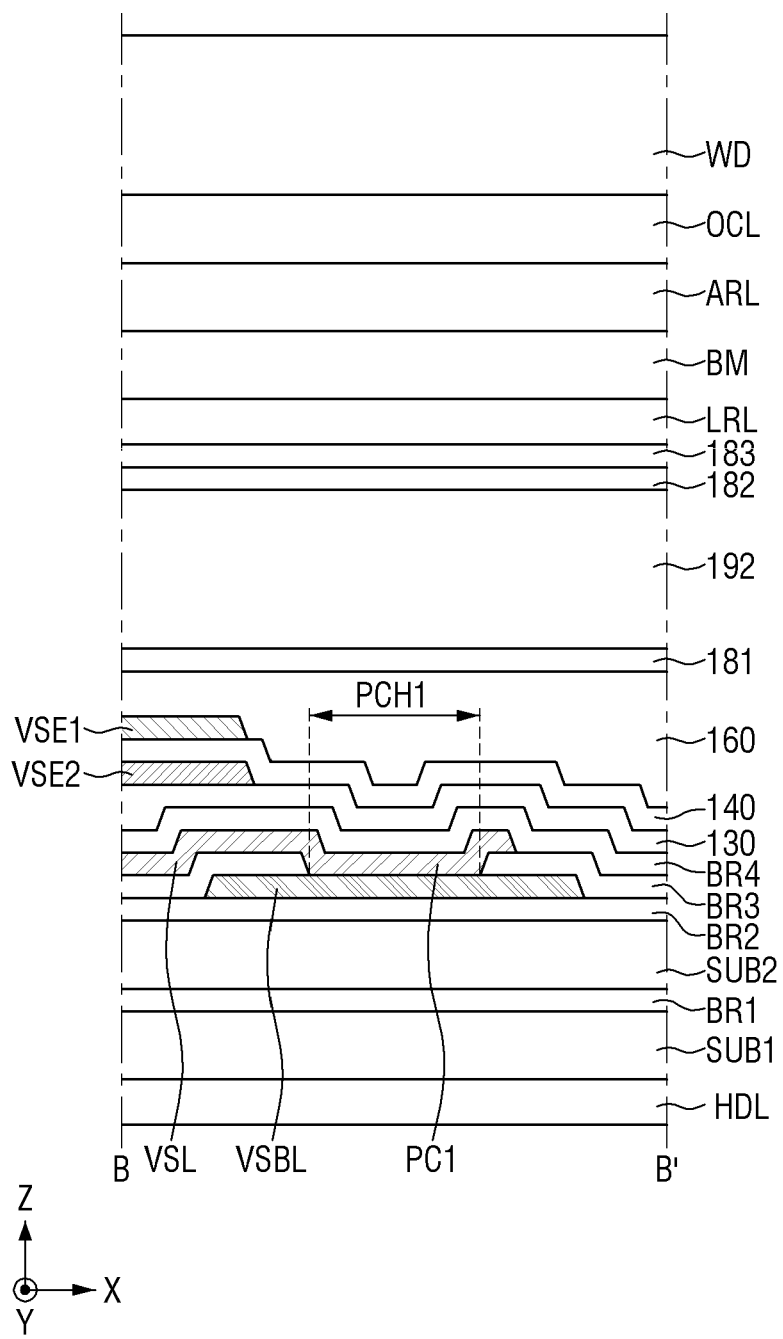
FIG. 17 is a cross-sectional view of an example of the first display device taken along the line B-B' of FIG. 6.
Figure 18:
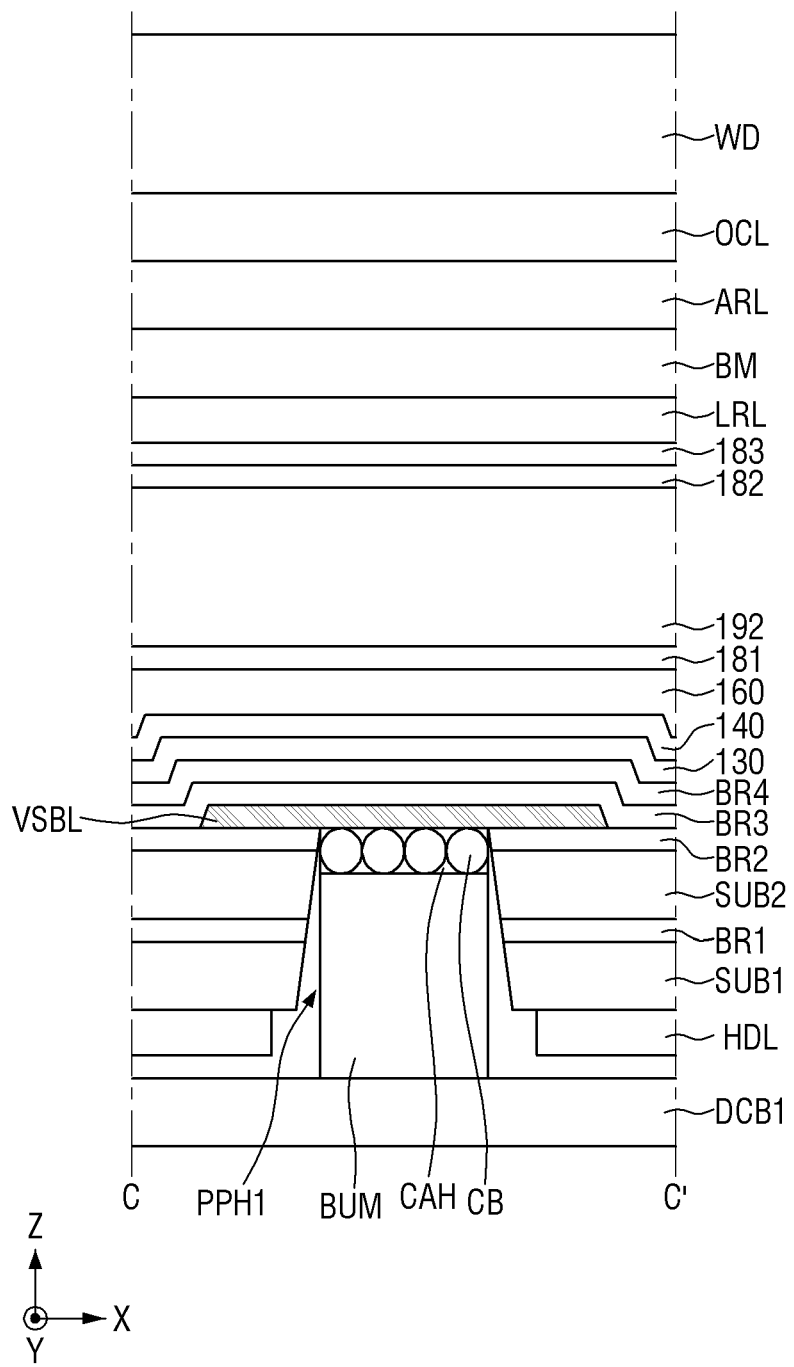
FIG. 18 is a cross-sectional view of an example of the first display device taken along the line C-C' of FIG. 6.

FIG. 17 is a cross-sectional view of an example of the first display device 11 taken along the line B-B' of FIG. 6. FIG. 18 is a cross-sectional view of an example of the first display device 11 taken along the line C-C' of FIG. 6.

The embodiment of FIGS. 17 and 18 is different from the embodiment of FIGS. 14 and 15 in that a first power bottom line VSBL is disposed not on a second substrate SUB2 but on a second barrier layer BR2. With reference to FIGS. 17 and 18, differences from the embodiment of FIGS. 14 and 15 will be primarily described.

Referring to FIGS. 17 and 18, the second barrier layer BR2 may be disposed on the second substrate SUB2, and the first power bottom line VSBL may be disposed on the second barrier layer BR2. A third barrier layer BR3 may be disposed on the first power bottom line VSBL.

A first metal layer including a first power line VSL, a first power connection unit PC1, a second power line VDL, and a second sub electrode CE22 of a second electrode CE2 of a capacitor CST may be disposed on the third barrier layer BR3. The first power line VSL may be connected to the first power bottom line VSBL through a first power connection hole PCH1 penetrating the third barrier layer BR3.

A fourth barrier layer BR4 may be disposed on the first metal layer. The fourth barrier layer BR4 is a layer for protecting switching elements ST1 and light emitting elements LE from moisture that may be introduced through the second substrate SUB2 which is vulnerable to moisture permeation. The fourth barrier layer BR4 may include at least one inorganic layer. For example, the fourth barrier layer BR4 may be a multilayer in which inorganic layers including at least one of silicon oxide ($SiO_x$), silicon nitride ($SiN_x$), and silicon oxynitride (SiON) are alternately stacked.

The first power bottom line VSBL may be connected to a bump BUM of a first source circuit board DCB1, a second source circuit board DCB2, or a third source circuit board DCB3 through a first power pad hole PPH1 penetrating the second barrier layer BR2, the second substrate SUB2, a first barrier layer BR1, and a first substrate SUB1.

As illustrated in FIGS. 17 and 18, when the first power bottom line VSBL is disposed on the second barrier layer BR2, the first power connection hole PCH1 may not be deep. Thus, the size of the first power connection hole PCH1 may be reduced.

Figure 19:
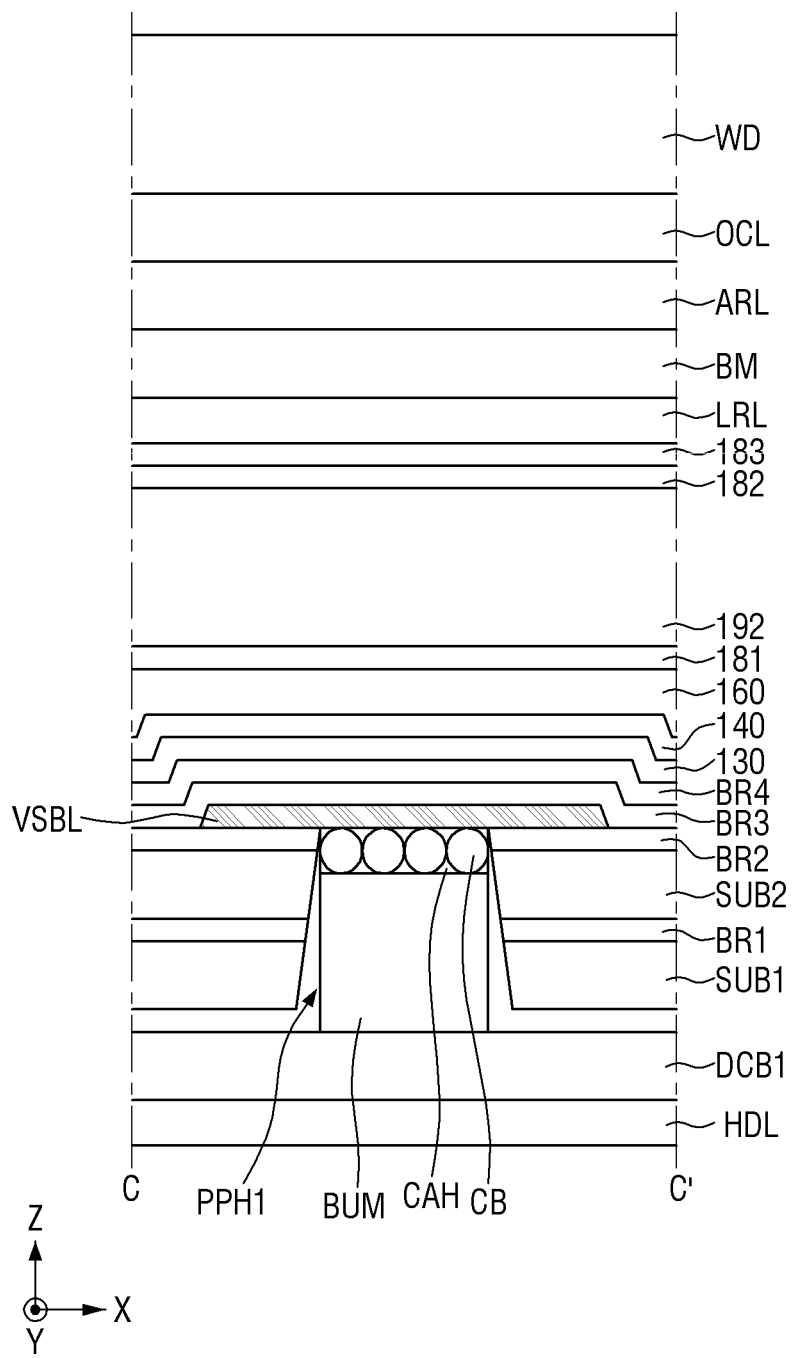
FIG. 19 is a cross-sectional view of an example of the first display device taken along the line C-C' of FIG. 6.

FIG. 19 is a cross-sectional view of an example of the first display device 11 taken along the line C-C' of FIG. 6.

The embodiment of FIG. 19 is different from the embodiment of FIG. 18 in that a heat dissipation layer HDL is disposed not under a first substrate SUB1 but under a first source circuit board DCB1 in an area in which the first source circuit board DCB1 is disposed. Therefore, in the embodiment of FIG. 19, not only the heat transferred to the first substrate SUB1 but also the heat of or transferred to the first source circuit board DCB1 may be easily dissipated.

Figure 20:
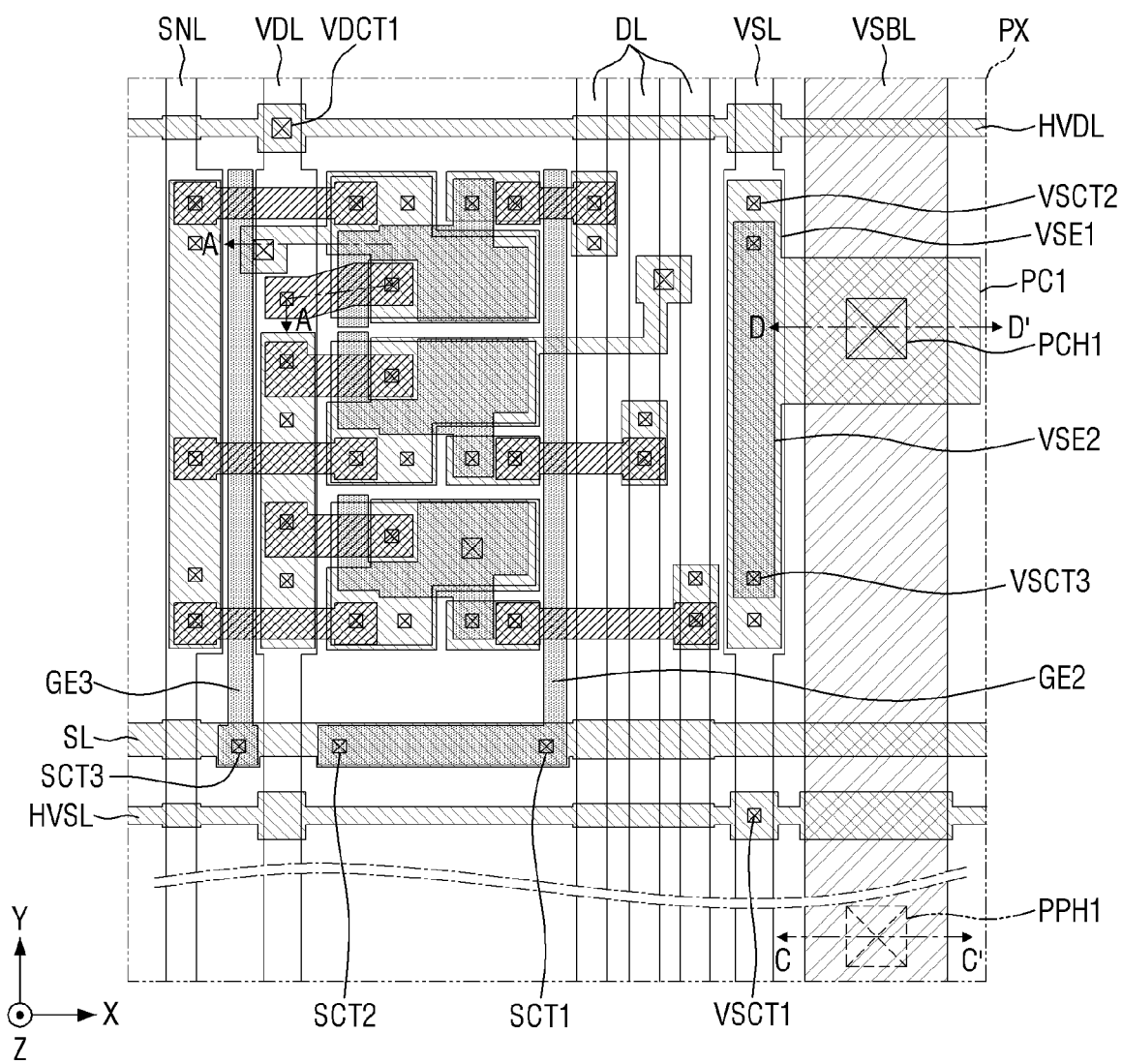
FIG. 20 is a layout view illustrating an example of a first pixel driving unit, a second pixel driving unit, a third pixel driving unit, a first power connection hole, and a first power pad hole of FIG. 4.

FIG. 20 is a layout view illustrating an example of a first pixel driving unit PDU1, a second pixel driving unit PDU2, a third pixel driving unit PDU3, a first power connection hole PCH1, and a first power pad hole PPH1 of FIG. 4.

The embodiment of FIG. 20 is different from the embodiment of FIG. 6 in that a first power connection unit PC1 protrudes not from a first power line VSL but from a first power connection electrode VSE1. With reference to FIG. 20, differences from the embodiment of FIG. 6 will be primarily described.

Referring to FIG. 20, even if another line made of the same metal layer as the first power line VSL is disposed between the first power line VSL and a first power connection hole PCH1, the first power connection unit PC1 may be connected to a first power bottom line VSBL through the first power connection hole PCH1 across the other line. For example, even if a data line DL is additionally disposed between the first power line VSL and the first power connection hole PCH1, because the first power connection unit PC1 is disposed on or at a different layer from the data line DL, the first power connection unit PC1 may be connected to the first power bottom line VSBL through the first power connection hole PCH1 across the data line DL.

Figure 21:
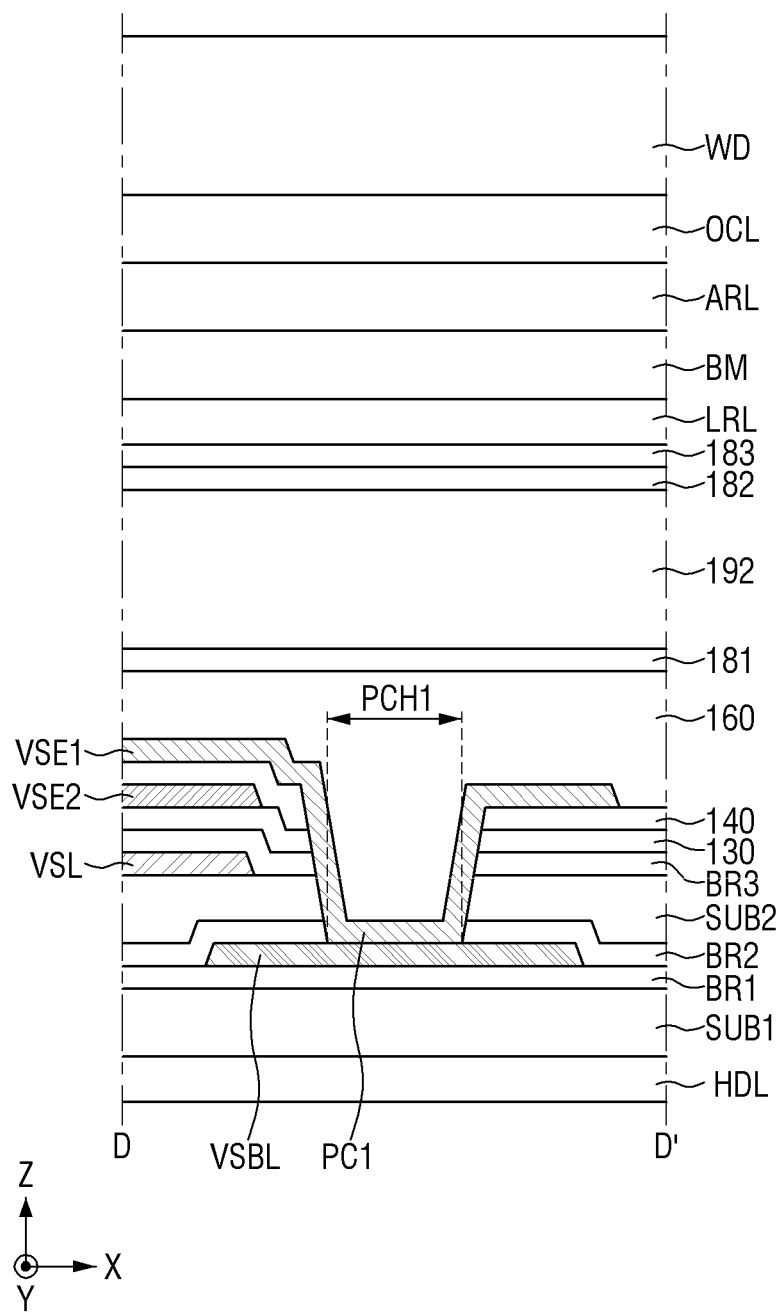
FIG. 21 is a cross-sectional view of an example of the first display device taken along the line D-D' of FIG. 20.

FIG. 21 is a cross-sectional view of an example of the first display device 11 taken along the line D-D' of FIG. 20.

The embodiment of FIG. 21 is different from the embodiment of FIG. 11 in a first power connection unit PC1. Therefore, with reference to FIG. 21, differences from the embodiment of FIG. 11 will be primarily described.

Referring to FIG. 21, the first power connection unit PC1 may extend from a first power connection electrode VSE1. The first power connection unit PC1 and the first power connection electrode VSE1 may be integrally formed. The first power connection unit PC1 may be connected to a first power bottom line VSBL through a first power connection hole PCH1 penetrating a second barrier layer BR2, a second substrate SUB2, a third barrier layer BR3, a gate insulating layer 130, and an interlayer insulating film 140.

Figure 22:
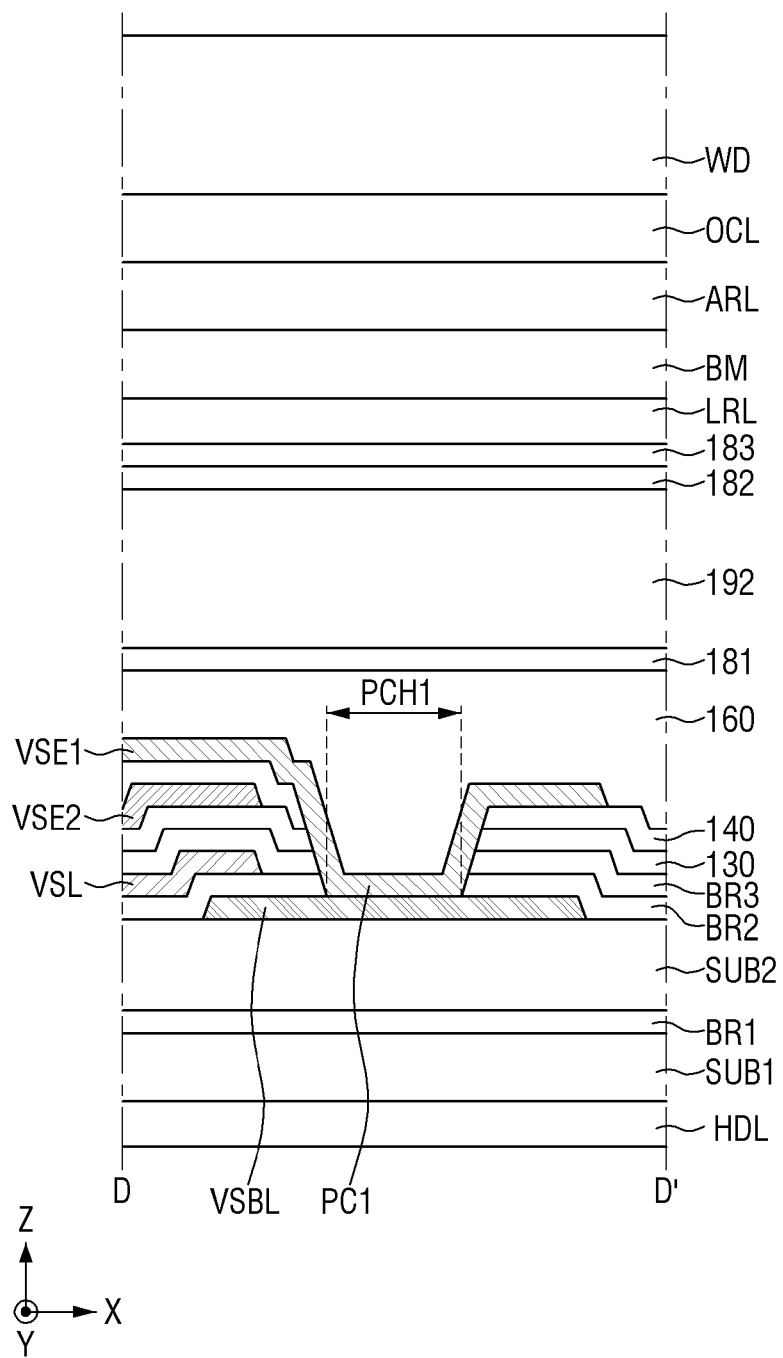
FIG. 22 is a cross-sectional view of an example of the first display device taken along the line D-D' of FIG. 20.

FIG. 22 is a cross-sectional view of an example of the first display device 11 taken along the line D-D' of FIG. 20.

The embodiment of FIG. 22 is different from the embodiment of FIG. 21 in that a first power bottom line VSBL is disposed on a second substrate SUB2. With reference to FIG. 22, differences from the embodiment of FIG. 21 will be primarily described.

Referring to FIG. 22, the first power bottom line VSBL is not disposed between a first substrate SUB1 and the second substrate SUB2. The first power bottom line VSBL may be disposed on the second substrate SUB2, and a second barrier layer BR2 may be disposed on the first power bottom line VSBL.

A first metal layer including a first power line VSL, a first power connection unit PC1, a second power line VDL, and a second sub electrode CE22 of a second electrode CE2 of a capacitor CST may be disposed on the second barrier layer BR2. The first power connection unit PC1 may be connected to the first power bottom line VSBL through a first power connection hole PCH1 penetrating the second barrier layer BR2, a third barrier layer BR3, a gate insulating layer 130, and an interlayer insulating film 140.

As illustrated in FIG. 22, when the first power bottom line VSBL is disposed not between the first substrate SUB1 and the second substrate SUB2 but on the second substrate SUB2, the depth of the first power connection hole PCH1 is reduced. Thus, the size of the first power connection hole PCH1 may be reduced.

Figure 23:
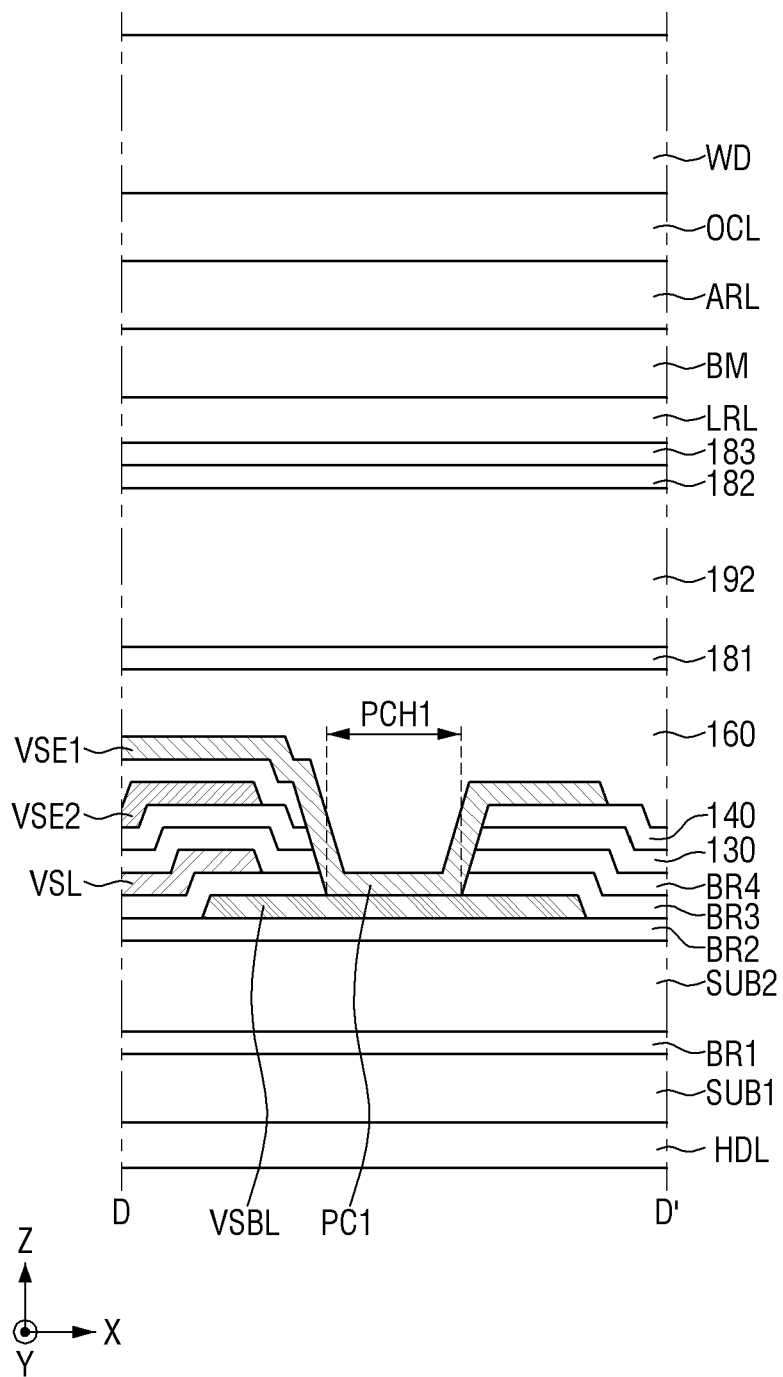
FIG. 23 is a cross-sectional view of an example of the first display device taken along the line D-D' of FIG. 20.

FIG. 23 is a cross-sectional view of an example of the first display device 11 taken along the line D-D' of FIG. 20.

The embodiment of FIG. 23 is different from the embodiment of FIG. 22 in that a first power bottom line VSBL is disposed not on a second substrate SUB2 but on a second barrier layer BR2. With reference to FIG. 23, differences from the embodiment of FIG. 22 will be primarily described.

Referring to FIG. 23, the second barrier layer BR2 may be disposed on the second substrate SUB2, and the first power bottom line VSBL may be disposed on the second barrier layer BR2. A third barrier layer BR3 may be disposed on the first power bottom line VSBL.

A first metal layer including a first power line VSL, a first power connection unit PC1, a second power line VDL, and a second sub electrode CE22 of a second electrode CE2 of a capacitor CST may be disposed on the third barrier layer BR3.

A fourth barrier layer BR4 may be disposed on the first metal layer. The fourth barrier layer BR4 is a layer for protecting switching elements ST1 and light emitting elements LE from moisture that may be introduced through the second substrate SUB2 which is vulnerable to moisture permeation. The fourth barrier layer BR4 may include at least one inorganic layer. For example, the fourth barrier layer BR4 may be a multilayer in which inorganic layers including at least one of silicon oxide ($SiO_x$), silicon nitride ($SiN_x$), and silicon oxynitride (SiON) are alternately stacked.

The first power connection unit PC1 may be connected to the first power bottom line VSBL through a first power connection hole PCH1 penetrating the third barrier layer BR3, the fourth barrier layer BR4, a gate insulating layer 130, and an interlayer insulating film 140.

As illustrated in FIG. 23, when the first power bottom line VSBL is disposed on the second barrier layer BR2, the depth of the first power connection hole PCH1 is reduced. Thus, the size of the first power connection hole PCH1 may be reduced.

Figure 24:
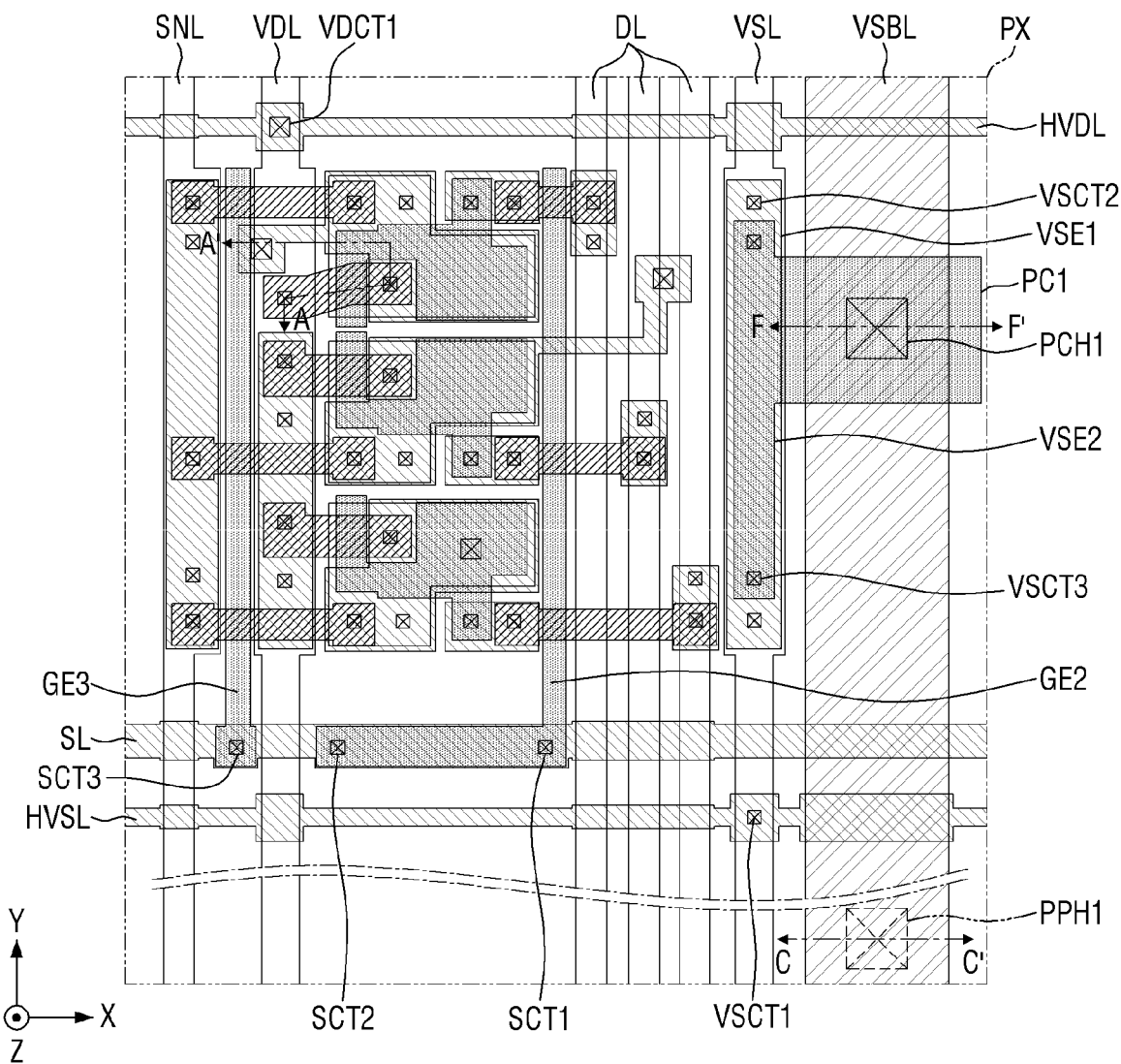
FIG. 24 is a layout view illustrating an example of a first pixel driving unit, a second pixel driving unit, a third pixel driving unit, a first power connection hole, and a first power pad hole of FIG. 4.

FIG. 24 is a layout view illustrating an example of a first pixel driving unit PDU1, a second pixel driving unit PDU2, a third pixel driving unit PDU3, a first power connection hole PCH1, and a first power pad hole PPH1 of FIG. 4.

The embodiment of FIG. 24 is different from the embodiment of FIG. 6 in that a first power connection unit PC1 protrudes not from a first power line VSL but from a second power connection electrode VSE2. With reference to FIG. 24, differences from the embodiment of FIG. 6 will be primarily described.

Referring to FIG. 24, even if another line made of the same metal layer as the first power line VSL is disposed between the first power line VSL and a first power connection hole PCH1, the first power connection unit PC1 may be connected to a first power bottom line VSBL through the first power connection hole PCH1 across the other line. For example, even if a data line DL is additionally disposed between the first power line VSL and the first power connection hole PCH1, because the first power connection unit PC1 is disposed on or at a different layer from the data line DL, the first power connection unit PC1 may be connected to the first power bottom line VSBL through the first power connection hole PCH1 across the data line DL.

Figure 25:
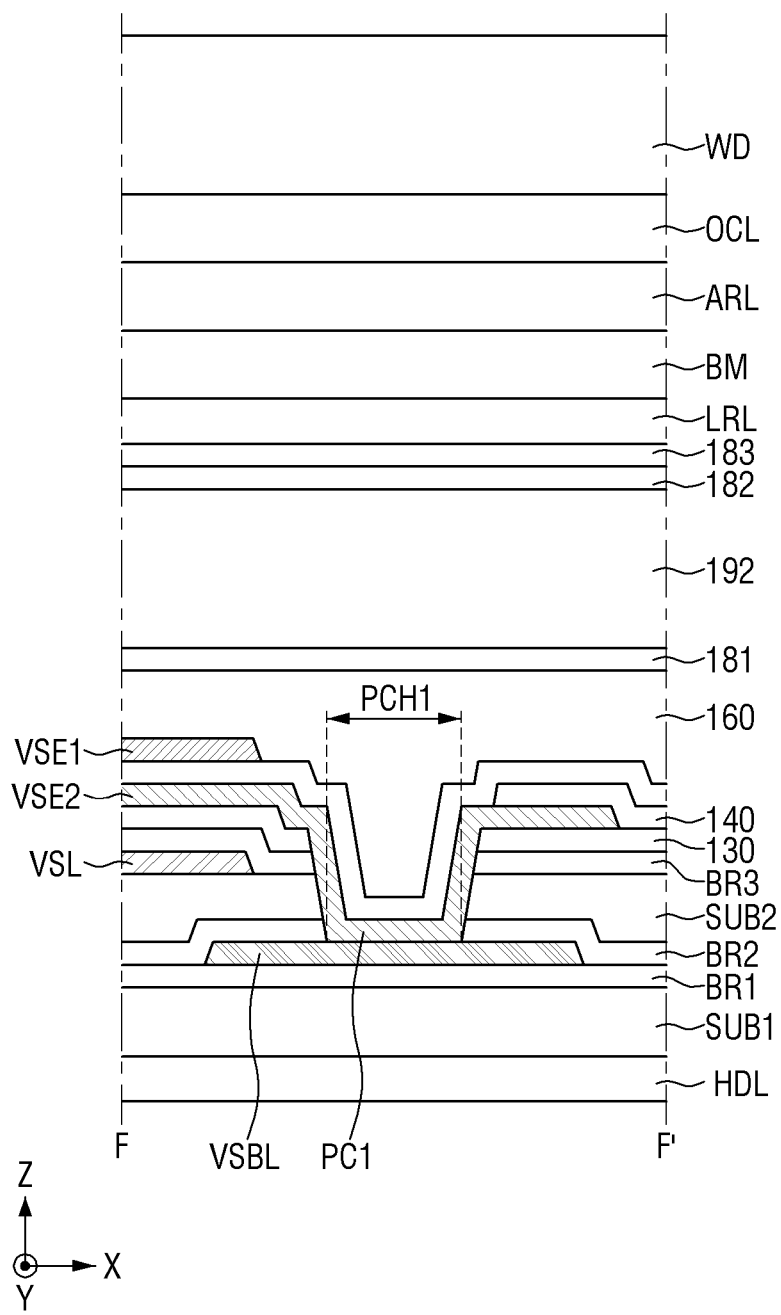
FIG. 25 is a cross-sectional view of an example of the first display device taken along the line F-F' of FIG. 24.

FIG. 25 is a cross-sectional view of an example of the first display device 11 taken along the line F-F' of FIG. 24.

The embodiment of FIG. 25 is different from the embodiment of FIG. 11 in a first power connection unit PC1. Therefore, with reference to FIG. 25, differences from the embodiment of FIG. 11 will be primarily described.

Referring to FIG. 25, the first power connection unit PC1 may extend from a second power connection electrode VSE2. The first power connection unit PC1 and the second power connection electrode VSE2 may be integrally formed. The first power connection unit PC1 may be connected to a first power bottom line VSBL through a first power connection hole PCH1 penetrating a second barrier layer BR2, a second substrate SUB2, a third barrier layer BR3, and a gate insulating layer 130.

Figure 26:
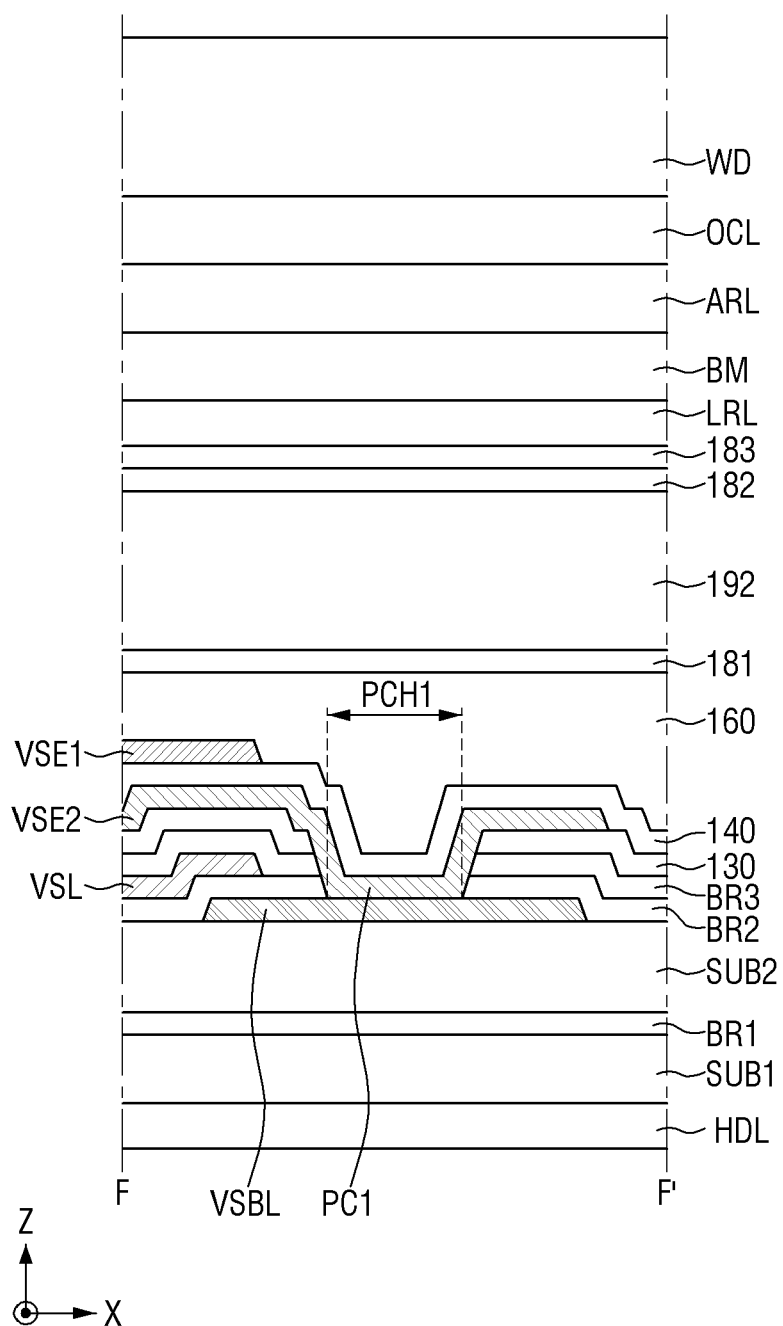
FIG. 26 is a cross-sectional view of an example of the first display device taken along the line F-F' of FIG. 24.

FIG. 26 is a cross-sectional view of an example of the first display device 11 taken along the line F-F' of FIG. 24.

The embodiment of FIG. 26 is different from the embodiment of FIG. 25 in that a first power bottom line VSBL is disposed on a second substrate SUB2. With reference to FIG. 26, differences from the embodiment of FIG. 25 will be primarily described.

Referring to FIG. 26, the first power bottom line VSBL is not disposed between a first substrate SUB1 and the second substrate SUB2. The first power bottom line VSBL may be disposed on the second substrate SUB2, and a second barrier layer BR2 may be disposed on the first power bottom line VSBL.

A first metal layer including a first power line VSL, a first power connection unit PC1, a second power line VDL, and a second sub electrode CE22 of a second electrode CE2 of a capacitor CST may be disposed on the second barrier layer BR2. The first power connection unit PC1 may be connected to the first power bottom line VSBL through a first power connection hole PCH1 penetrating the second barrier layer BR2, a third barrier layer BR3, and a gate insulating layer 130.

As illustrated in FIG. 26, when the first power bottom line VSBL is disposed not between the first substrate SUB1 and the second substrate SUB2 but on the second substrate SUB2, the depth of the first power connection hole PCH1 is reduced. Thus, the size of the first power connection hole PCH1 may be reduced.

Figure 27:
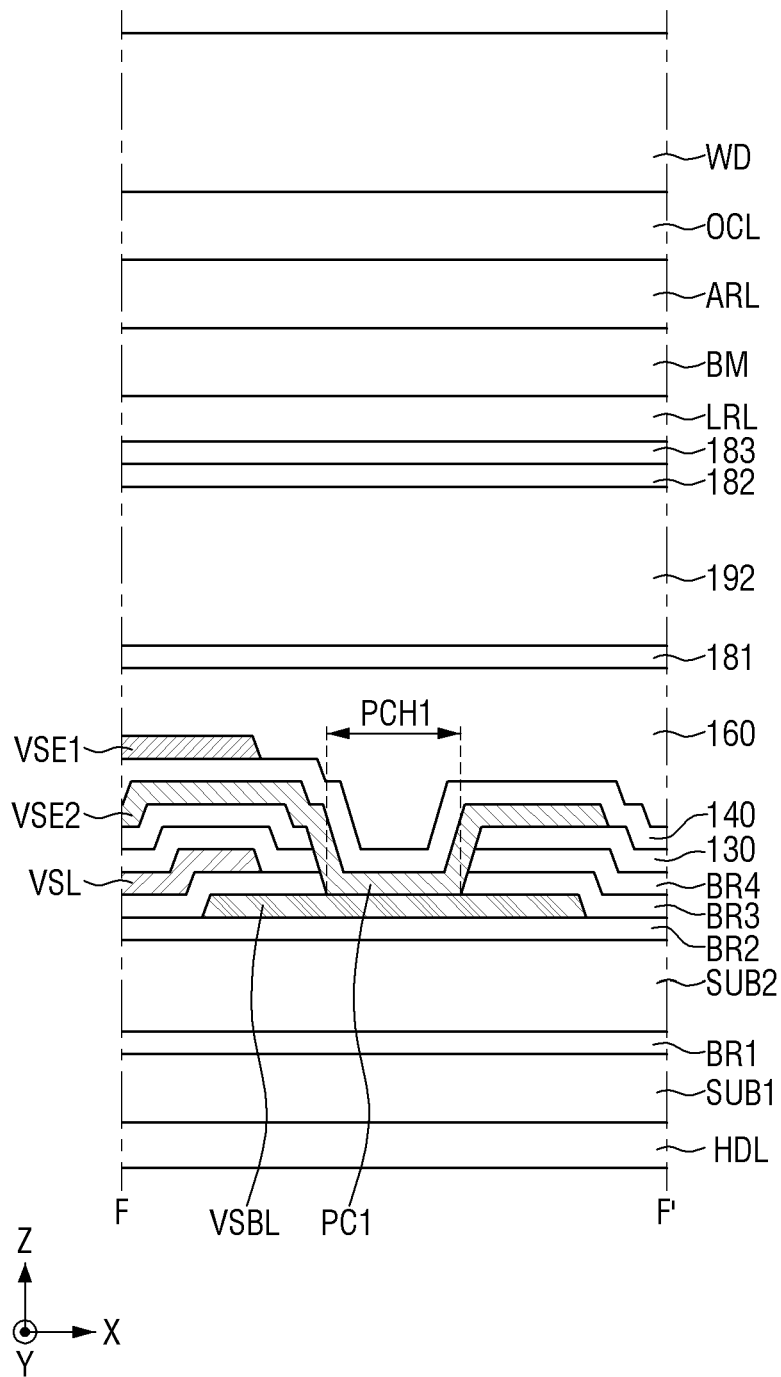
FIG. 27 is a cross-sectional view of an example of the first display device taken along the line F-F' of FIG. 24.

FIG. 27 is a cross-sectional view of an example of the first display device 11 taken along the line F-F' of FIG. 24.

The embodiment of FIG. 27 is different from the embodiment of FIG. 26 in that a first power bottom line VSBL is disposed not on a second substrate SUB2 but on a second barrier layer BR2. With reference to FIG. 27, differences from the embodiment of FIG. 26 will be primarily described.

Referring to FIG. 27, the second barrier layer BR2 may be disposed on the second substrate SUB2, and the first power bottom line VSBL may be disposed on the second barrier layer BR2. A third barrier layer BR3 may be disposed on the first power bottom line VSBL.

A first metal layer including a first power line VSL, a first power connection unit PC1, a second power line VDL, and a second sub electrode CE22 of a second electrode CE2 of a capacitor CST may be disposed on the third barrier layer BR3.

A fourth barrier layer BR4 may be disposed on the first metal layer. The fourth barrier layer BR4 is a layer for protecting switching elements ST1 and light emitting elements LE from moisture that may be introduced through the second substrate SUB2 which is vulnerable to moisture permeation. The fourth barrier layer BR4 may include at least one inorganic layer. For example, the fourth barrier layer BR4 may be a multilayer in which inorganic layers including at least one of silicon oxide ($SiO_x$), silicon nitride ($SiN_x$), and silicon oxynitride (SiON) are alternately stacked.

The first power connection unit PC1 may be connected to the first power bottom line VSBL through a first power connection hole PCH1 penetrating the third barrier layer BR3, the fourth barrier layer BR4, and a gate insulating layer 130.

As illustrated in FIG. 27, when the first power bottom line VSBL is disposed on the second barrier layer BR2, the depth of the first power connection hole PCH1 is reduced. Thus, the size of the first power connection hole PCH1 may be reduced.

Figure 28:
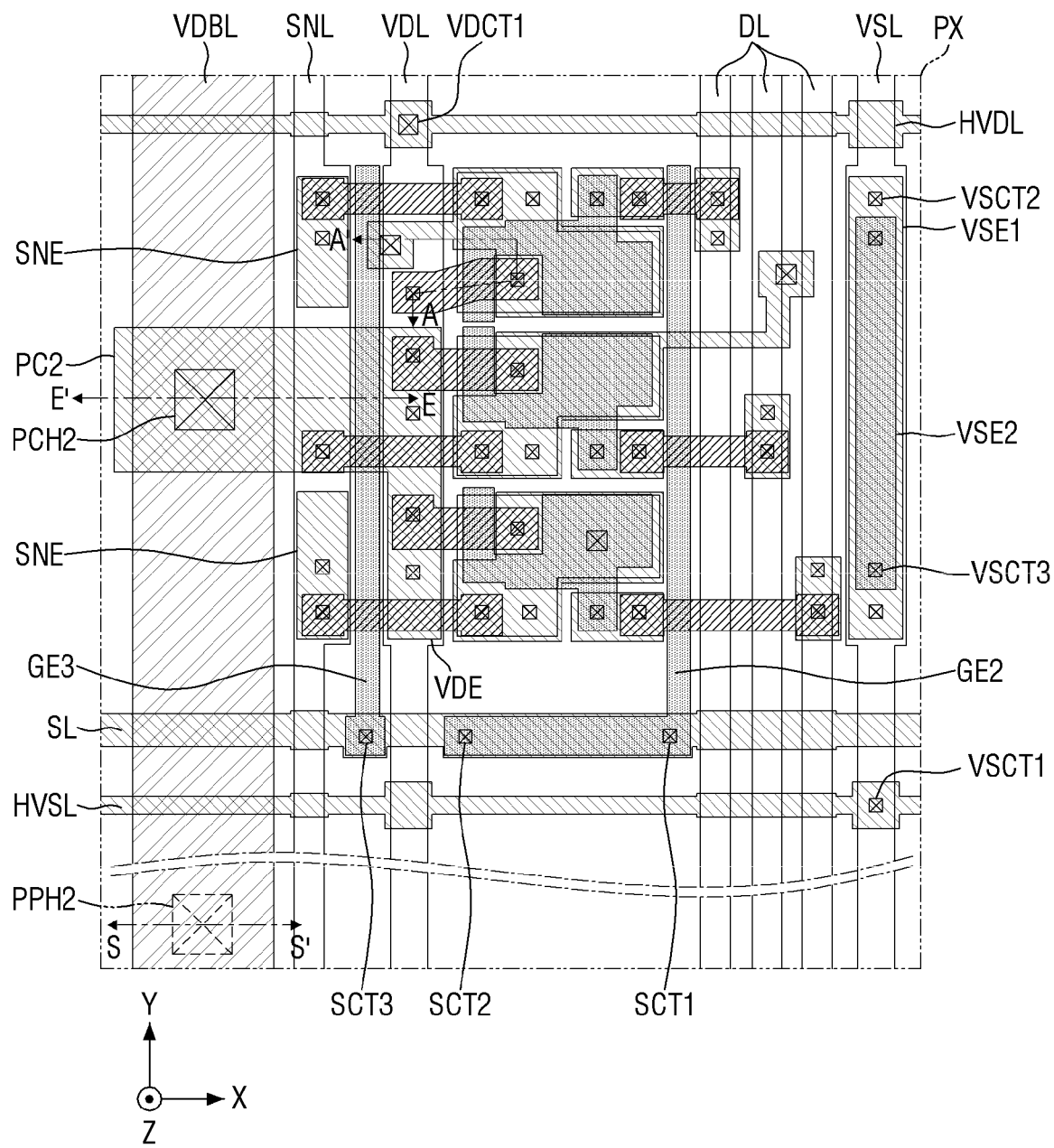
FIG. 28 is a layout view illustrating an example of a first pixel driving unit, a second pixel driving unit, a third pixel driving unit, a second power connection hole, and a second power pad hole of FIG. 4.

FIG. 28 is a layout view illustrating an example of a first pixel driving unit PDU1, a second pixel driving unit PDU2, a third pixel driving unit PDU3, a second power connection hole PCH2, and a second power pad hole PPH2 of FIG. 4.

The embodiment of FIG. 28 is different from the embodiment of FIG. 6 in that a second power connection unit PC2 is connected to a second power bottom line VDBL through a second power connection hole PCH2, and the second power bottom line VDBL is disposed in a second power pad hole PPH2. With reference to FIG. 28, differences from the embodiment of FIG. 6 will be primarily described.

Referring to FIG. 28, the second power connection unit PC2 may protrude from a third power connection electrode VDE. For example, the second power connection unit PC2 may extend from the third power connection electrode VDE in the first direction (e.g., the X-axis direction). The second power connection unit PC2 and the third power connection electrode VDE may be integrally formed. The second power connection unit PC2 may be connected to the second power bottom line VDBL through the second power connection hole PCH2. The second power connection unit PC2 may overlap a third gate electrode GE3 and a sensing line SNL in the third direction (e.g., the Z-axis direction). The second power connection unit PC2 may be spaced from a sensing connection electrode SNE.

The second power connection hole PCH2 may not overlap pixel driving units PDU, a scan line SL, data lines DL, a first power line VSL, and a second power line VDL. Therefore, it is possible to prevent or substantially prevent the pixel driving units PDU, the scan line SL, the data lines DL, the first power line VSL, and the second power line VDL from being stepped due to the second power connection hole PCH2. Accordingly, it is possible to prevent or substantially prevent cracks from being generated in switching elements of the pixel driving units PDU, the scan line SL, the first power line VSL, the data lines DL, and the second power line VDL by the pressure applied when circuit boards are attached.

The second power bottom line VDBL may be connected to a bump of any one of a first source circuit board DCB1 (e.g., see FIG. 3A), a second source circuit board DCB2 (e.g., see FIG. 3A), and a third source circuit board DCB3 through the second power pad hole PPH2.

As illustrated in FIG. 28. even if another line made of the same metal layer as the second power line VDL is disposed between the second power line VDL and the second power connection hole PCH2, the second power connection unit PC2 may be connected to the second power bottom line VDBL through the second power connection hole PCH2 across the other line. For example, even if the third gate electrode GE3 and the sensing line SNL are disposed between the second power line VDL and the second power connection hole PCH2, because the second power connection unit PC2 is disposed on or at a different layer from the third gate electrode GE3 and the sensing line SNL, it may be connected to the second power bottom line VDBL through the second power connection hole PCH2 across the sensing line SNL.

Figure 29:
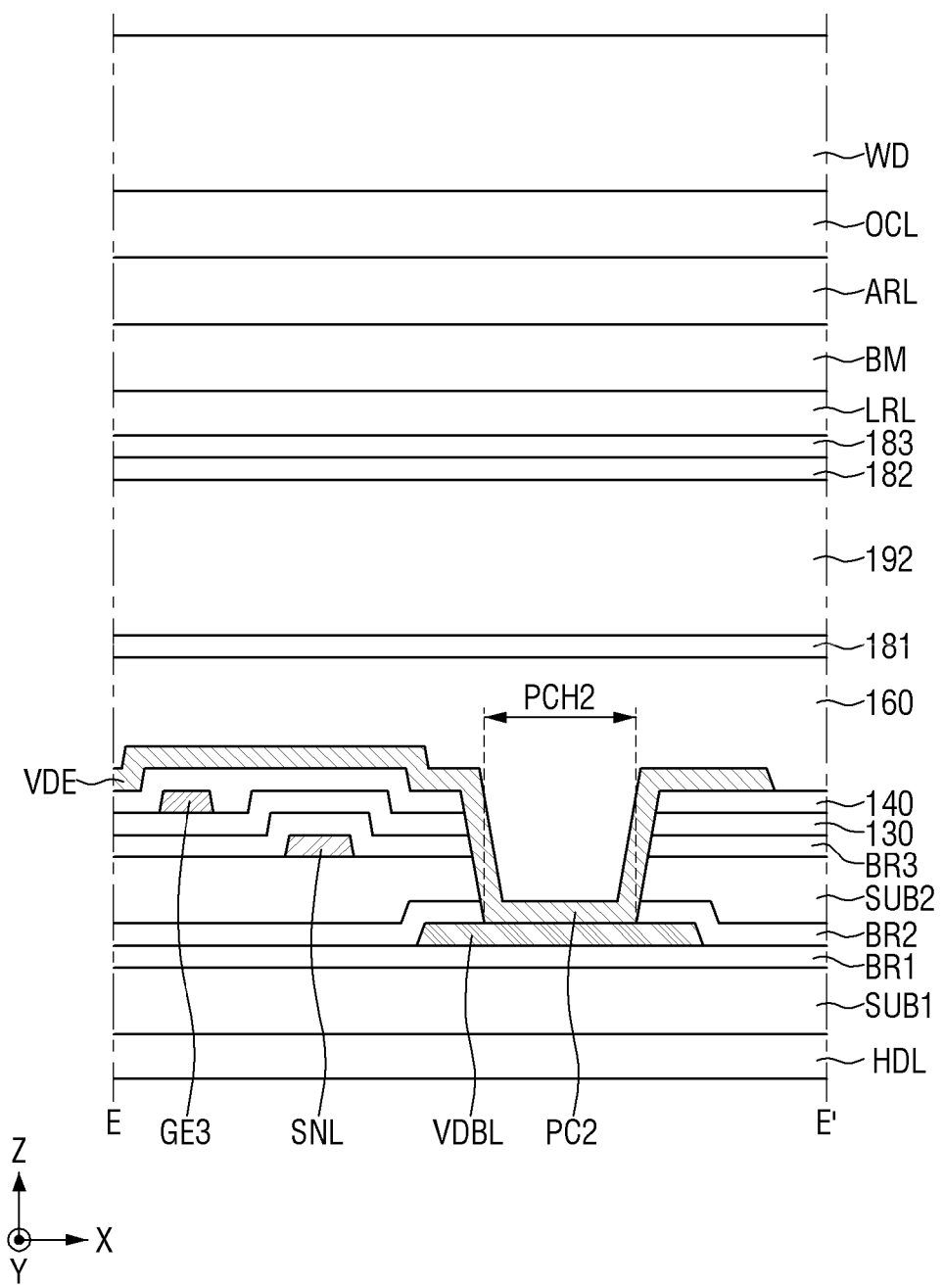
FIG. 29 is a cross-sectional view of an example of the first display device taken along the line E-E' of FIG. 28.

FIG. 29 is a cross-sectional view of an example of the first display device 11 taken along the line E-E' of FIG. 28.

The embodiment of FIG. 29 is different from the embodiment of FIG. 11 in that a first power connection unit PC1 is omitted, and a second power connection unit PC2 is added. Therefore, with reference to FIG. 29, differences from the embodiment of FIG. 11 will be primarily described.

Referring to FIG. 29, the second power connection unit PC2 may extend from a third power connection electrode VDE. The second power connection unit PC2 and the third power connection electrode VDE may be integrally formed. The second power connection unit PC2 may be connected to a second power bottom line VDBL through a second power connection hole PCH2 penetrating a second barrier layer BR2, a second substrate SUB2, a third barrier layer BR3, a gate insulating layer 130, and an interlayer insulating film 140.

Figure 30:
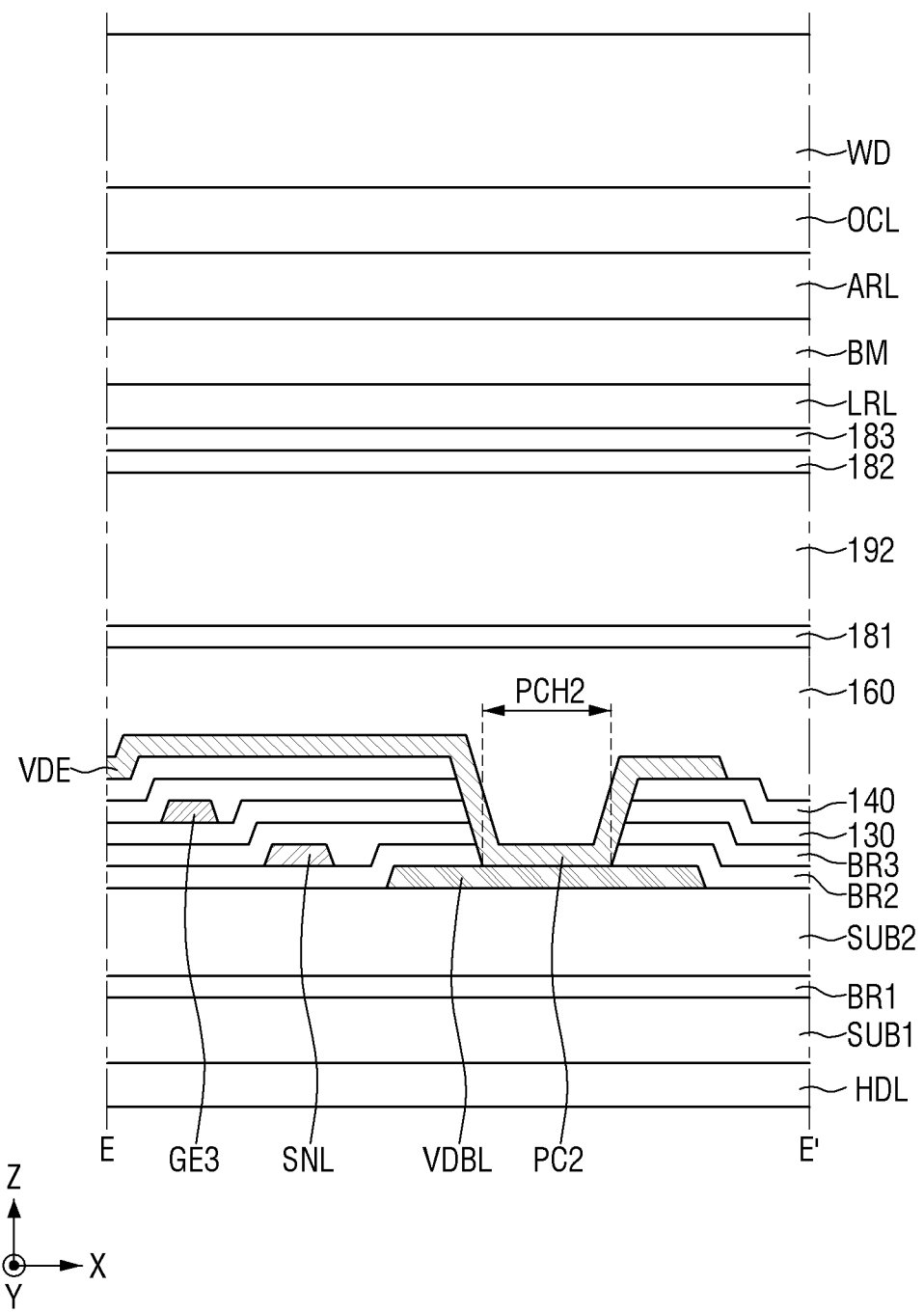
FIG. 30 is a cross-sectional view of an example of the first display device taken along the line E-E' of FIG. 28.

FIG. 30 is a cross-sectional view of an example of the first display device 11 taken along the line E-E' of FIG. 28.

The embodiment of FIG. 30 is different from the embodiment of FIG. 29 in that a second power bottom line VDBL is disposed on a second substrate SUB2. With reference to FIG. 30, differences from the embodiment of FIG. 29 will be primarily described.

Referring to FIG. 30, the second power bottom line VDBL is not disposed between a first substrate SUB1 and the second substrate SUB2. The second power bottom line VDBL may be disposed on the second substrate SUB2, and a second barrier layer BR2 may be disposed on the second power bottom line VDBL. The second power connection unit PC2 may be connected to the second power bottom line VDBL through a second power connection hole PCH2 penetrating the second barrier layer BR2, a third barrier layer BR3, a gate insulating layer 130, and an interlayer insulating film 140.

As illustrated in FIG. 30, when the second power bottom line VDBL is disposed not between the first substrate SUB1 and the second substrate SUB2 but on the second substrate SUB2, the depth of the second power connection hole PCH2 is reduced. Thus, the size of the second power connection hole PCH2 may be reduced.

Figure 31:
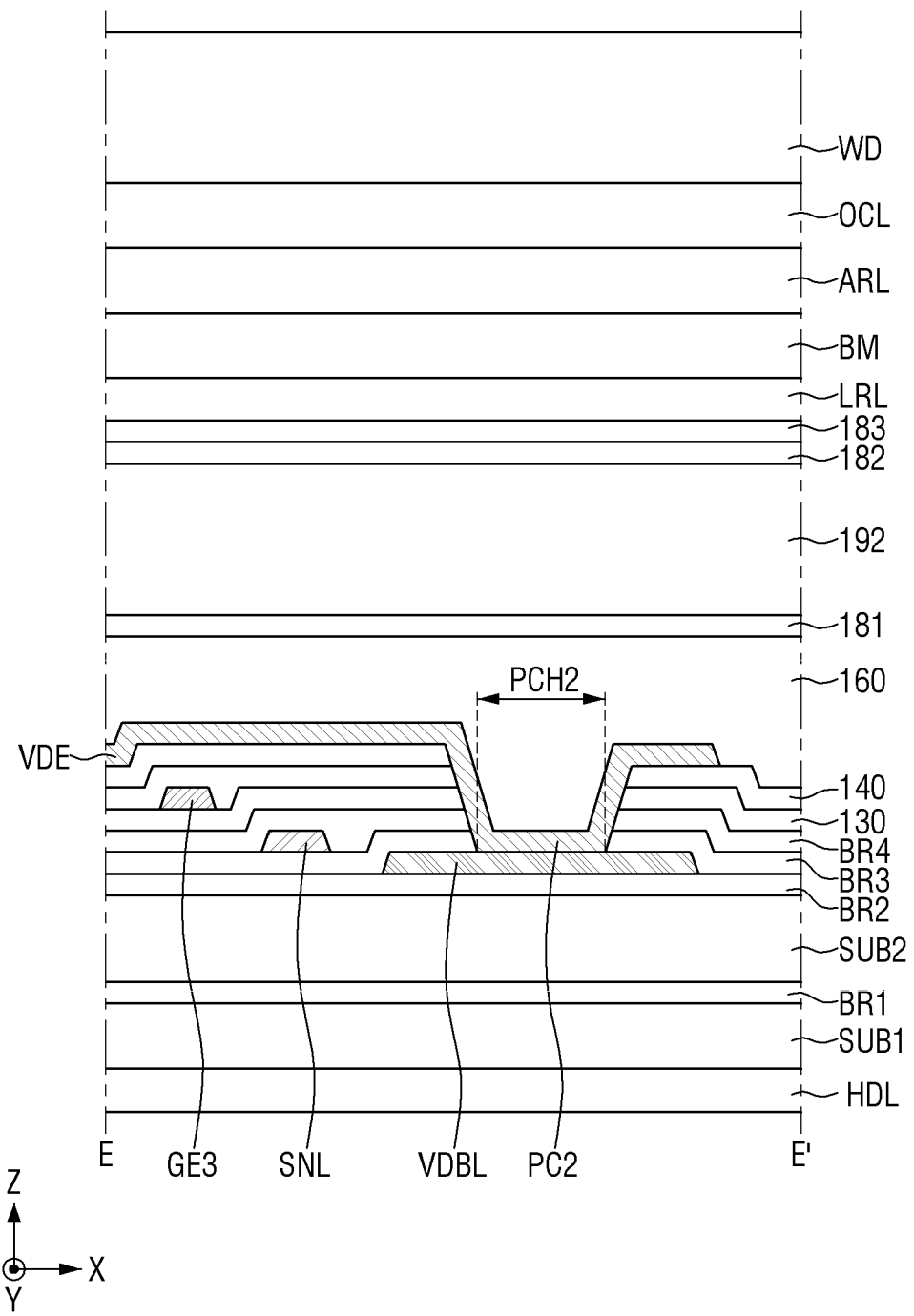
FIG. 31 is a cross-sectional view of an example of the first display device taken along the line E-E' of FIG. 28.

FIG. 31 is a cross-sectional view of an example of the first display device 11 taken along the line E-E' of FIG. 28.

The embodiment of FIG. 31 is different from the embodiment of FIG. 30 in that a second power bottom line VDBL is disposed not on a second substrate SUB2 but on a second barrier layer BR2. With reference to FIG. 31, differences from the embodiment of FIG. 30 will be primarily described.

Referring to FIG. 31, the second barrier layer BR2 may be disposed on the second substrate SUB2, and the second power bottom line VDBL may be disposed on the second barrier layer BR2. A third barrier layer BR3 may be disposed on the second power bottom line VDBL.

A first metal layer including a sensing line SNL connection unit may be disposed on the third barrier layer BR3.

A fourth barrier layer BR4 may be disposed on the first metal layer. The fourth barrier layer BR4 is a layer for protecting switching elements ST1 and light emitting elements LE from moisture that may be introduced through the second substrate SUB2 which is vulnerable to moisture permeation. The fourth barrier layer BR4 may include at least one inorganic layer. For example, the fourth barrier layer BR4 may be a multilayer in which inorganic layers including at least one of silicon oxide ($SiO_x$), silicon nitride ($SiN_x$), and silicon oxynitride (SiON) are alternately stacked.

The second power connection unit PC2 may be connected to the second power bottom line VDBL through a second power connection hole PCH2 penetrating the third barrier layer BR3, the fourth barrier layer BR4, a gate insulating layer 130, and an interlayer insulating film 140.

As illustrated in FIG. 31, when the second power bottom line VDBL is disposed on the second barrier layer BR2, the depth of the second power connection hole PCH2 is reduced. Thus, the size of the second power connection hole PCH2 may be reduced.

An example of the first display device 11 taken along the line S-S' of FIG. 28 may be substantially the same as any one of FIGS. 12, 13, 15, 16, 18, and 19. Therefore, a redundant description of an example of the first display device 11 taken along the line S-S' of FIG. 28 may not be repeated.

Figure 32:
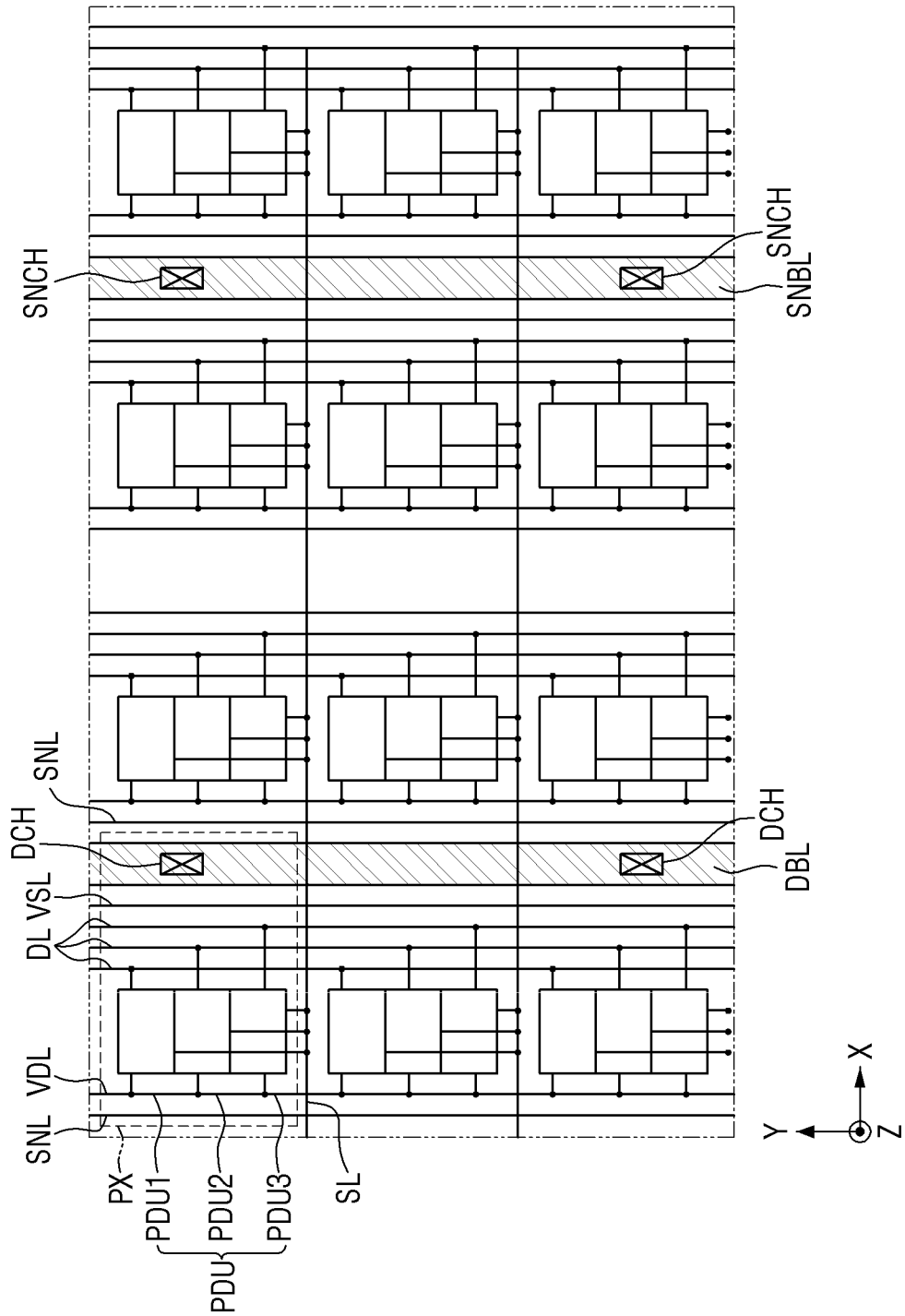
FIG. 32 is a layout view illustrating subpixels of a first display device according to one or more embodiments of the present disclosure.

FIG. 32 is a layout view illustrating subpixels of a first display device 11 according to one or more embodiments of the present disclosure.

The embodiment of FIG. 32 is different from the embodiment of FIG. 4 in that a data bottom line DBL, data connection holes DCH, a sensing bottom line SNBL, and sensing connection holes SNCH are disposed instead of a first power bottom line VSBL, first power connection holes PCH1, a second power bottom line VDBL, and second power connection holes PCH2. With reference to FIG. 32, differences from the embodiment of FIG. 4 will be primarily described.

Referring to FIG. 32, the data bottom line DBL and the sensing bottom line SNBL may extend in the second direction (e.g., the Y-axis direction). The data bottom line DBL and the sensing bottom line SNBL may not overlap pixel driving units PDU, first power lines VSL, second power lines VDL, sensing lines SNL, and data lines DL.

The data bottom line DBL may be disposed between the first power line VSL of any one pixel PX and the sensing line SNL of another pixel PX neighboring the pixel PX in the first direction (e.g., the X-axis direction). The data bottom line DBL may overlap a data connection hole DCH. The data bottom line DBL may be connected (e.g., electrically connected) to the data lines DL through the data connection hole DCH.

The sensing bottom line SNBL may be disposed between the first power line VSL of any one pixel PX and the sensing line SNL of another pixel PX neighboring the pixel PX in the first direction (e.g., the X-axis direction). The sensing bottom line SNBL may overlap a sensing connection hole SNCH. The sensing bottom line SNBL bottom line may be connected (e.g., electrically connected) to the sensing line SNL through the sensing connection hole SNCH.

Each of the data connection holes DCH may be a hole for connecting (e.g., electrically connecting) a corresponding data line DL to the data bottom line DBL. Because the data connection holes DCH are deep, their size may be large. When a data connection hole DCH overlaps switching elements of a pixel driving unit PDU, a scan line SL, a data line DL, a sensing line SNL, a first power line VSL, and a second power line VDL in the third direction (e.g., the Z-axis direction), a step height of the switching elements of the pixel driving unit PDU, the scan line SL, the data line DL, the sensing line SNL, the first power line VSL, and the second power line VDL may be large due to the data connection hole DCH.

As described with reference to FIGS. 2, 3A and 3B, a scan circuit board SCB, a first source circuit board DCB1, a second source circuit board DCB2, and/or a third source circuit board DCB3 may be attached to a rear surface of the first display device 11. When a step height of switching elements of a pixel driving unit PDU, a scan line SL, a data line DL, a sensing line SNL, a first power line VSL, or a second power line VDL is large due to a data connection hole DCH, cracks may be generated in the switching elements of the pixel driving unit PDU, the scan line SL, the data line DL, the sensing line SNL, the first power line VSL, or the second power line VDL by the pressure applied when the circuit boards are attached.

Therefore, the data connection holes DCH may not overlap the pixel driving units PDU in the third direction (e.g., the Z-axis direction). In addition, the data connection holes DCH may not overlap the scan lines SL, the data lines DL, the sensing lines SNL, the first power lines VSL, and the second power lines VDL in the third direction (e.g., the Z-axis direction). In addition, the data connection holes DCH may not overlap light emitting units PEU1 (e.g., see FIG. 5) in the third direction (e.g., the Z-axis direction). Therefore, it is possible to prevent or substantially prevent the switching elements of the pixel driving units PDU, the scan lines SL, the data lines DL, the sensing lines SNL, the first power lines VSL, and the second power lines VDL from being stepped due to the data connection holes DCH. Accordingly, it is possible to prevent or substantially prevent cracks from being generated in the switching elements of the pixel driving units PDU, the scan lines SL, the first power lines VSL, the data lines DL, the sensing lines SNL, and the second power lines VDL by the pressure applied when the circuit boards are attached.

Each of the sensing connection holes SNCH may be a hole for connecting (e.g., electrically connecting) a corresponding sensing line SNL to the sensing bottom line SNBL. Although the sensing bottom line SNBL and the sensing connection holes SNCH are not illustrated in FIG. 3A for ease of description, they may be formed in a similar manner as the data bottom lines DBL and the data connection holes DCH illustrated in FIG. 3A.

Because the sensing connection holes SNCH are deep, their size may be large. In this case, when a sensing connection hole SNCH overlaps switching elements of a pixel driving unit PDU, a scan line SL, a data line DL, a sensing line SNL, a first power line VSL, and a second power line VDL in the third direction (e.g., the Z-axis direction), a step height of the switching elements of the pixel driving unit PDU, the scan line SL, the data line DL, the sensing line SNL, the first power line VSL, and the second power line VDL may be large due to the sensing connection hole SNCH.

As described with reference to FIGS. 2, 3A and 3B, the scan circuit board SCB, the first source circuit board DCB1, the second source circuit board DCB2, and/or the third source circuit board DCB3 may be attached to the rear surface of the first display device 11. When a step height of switching elements of a pixel driving unit PDU, a scan line SL, a data line DL, a sensing line SNL, a first power line VSL, or a second power line VDL is large due to a sensing connection hole SNCH, cracks may be generated in the switching elements of the pixel driving unit PDU, the scan line SL, the data line DL, the sensing line SNL, the first power line VSL, or the second power line VDL by the pressure applied when the circuit boards are attached.

Therefore, the sensing connection holes SNCH may not overlap the pixel driving units PDU in the third direction (e.g., the Z-axis direction). In addition, the sensing connection holes SNCH may not overlap the scan lines SL, the data lines DL, the first power lines VSL, and the second power lines VDL in the third direction (e.g., the Z-axis direction). In addition, the sensing connection holes SNCH may not overlap the light emitting units PEU1 (e.g., see FIG. 5) in the third direction (e.g., the Z-axis direction). Therefore, it is possible to prevent or substantially prevent the switching elements of the pixel driving units PDU, the scan lines SL, the data lines DL, the first power lines VSL, and the second power lines VDL from being stepped due to the sensing connection holes SNCH. Accordingly, it is possible to prevent or substantially prevent cracks from being generated in the switching elements of the pixel driving units PDU, the scan lines SL, the first power lines VSL, the data lines DL, and the second power lines VDL by the pressure applied when the circuit boards are attached.

In a pixel PX disposed at a left edge of the first display device 11, a data connection hole DCH or a sensing connection hole SNCH may be disposed on a right side of a pixel driving unit PDU. That is, the closer the data connection hole DCH or the sensing connection hole SNCH to the left edge of the first display device 11, the higher the probability of cracking of a second substrate SUB2. Therefore, the data connection hole DCH or the sensing connection hole SNCH may be disposed farther away from the left edge of the first display device 11 than the pixel driving unit PDU is from the left edge of the first display device 11. Accordingly, the probability of cracking of the second substrate SUB2 due to the data connection hole DCH or the sensing connection hole SNCH may be reduced.

In addition, in a pixel PX disposed at a right edge of the first display device 11, a data connection hole DCH or a sensing connection hole SNCH may be disposed on a left side of a pixel driving unit PDU. That is, the closer the data connection hole DCH or the sensing connection hole SNCH is to the right edge of the first display device 11, the higher the probability of cracking of the second substrate SUB2. Therefore, the data connection hole DCH or the sensing connection hole SNCH may be disposed farther away from the right edge of the first display device 11 than the pixel driving unit PDU is from the right edge of the first display device 11. Accordingly, the probability of cracking of the second substrate SUB2 due to the data connection hole DCH or the sensing connection hole SNCH may be reduced.

Figure 33:
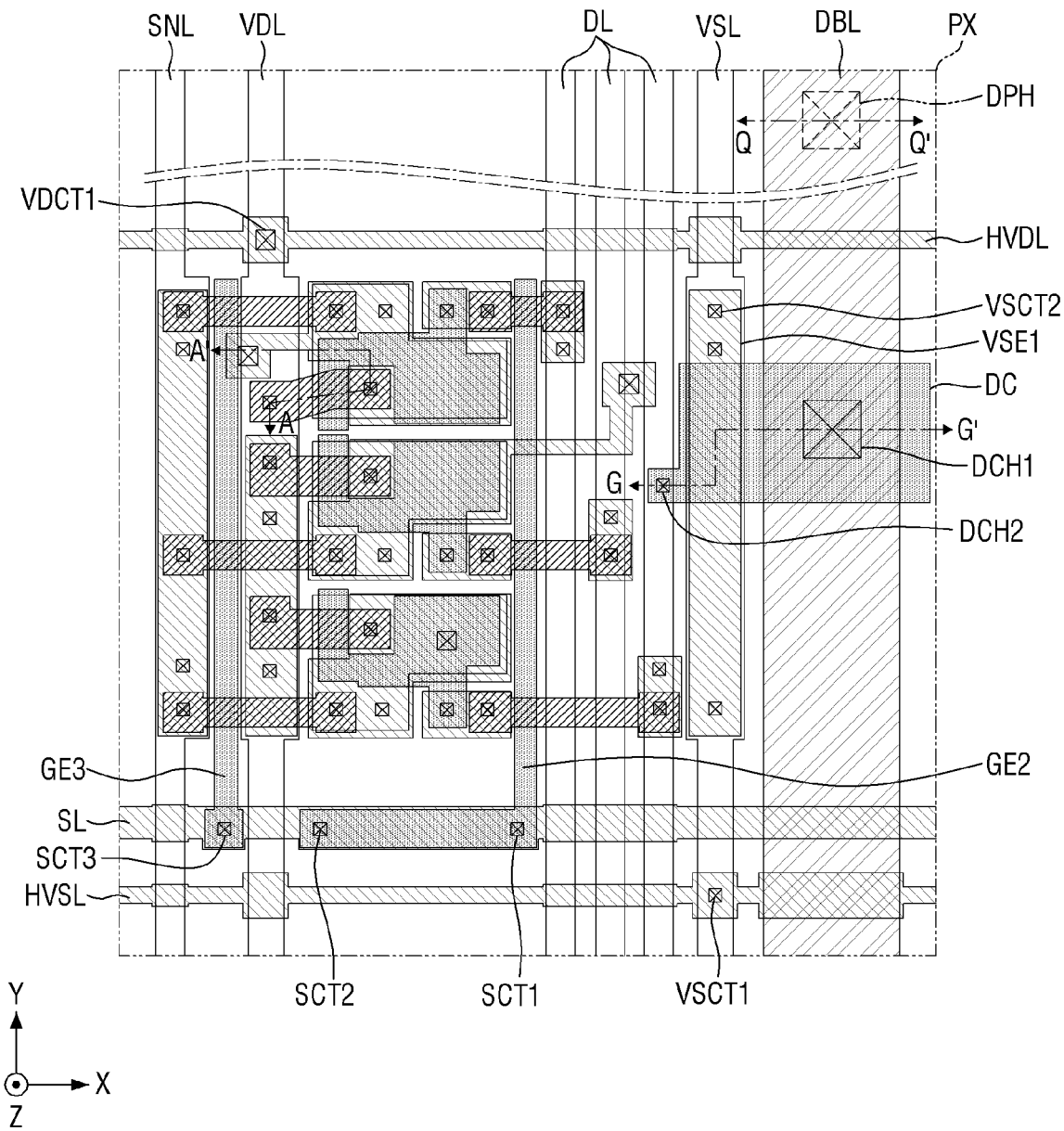
FIG. 33 is a layout view illustrating an example of a first pixel driving unit, a second pixel driving unit, a third pixel driving unit, a data connection hole, and a data pad hole of FIG. 32.

FIG. 33 is a layout view illustrating an example of a first pixel driving unit, a second pixel driving unit, and a third pixel driving unit, a data connection hole DCH, and a data pad hole DPH of FIG. 32.

The embodiment of FIG. 33 is different from the embodiment of FIG. 6 in that a data connection unit DC is connected to a data bottom line DBL through a first data connection hole DCH1, and the data bottom line DBL is disposed in a data pad hole DPH. With reference to FIG. 33, differences from the embodiment of FIG. 6 will be primarily described.

Referring to FIG. 33, the data connection unit DC may be connected to the data bottom line DBL through the first data connection hole DCH1 and may be connected to a data line DL through a second data connection hole DCH2. The first data connection hole DCH1 may not overlap pixel driving units PDU, a scan line SL, data lines DL, a sensing line SNL, a first power line VSL, and a second power line VDL. Therefore, it is possible to prevent or substantially prevent the pixel driving units PDU, the scan line SL, the data lines DL, the sensing line SNL, the first power line VSL, and the second power line VDL from being stepped due to the first data connection hole DCH1. Accordingly, it is possible to prevent or substantially prevent cracks from being generated in switching elements of the pixel driving units PDU, the scan line SL, the data lines DL, the sensing line SNL, the first power line VSL, and the second power line VDL by the pressure applied when circuit boards are attached.

The data connection unit DC may be disposed on the same layer and made of the same material as a first gate electrode GE1 of a first switching element ST1, a first electrode CE1 of a capacitor CST, a second gate electrode GE2 of a second switching element ST2, and a third gate electrode GE3 of a third switching element ST3. That is, the data connection unit DC may be made of a second metal layer.

In this case, a second power connection electrode VSE2 made of the second metal layer and a third power contact hole VSCT3 may be omitted. Therefore, the data connection unit DC may cross the first power line VSL and a first power connection electrode VSE1.

The data bottom line DBL may be connected to a bump of any one of a first source circuit board DCB1 (e.g., see FIG. 3A), a second source circuit board DCB2 (e.g., see FIG. 3A), and a third source circuit board DCB3 through the data pad hole DPH. An example of the first display device 11 taken along the line Q-Q' of FIG. 33 may be substantially the same as any one of FIGS. 12, 13, 15, 16, 18 and 19. Therefore, a redundant description of an example of the first display device 11 taken along the line Q-Q' of FIG. 33 may not be repeated.

Figure 34:
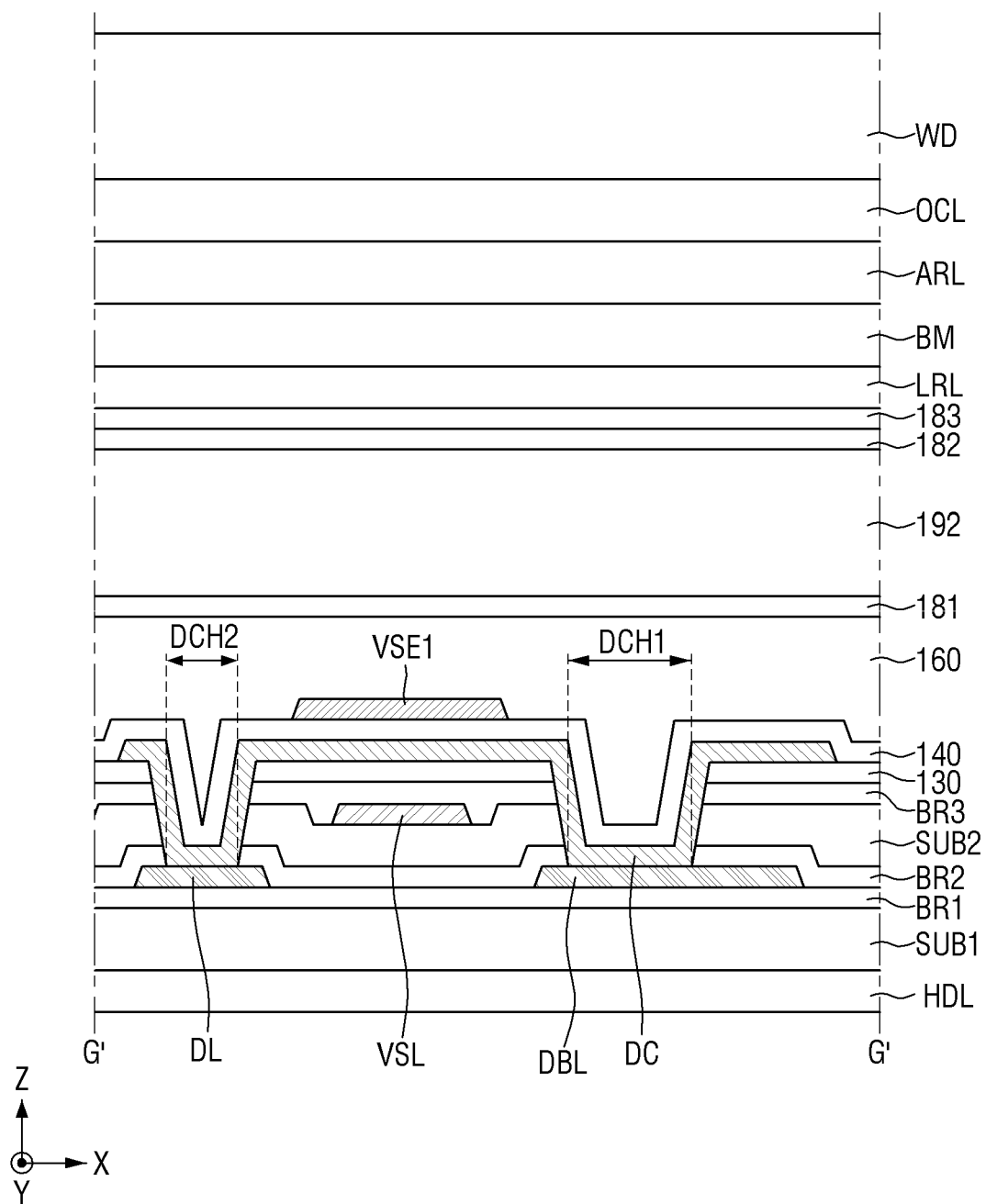
FIG. 34 is a cross-sectional view of an example of the first display device taken along the line G-G' of FIG. 33.

FIG. 34 is a cross-sectional view of an example of the first display device 11 taken along the line G-G' of FIG. 33.

Referring to FIG. 34, a data connection unit DC may be connected to a data bottom line DBL through a first data connection hole DCH1 penetrating a second barrier layer BR2, a second substrate SUB2, a third barrier layer BR3, and a gate insulating layer 130. In addition, the data connection unit DC may be connected to a data line DL through a second data connection hole DCH2 penetrating the second barrier layer BR2, the second substrate SUB2, the third barrier layer BR3, and the gate insulating layer 130. Therefore, the data line DL may be connected (e.g., electrically connected) to the data bottom line DBL.

Similar to FIG. 26, the data bottom line DBL may be disposed on the second substrate SUB2. In this case, the data connection unit DC may be connected to the data bottom line DBL through the first data connection hole DCH1 penetrating the second barrier layer BR2, the third barrier layer BR3, and the gate insulating layer 130.

Alternatively, similar to FIG. 27, the data bottom line DBL may be disposed on the second barrier layer BR2 disposed on the second substrate SUB2. In this case, the data connection unit DC may be connected to the data bottom line DBL through the first data connection hole DCH1 penetrating the third barrier layer BR3, a fourth barrier layer BR4, and the gate insulating layer 130.

Figure 35:
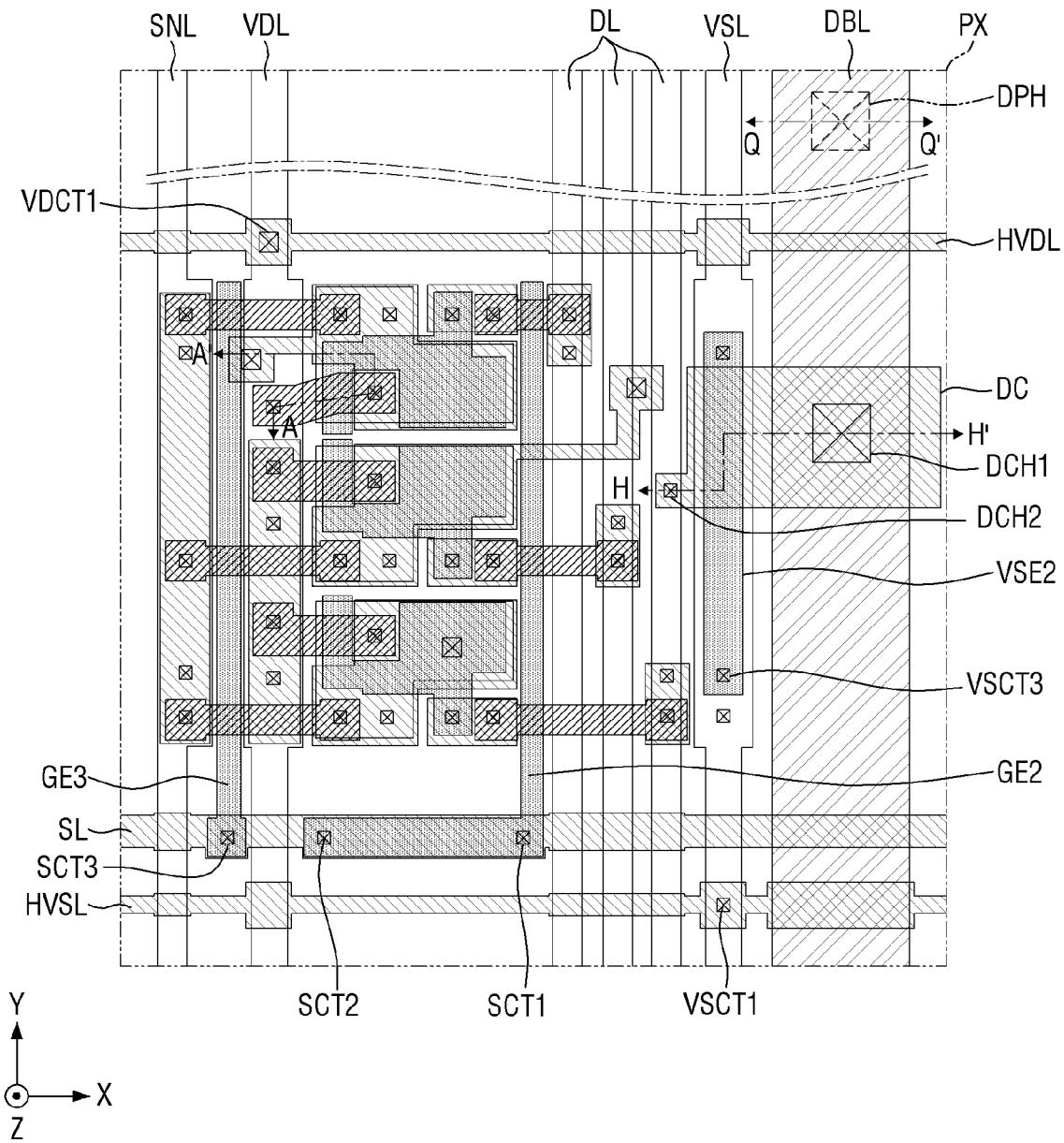
FIG. 35 is a layout view illustrating an example of a first pixel driving unit, a second pixel driving unit, a third pixel driving unit, a data connection hole, and a data pad hole of FIG. 32.

FIG. 35 is a layout view illustrating an example of a first pixel driving unit, a second pixel driving unit, a third pixel driving unit, a data connection hole DCH, and a data pad hole DPH of FIG. 32.

The embodiment of FIG. 35 is different from the embodiment of FIG. 33 in that a first power connection electrode VSE1 and a second power contact hole VSCT2 are omitted instead of a second power connection electrode VSE2 and a third power contact hole VSCT3. With reference to FIG. 35, differences from the embodiment of FIG. 33 will be primarily described.

Referring to FIG. 35, a data connection unit DC may be disposed on the same layer and made of the same material as an anode connection electrode ANDE, a first sub electrode CE21 of a second electrode CE2 of a capacitor CST, a first horizontal power line HVSL, a second horizontal power line HVDL, a scan line SL, a data connection electrode DCE, a connection electrode BE1, a third power connection electrode VDE, and a sensing connection electrode SNE. That is, the data connection unit DC may be made of a third metal layer.

In this case, the first power connection electrode VSE1 made of the third metal layer and the second power contact hole VSCT2 may be omitted. Therefore, the data connection unit DC may cross a first power line VSL and the second power connection electrode VSE2.

Figure 36:
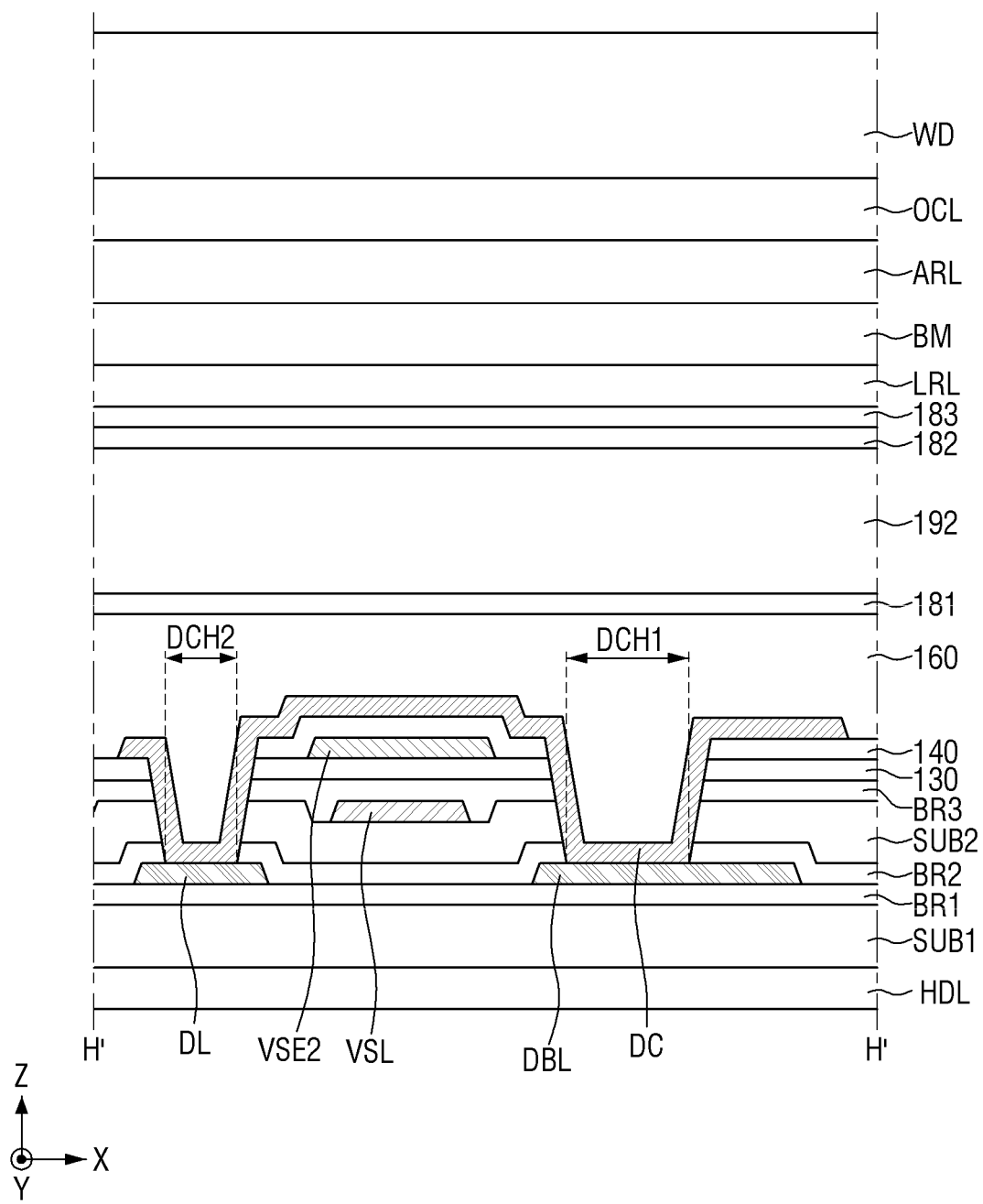
FIG. 36 is a cross-sectional view of an example of the first display device taken along the line H-H' of FIG. 35.

FIG. 36 is a cross-sectional view of an example of the first display device 11 taken along the line H-H' of FIG. 35.

Referring to FIG. 36, a data connection unit DC may be connected to a data bottom line DBL through a first data connection hole DCH1 penetrating a second barrier layer BR2, a second substrate SUB2, a third barrier layer BR3, a gate insulating layer 130, and an interlayer insulating film 140. In addition, the data connection unit DC may be connected to a data line DL through a second data connection hole DCH2 penetrating the second barrier layer BR2, the second substrate SUB2, the third barrier layer BR3, the gate insulating layer 130, and the interlayer insulating film 140. Therefore, the data line DL may be connected (e.g., electrically connected) to the data bottom line DBL.

Similar to FIG. 22, the data bottom line DBL may be disposed on the second substrate SUB2. In this case, the data connection unit DC may be connected to the data bottom line DBL through the first data connection hole DCH1 penetrating the second barrier layer BR2, the third barrier layer BR3, the gate insulating layer 130, and the interlayer insulating film 140.

Alternatively, similar to FIG. 23, the data bottom line DBL may be disposed on the second barrier layer BR2 disposed on the second substrate SUB2. In this case, the data connection unit DC may be connected to the data bottom line DBL through the first data connection hole DCH1 penetrating the third barrier layer BR3, a fourth barrier layer BR4, the gate insulating layer 130, and the interlayer insulating film 140.

Figure 37:
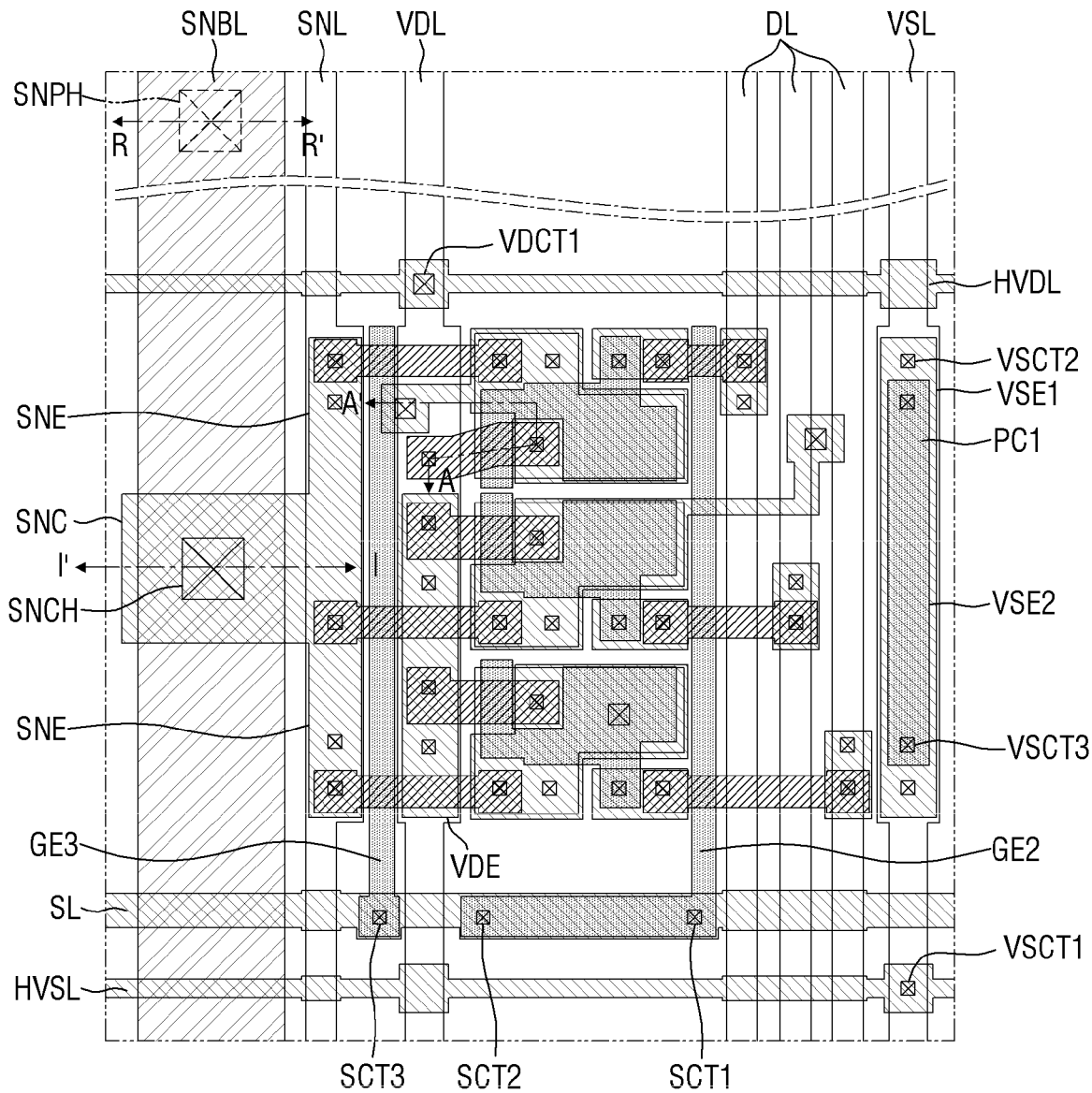
FIG. 37 is a layout view illustrating an example of a first pixel driving unit, a second pixel driving unit, a third pixel driving unit, a sensing connection hole, and a sensing pad hole of FIG. 32.

FIG. 37 is a layout view illustrating an example of a first pixel driving unit, a second pixel driving unit, a third pixel driving unit, a sensing connection hole SNCH, and a sensing pad hole SNPH of FIG. 32.

The embodiment of FIG. 37 is different from the embodiment of FIG. 6 in that a sensing connection unit SNC is connected to a sensing bottom line SNBL through a sensing connection hole SNCH, and the sensing bottom line SNBL is disposed in a sensing pad hole SNPH. With reference to FIG. 37, differences from the embodiment of FIG. 6 will be primarily described.

Referring to FIG. 37, the sensing connection unit SNC may protrude from a sensing connection electrode SNE. For example, the sensing connection unit SNC may extend from the sensing connection electrode SNE in the first direction (e.g., the X-axis direction). The sensing connection unit SNC and the sensing connection electrode SNE may be integrally formed. The sensing connection unit SNC may be connected to the sensing bottom line SNBL through the sensing connection hole SNCH.

The sensing connection hole SNCH may not overlap pixel driving units PDU, a scan line SL, data lines DL, a sensing line SNL, a first power line VSL, and a second power line VDL. Therefore, it is possible to prevent or substantially prevent the pixel driving units PDU, the scan line SL, the data lines DL, the sensing line SNL, the first power line VSL, and the second power line VDL from being stepped due to the sensing connection hole SNCH. Accordingly, it is possible to prevent or substantially prevent cracks from being generated in switching elements of the pixel driving units PDU, the scan line SL, the data lines DL, the sensing line SNL, the first power line VSL, and the second power line VDL by the pressure applied when circuit boards are attached.

The sensing bottom line SNBL may be connected to a bump of any one of a first source circuit board DCB1 (e.g., see FIG. 3A), a second source circuit board DCB2 (e.g., see FIG. 3A), and a third source circuit board DCB3 through the sensing pad hole SNPH. An example of the first display device 11 taken along the line R-R' of FIG. 37 may be substantially the same as any one of FIGS. 12, 13, 15, 16, 18 and 19. Therefore, a redundant description of an example of the first display device 11 taken along the line R-R' of FIG. 37 may not be repeated.

Figure 38:
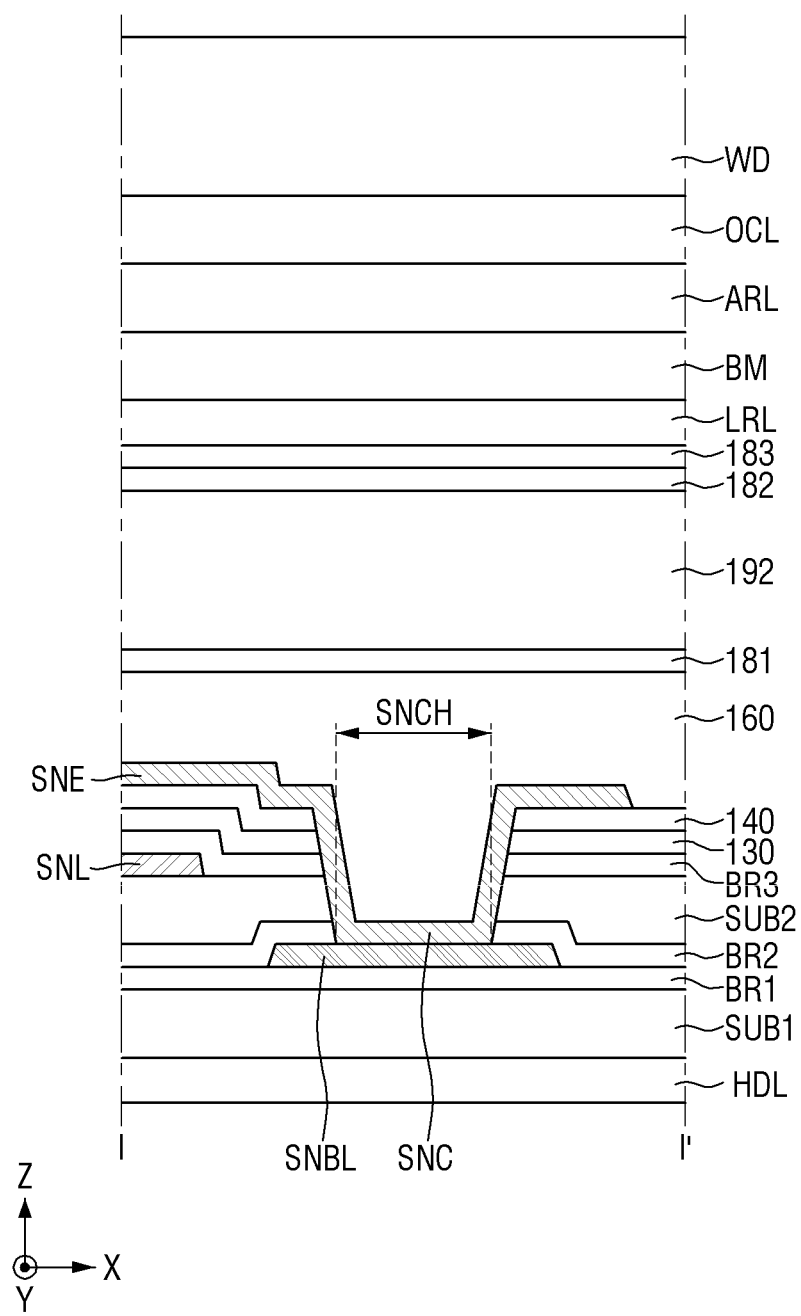
FIG. 38 is a cross-sectional view of an example of the first display device taken along the line I-I' of FIG. 37.

FIG. 38 is a cross-sectional view of an example of the first display device 11 taken along the line I-I' of FIG. 37.

Referring to FIG. 38, a sensing connection unit SNC may protrude from a sensing connection electrode SNE. The sensing connection unit SNC and the sensing connection electrode SNE may be integrally formed. The sensing connection unit SNC may be connected to a sensing bottom line SNBL through a sensing connection hole SNCH penetrating a second barrier layer BR2, a second substrate SUB2, a third barrier layer BR3, a gate insulating layer 130, and an interlayer insulating film 140.

Similar to FIG. 30, the sensing bottom line SNBL may be disposed on the second substrate SUB2. In this case, the sensing connection unit SNC may be connected to the sensing bottom line SNBL through the sensing connection hole SNCH penetrating the second barrier layer BR2, the third barrier layer BR3, the gate insulating layer 130, and the interlayer insulating film 140.

Alternatively, similar to FIG. 31, the sensing bottom line SNBL may be disposed on the second barrier layer BR2 disposed on the second substrate SUB2. In this case, the sensing connection unit SNC may be connected to the sensing bottom line SNBL through the sensing connection hole SNCH penetrating the third barrier layer BR3, a fourth barrier layer BR4, the gate insulating layer 130, and the interlayer insulating film 140.

Figure 39:
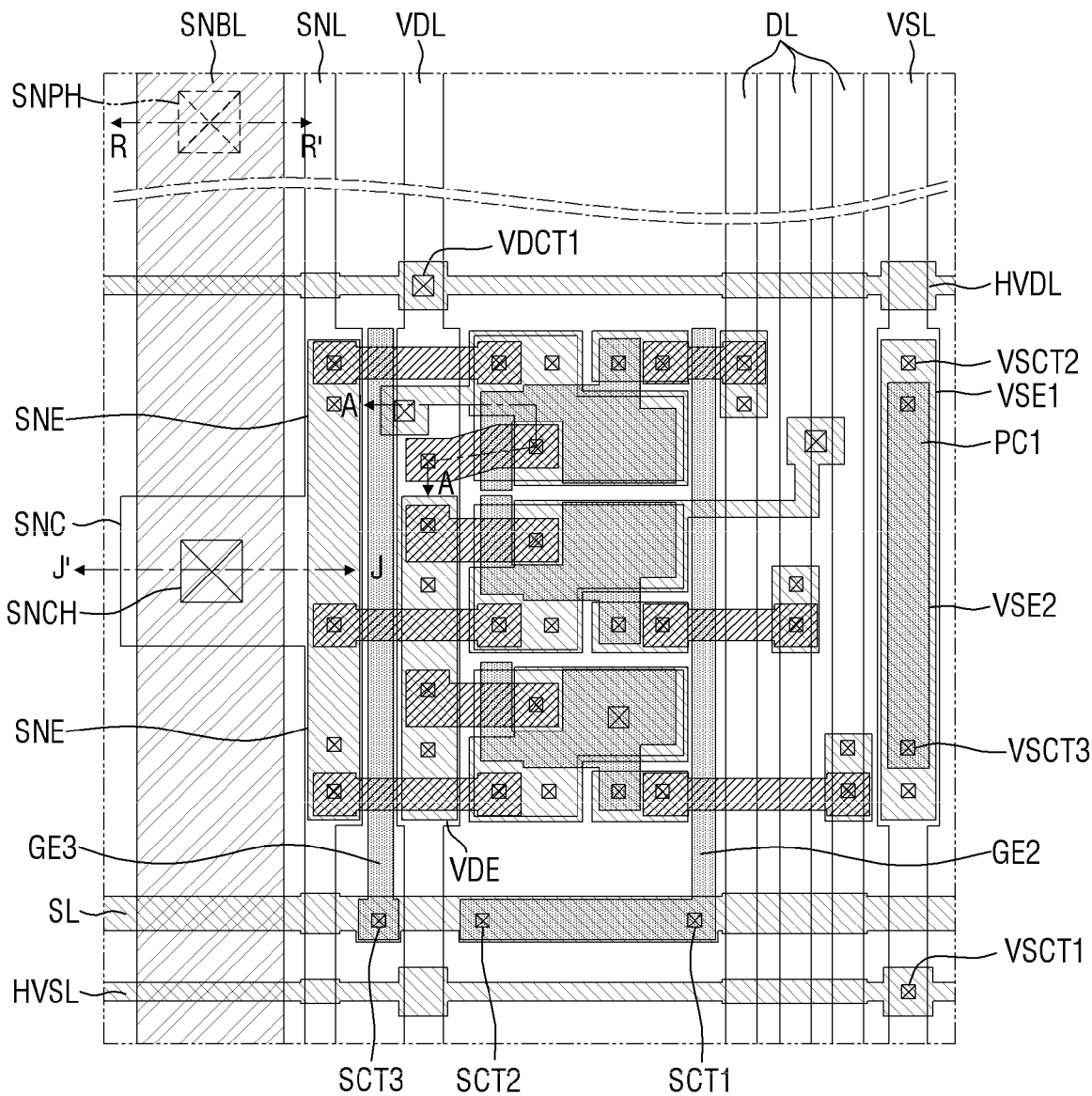
FIG. 39 is a layout view illustrating an example of a first pixel driving unit, a second pixel driving unit, a third pixel driving unit, a sensing connection hole, and a sensing pad hole of FIG. 32.

FIG. 39 is a layout view illustrating an example of a first pixel driving unit, a second pixel driving unit, a third pixel driving unit, a sensing connection hole SNCH, and a sensing pad hole SNPH of FIG. 32.

The embodiment of FIG. 39 is different from the embodiment of FIG. 37 in that a sensing connection unit SNC protrudes not from a sensing connection electrode SNE but from a sensing line SNL. With reference to FIG. 39, differences from the embodiment of FIG. 37 will be primarily described.

Referring to FIG. 39, the sensing connection unit SNC may extend from the sensing line SNL in the first direction (e.g., the X-axis direction). The sensing connection unit SNC and the sensing line SNL may be integrally formed. The sensing connection unit SNC may be connected to a sensing bottom line SNBL through a sensing connection hole SNCH.

Figure 40:
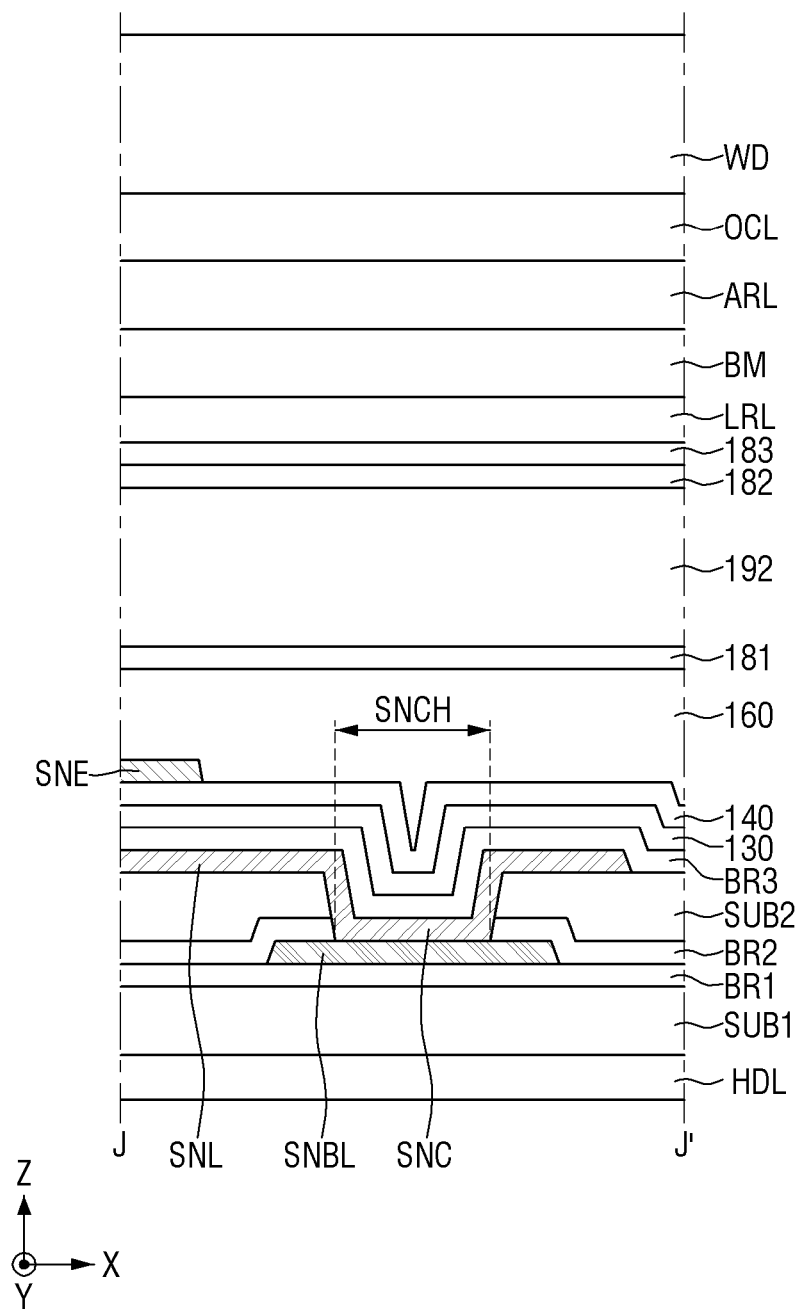
FIG. 40 is a cross-sectional view of an example of the first display device taken along the line J-J' of FIG. 39.

FIG. 40 is a cross-sectional view of an example of the first display device 11 taken along the line J-J' of FIG. 39.

Referring to FIG. 40, a sensing connection unit SNC may extend from a sensing line SNL. The sensing connection unit SNC and the sensing line SNL may be integrally formed. The sensing connection unit SNC may be connected to a sensing bottom line SNBL through a sensing connection hole SNCH penetrating a second barrier layer BR2 and a second substrate SUB2.

The sensing bottom line SNBL may be disposed on the second substrate SUB2. In this case, the sensing connection unit SNC may be connected to the sensing bottom line SNBL through the sensing connection hole SNCH penetrating the second barrier layer BR2.

Alternatively, the sensing bottom line SNBL may be disposed on the second barrier layer BR2 disposed on the second substrate SUB2. In this case, the sensing connection unit SNC may be connected to the sensing bottom line SNBL through the sensing connection hole SNCH penetrating a third barrier layer BR3.

Figure 41:
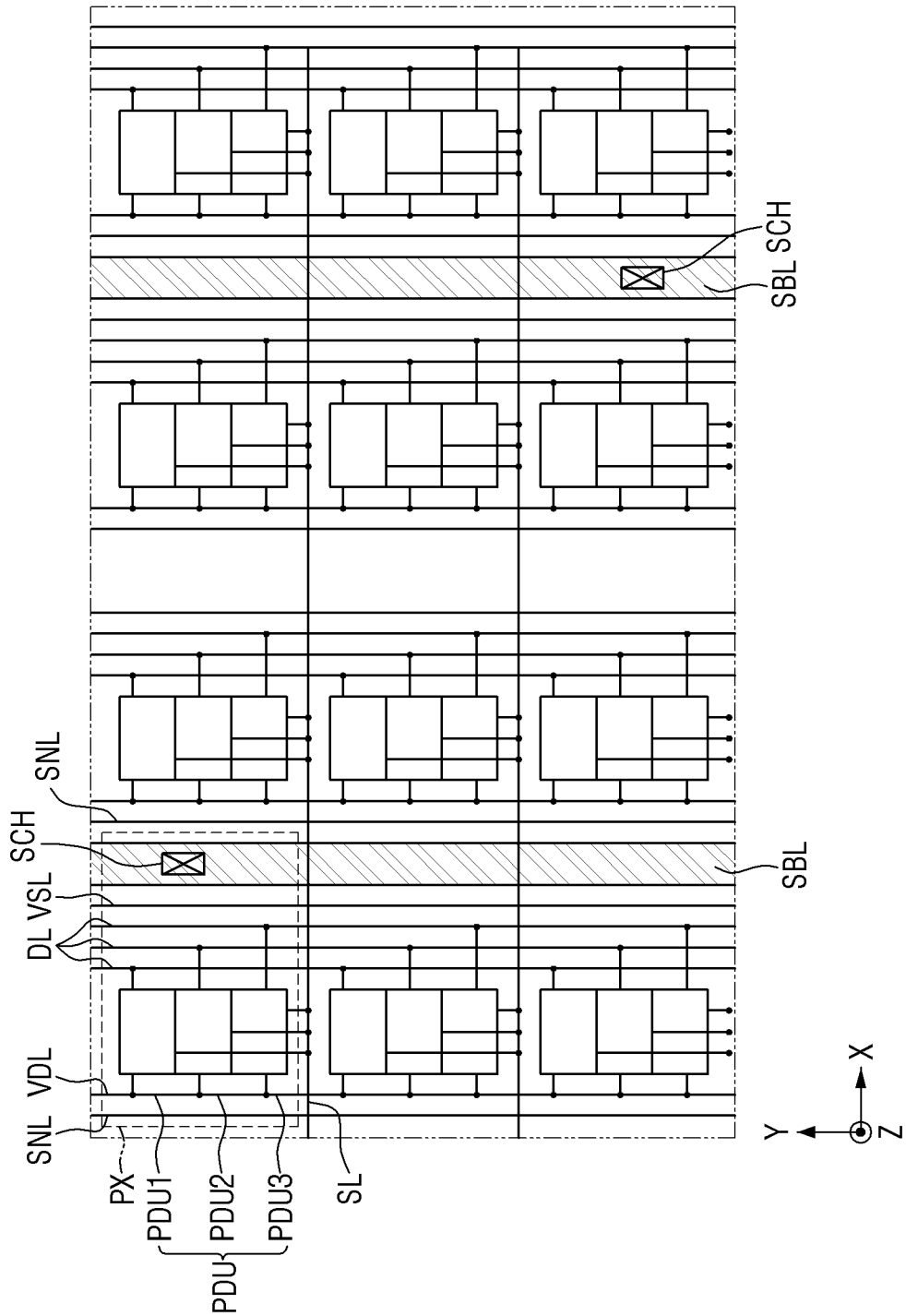
FIG. 41 is a layout view illustrating subpixels of a first display device according to one or more embodiments of the present disclosure.

FIG. 41 is a layout view illustrating subpixels of a first display device 11 according to one or more embodiments of the present disclosure.

The embodiment of FIG. 41 is different from the embodiment of FIG. 4 in that scan bottom lines SBL and scan connection holes SCH are disposed instead of a first power bottom line VSBL, first power connection holes PCH1, a second power bottom line VDBL, and second power connection holes PCH2. With reference to FIG. 41, differences from the embodiment of FIG. 4 will be primarily described.

Referring to FIG. 41, the scan bottom lines SBL may extend in the second direction (e.g., the Y-axis direction).

The scan bottom lines SBL may not overlap pixel driving units PDU, first power lines VSL, second power lines VDL, sensing lines SNL, and data lines DL.

A scan bottom line SBL may be disposed between the first power line VSL of any one pixel PX and the sensing line SNL of another pixel PX neighboring the pixel PX in the first direction (e.g., the X-axis direction). The scan bottom line SBL may overlap a scan connection hole SCH. The scan bottom line SBL may be connected (e.g., electrically connected) to a scan line SL through the scan connection hole SCH.

Each of the scan connection holes SCH may be a hole for connecting (e.g., electrically connecting) a corresponding scan line SL to a scan bottom line SBL. Because the scan connection holes SCH are deep, their size may be large. When a scan connection hole SCH overlaps switching elements of a pixel driving unit PDU, a scan line SL, a data line DL, a sensing line SNL, a first power line VSL, and a second power line VDL in the third direction (e.g., the Z-axis direction), a step height of the switching elements of the pixel driving unit PDU, the scan line SL, the data line DL, the sensing line SNL, the first power line VSL, and the second power line VDL may be large due to the scan connection hole SCH.

As described with reference to FIGS. 2, 3A and 3B, a scan circuit board SCB, a first source circuit board DCB1, a second source circuit board DCB2, and/or a third source circuit board DCB3 may be attached to a rear surface of the first display device 11. When a step height of switching elements of a pixel driving unit PDU, a scan line SL, a data line DL, a sensing line SNL, a first power line VSL, or a second power line VDL is large due to a scan connection hole SCH, cracks may be generated in the switching elements of the pixel driving unit PDU, the scan line SL, the data line DL, the sensing line SNL, the first power line VSL, or the second power line VDL by the pressure applied when the circuit boards are attached.

Therefore, the scan connection holes SCH may not overlap the pixel driving units PDU in the third direction (e.g., the Z-axis direction). In addition, the scan connection holes SCH may not overlap the scan lines SL, the data lines DL, the sensing lines SNL, the first power lines VSL, and the second power lines VDL in the third direction (e.g., the Z-axis direction). In addition, the scan connection holes SCH may not overlap light emitting units PEU1 (e.g., see FIG. 5) in the third direction (e.g., the Z-axis direction). Therefore, it is possible to prevent or substantially prevent the switching elements of the pixel driving units PDU, the scan lines SL, the data lines DL, the sensing lines SNL, the first power lines VSL, and the second power lines VDL from being stepped due to the scan connection holes SCH. Accordingly, it is possible to prevent or substantially prevent cracks from being generated in the switching elements of the pixel driving units PDU, the scan lines SL, the first power lines VSL, the data lines DL, the sensing lines SNL, and the second power lines VDL by the pressure applied when the circuit boards are attached.

In a pixel PX disposed at a left edge of the first display device 11, a scan connection hole SCH may be disposed on a right side of a pixel driving unit PDU. That is, the closer the scan connection hole SCH to the left edge of the first display device 11, the higher the probability of cracking of a second substrate SUB2. Therefore, the scan connection hole SCH may be disposed farther away from the left edge of the first display device 11 than the pixel driving unit PDU is from the left edge of the first display device 11. Accordingly, the probability of cracking of the second substrate SUB2 due to the scan connection hole SCH may be reduced.

In addition, in a pixel PX disposed at a right edge of the first display device 11, a scan connection hole SCH may be disposed on a left side of a pixel driving unit PDU. That is, the closer the scan connection hole SCH to the right edge of the first display device 11, the higher the probability of cracking of the second substrate SUB2. Therefore, the scan connection hole SCH may be disposed farther away from the right edge of the first display device 11 than the pixel driving unit PDU is from the right edge of the first display device 11. Accordingly, the probability of cracking of the second substrate SUB2 due to the scan connection hole SCH may be reduced.

Figure 42:
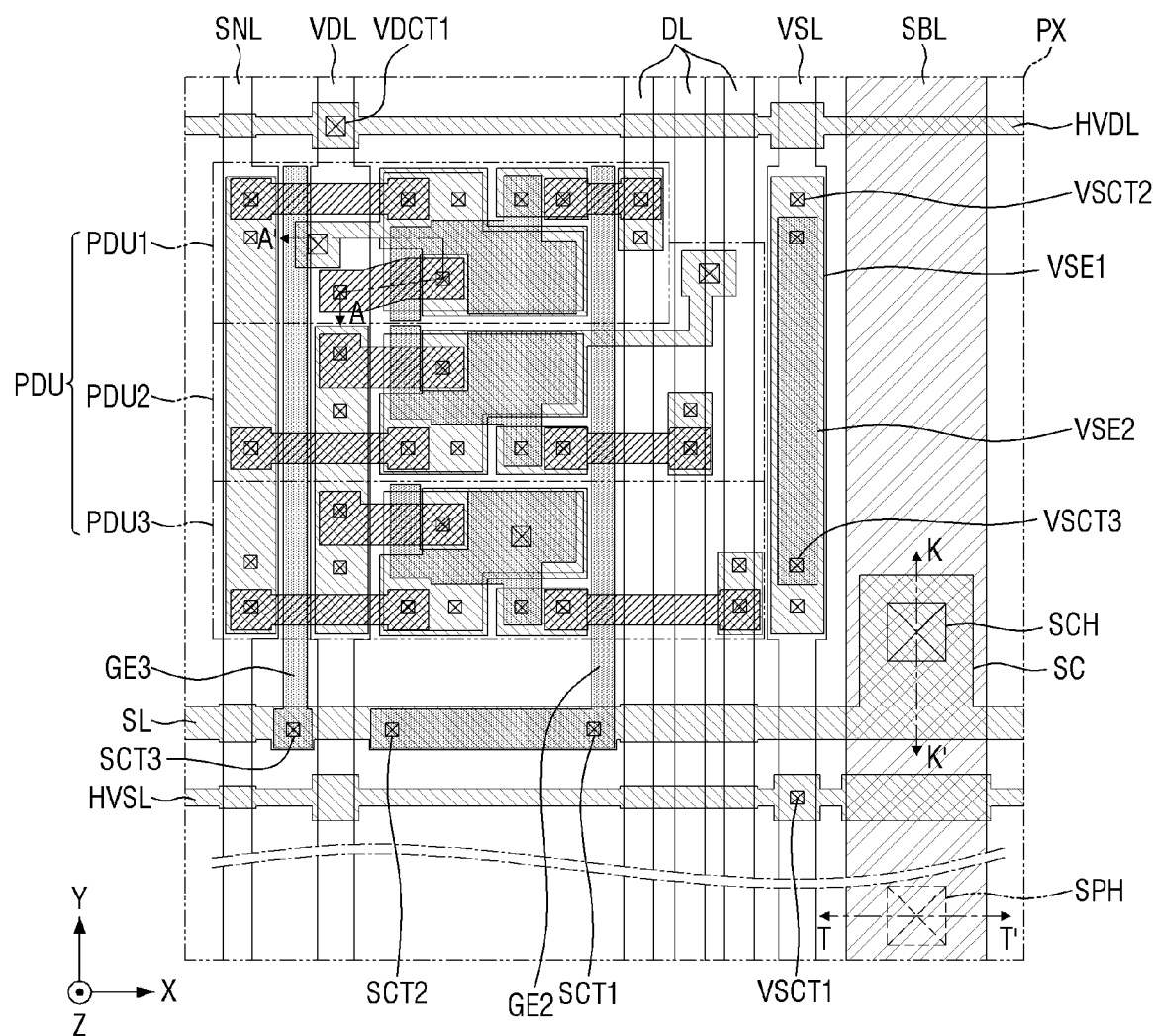
FIG. 42 is a layout view illustrating an example of a first pixel driving unit, a second pixel driving unit, a third pixel driving unit, a scan connection hole, and a scan pad hole of FIG. 41.

FIG. 42 is a layout view illustrating an example of a first pixel driving unit, a second pixel driving unit, a third pixel driving unit, a scan connection hole SCH, and a scan pad hole SPH of FIG. 41.

The embodiment of FIG. 42 is different from the embodiment of FIG. 6 in that a scan connection unit SC is connected to a scan bottom line SBL through a scan connection hole SCH, and the scan bottom line SBL is disposed in a scan pad hole SPH. With reference to FIG. 42, differences from the embodiment of FIG. 6 will be primarily described.

Referring to FIG. 42, the scan connection unit SC may protrude from a scan line SL. For example, the scan connection unit SC may extend from the scan line SL in the second direction (e.g., the Y-axis direction). The scan connection unit SC and the scan line SL may be integrally formed. The scan connection unit SC may be connected to the scan bottom line SBL through the scan connection hole SCH.

The scan connection hole SCH may not overlap pixel driving units PDU, the scan line SL, data lines DL, a sensing line SNL, a first power line VSL, and a second power line VDL. Therefore, it is possible to prevent or substantially prevent the pixel driving units PDU, the scan line SL, the data lines DL, the sensing line SNL, the first power line VSL, and the second power line VDL from being stepped due to the scan connection hole SCH. Accordingly, it is possible to prevent or substantially prevent cracks from being generated in switching elements of the pixel driving units PDU, the scan line SL, the data lines DL, the sensing line SNL, the first power line VSL, and the second power line VDL by the pressure applied when circuit boards are attached.

The scan bottom line SBL may be connected to a bump of any one of a first source circuit board DCB1 (e.g., see FIG. 3A), a second source circuit board DCB2 (e.g., see FIG. 3A), and a third source circuit board DCB3 through the scan pad hole SPH. An example of the first display device 11 taken along the line T-T' of FIG. 42 may be substantially the same as any one of FIGS. 12, 13, 15, 16, 18 and 19. Therefore, a redundant description of an example of the first display device 11 taken along the line T-T' of FIG. 42 may not be repeated.

Figure 43:
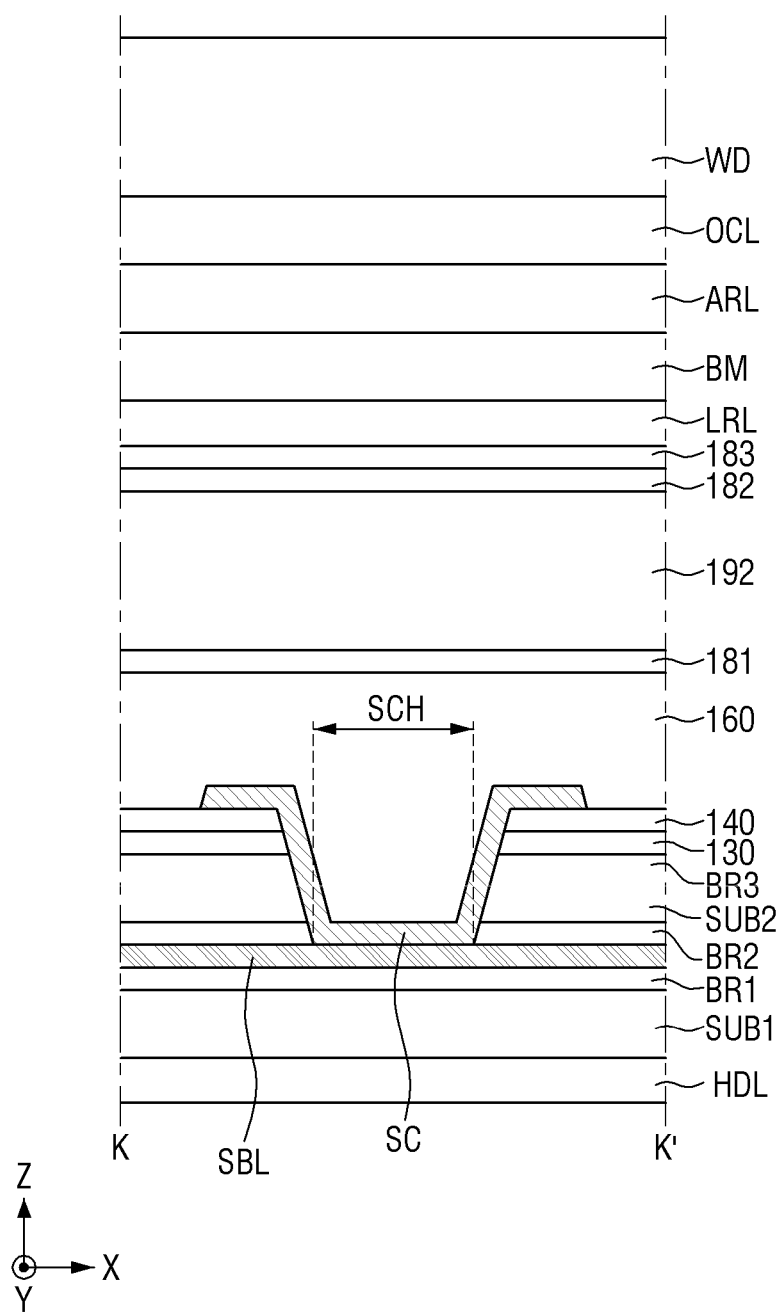
FIG. 43 is a cross-sectional view of an example of the first display device taken along the line K-K' of FIG. 42.

FIG. 43 is a cross-sectional view of an example of the first display device 11 taken along the line K-K' of FIG. 42.

Referring to FIG. 43, a scan connection unit SC may protrude from a scan line SL. The scan connection unit SC and the scan line SL may be integrally formed. The scan connection unit SC may be connected to a scan bottom line SBL through a scan connection hole SCH penetrating a second barrier layer BR2, a second substrate SUB2, a third barrier layer BR3, a gate insulating layer 130, and an interlayer insulating film 140.

The scan bottom line SBL may be disposed on the second substrate SUB2.

In this case, the scan connection unit SC may be connected to the scan bottom line SBL through the scan connection hole SCH penetrating the second barrier layer BR2, the third barrier layer BR3, the gate insulating layer 130, and the interlayer insulating film 140.

Alternatively, the scan bottom line SBL may be disposed on the second barrier layer BR2 disposed on the second substrate SUB2. In this case, the scan connection unit SC may be connected to the scan bottom line SBL through the scan connection hole SCH penetrating the third barrier layer BR3, a fourth barrier layer BR4, the gate insulating layer 130, and the interlayer insulating film 140.

Figure 44:
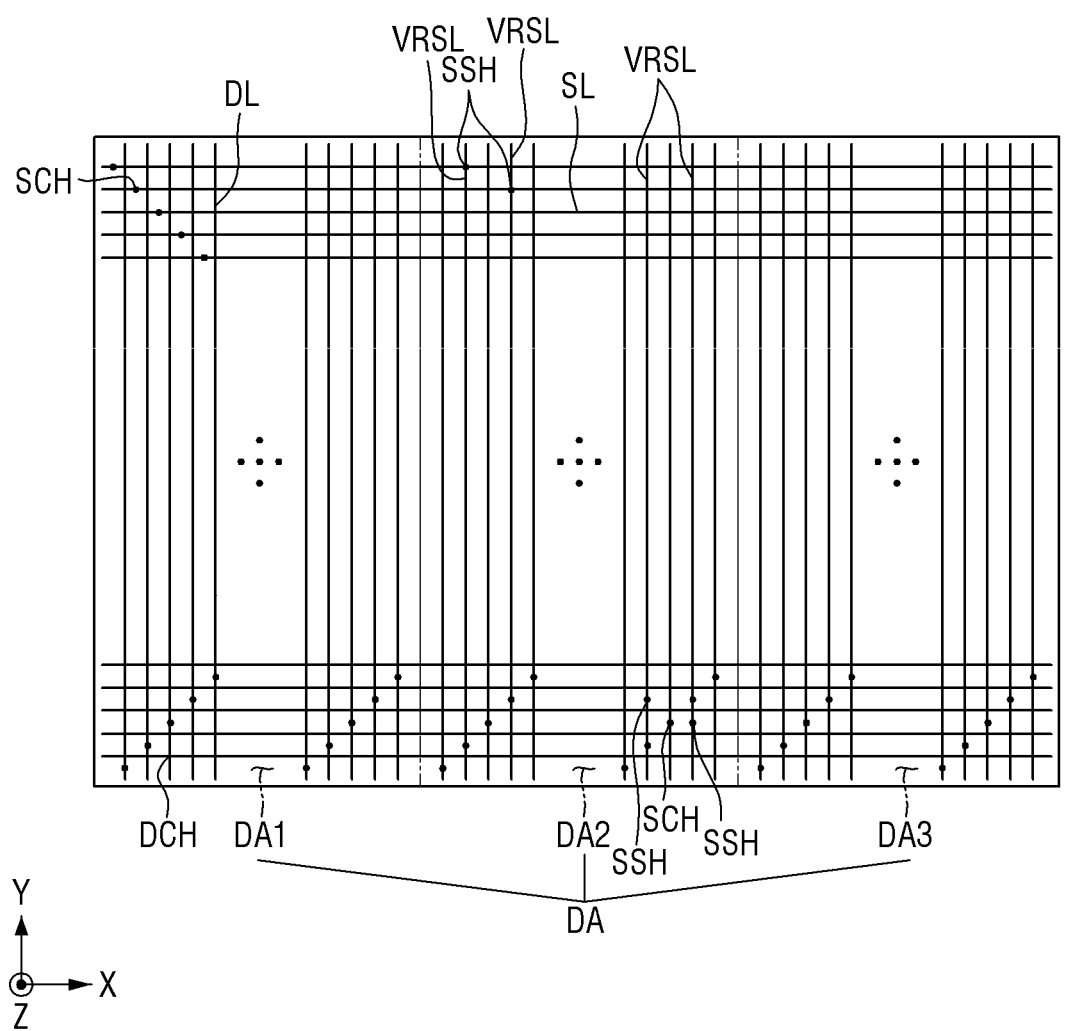
FIG. 44 is a plan view of a first display device according to one or more embodiments of the present disclosure.

FIG. 44 is a plan view of a first display device 11 according to one or more embodiments of the present disclosure.

The embodiment of FIG. 44 is different from the embodiment of FIG. 2 in that the first display device 11 according to one or more embodiments of the present disclosure includes vertical scan lines VRSL. With reference to FIG. 44, differences from the embodiment of FIG. 2 will be primarily described.

Referring to FIG. 44, the vertical scan lines VRSL may extend in the second direction (e.g., the Y-axis direction) and may be disposed in or along the first direction (e.g., the X-axis direction). The vertical scan lines VRSL may be disposed parallel to data lines DL. The vertical scan lines VRSL may be disposed in at least one of a first display area DA1, a second display area DA2, and/or a third display area DA3. In FIG. 44, the vertical scan lines VRSL are disposed only in the second display area DA2. In this case, instead of the vertical scan lines VRSL, off-voltage lines that form capacitance with pixel electrodes 171 of pixels PX may be disposed in the first display area DA1 and the third display area DA3. Due to the off-voltage lines, it is possible to prevent or substantially prevent the voltage of the pixel electrodes 171 of the pixels PX from being fluctuated by noise.

Each of the vertical scan lines VRSL may be connected to a corresponding scan bottom line SBL (e.g., see FIG. 45) through a corresponding scan connection hole SCH in the second display area DA2. That is, the vertical scan lines VRSL may correspond one-to-one to the scan connection holes SCH.

Each of the vertical scan lines VRSL may be connected to a corresponding scan line SL through a corresponding scan hole SSH in the second display area DA2. That is, the vertical scan lines VRSL may correspond one-to-one to the scan holes SSH.

Figure 45:
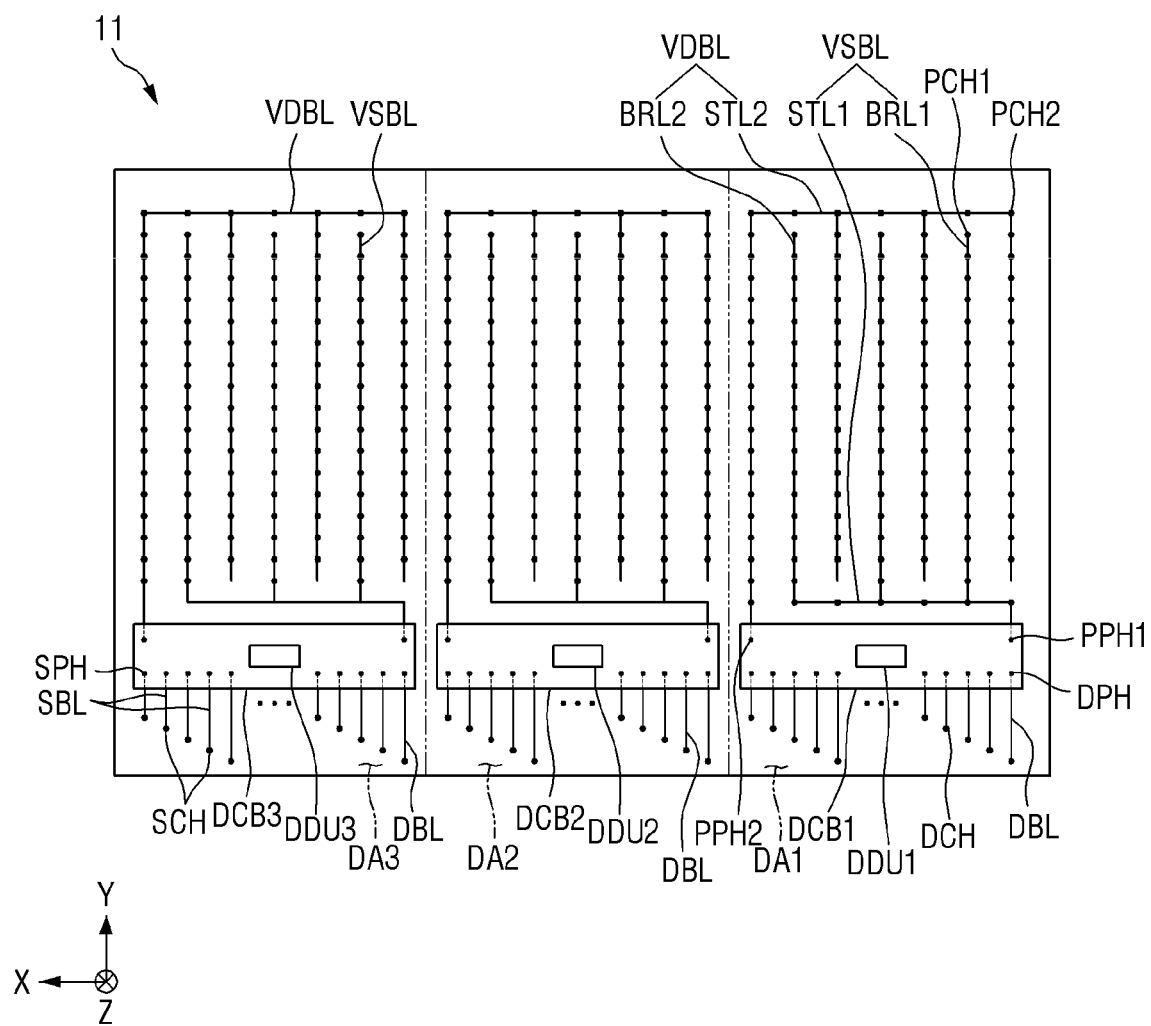
FIG. 45 is a bottom view of the first display device according to one or more embodiments of the present disclosure.

FIG. 45 is a bottom view of the first display device 11 according to one or more embodiments of the present disclosure.

The embodiment of FIG. 45 is different from the embodiment of FIG. 3 in that a scan circuit board SCB is omitted. With reference to FIG. 45, differences from the embodiment of FIG. 3 will be primarily described.

Referring to FIG. 45, each of the scan bottom lines SBL may be connected to a corresponding scan line SL (e.g., see FIG. 44) through a corresponding scan connection hole SCH. That is, the scan bottom lines SBL may correspond one-to-one to the scan connection holes SCH. Each of the scan bottom lines SBL may be connected to a bump of a second source circuit board DCB2 through a corresponding scan pad hole SPH. That is, the scan bottom lines SBL may correspond one-to-one to the bumps of the second source circuit board DCB2.

Accordingly, the scan lines SL may be connected (e.g., electrically connected) to the bumps of the second source circuit board DCB2 through the scan holes SSH, the vertical scan lines VRSL, the scan connection holes SCH, and the scan bottom lines SBL. Therefore, scan signals of a second source driving unit DDU2 of the second source circuit board DCB2 may be transmitted to the scan lines SL through the scan bottom lines SBL, the scan connection holes SCH, the vertical scan lines VRSL, and the scan holes SSH.

As illustrated in FIGS. 44 and 45, even if the scan circuit board SCB and a scan driving unit SDU are omitted, because the scan lines SL are connected (e.g., electrically connected) to the bumps of the second source circuit board DCB2 through the scan holes SSH, the vertical scan lines VRSL, the scan connection holes SCH, and the scan bottom lines SBL, the scan lines SL may receive scan signals from the second source circuit board DCB2. Therefore, manufacturing cost may be reduced due to the omission of the scan circuit board SCB and the scan driving unit SDU.

Figure 46:
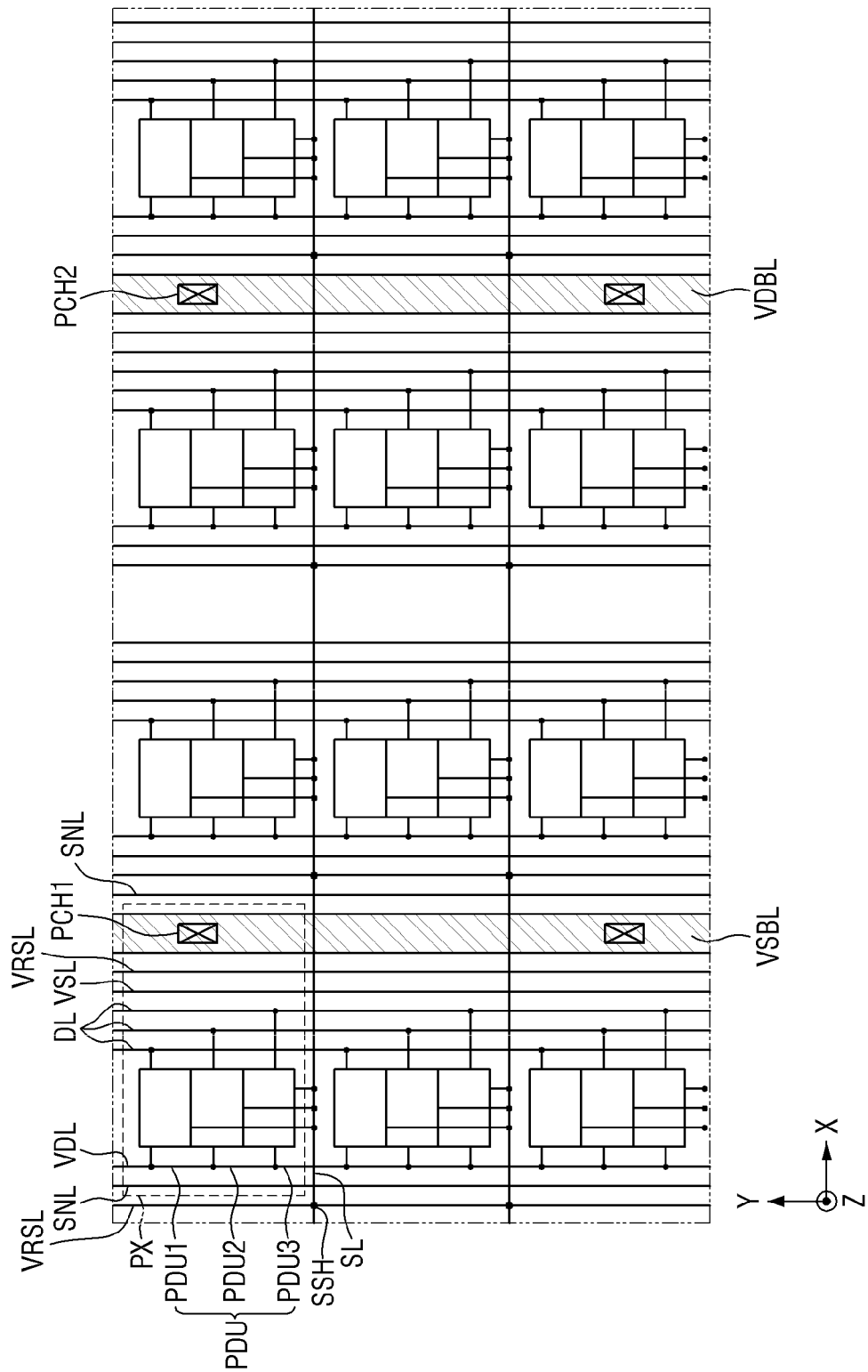
FIG. 46 is a layout view illustrating subpixels of the first display device according to one or more embodiments of the present disclosure.

FIG. 46 is a layout view illustrating subpixels of the first display device 11 according to one or more embodiments of the present disclosure.

The embodiment of FIG. 46 is different from the embodiment of FIG. 4 in that the vertical scan lines VRSL are added. With reference to FIG. 46, differences from the embodiment of FIG. 4 will be primarily described.

Referring to FIG. 46, the vertical scan lines VRSL may be connected to the scan lines SL through the scan holes SSH. Therefore, scan signals of the vertical scan lines VRSL may be supplied to the scan lines SL.

A vertical scan line VRSL may be disposed between a first power line VSL and first power connection holes PCH1. In addition, the vertical scan line VRSL may be disposed between a sensing line SNL and the first power connection holes PCH1.

A vertical scan line VRSL may be disposed between a first power line VSL and second power connection holes PCH2. In addition, the vertical scan line VRSL may be disposed between a sensing line SNL and the second power connection holes PCH2.

When the first power connection holes PCH1 and the second power connection holes PCH2 are not disposed between the first power lines VSL and the sensing lines SNL, the vertical scan lines VRSL may be disposed between the first power lines VSL and the sensing lines SNL.

Figure 47:
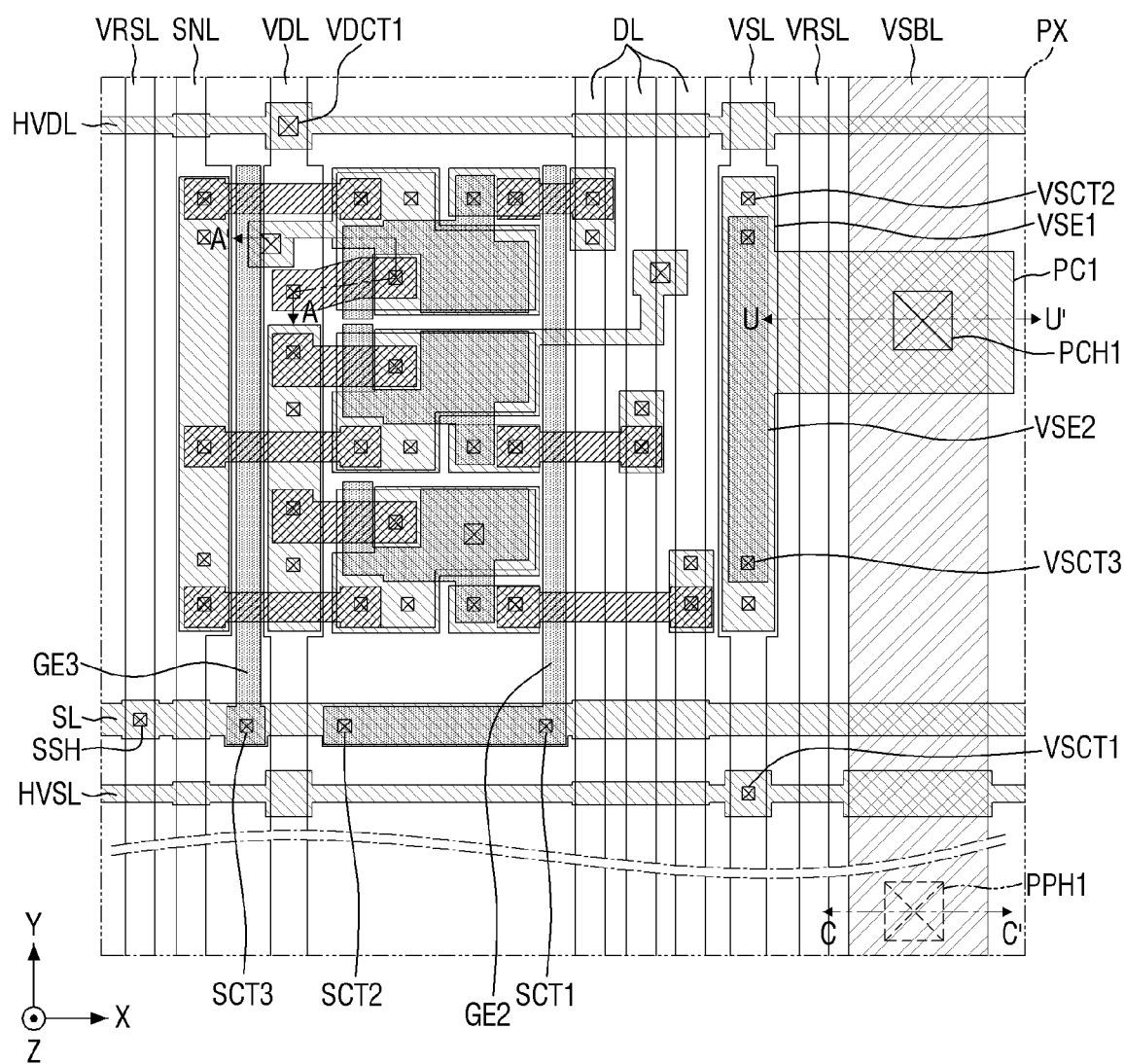
FIG. 47 is a layout view illustrating an example of a first pixel driving unit, a second pixel driving unit, a third pixel driving unit, a first power connection hole, and a first power pad hole of FIG. 46.

FIG. 47 is a layout view illustrating an example of a first pixel driving unit, a second pixel driving unit, a third pixel driving unit, a first power connection hole PCH1, and a first power pad hole of FIG. 46.

The embodiment of FIG. 47 is different from the embodiment of FIG. 20 in that vertical scan lines VRSL are added. With reference to FIG. 47, differences from the embodiment of FIG. 20 will be primarily described.

Referring to FIG. 47, a vertical scan line VRSL may be disposed between a first power line VSL and a first power connection hole PCH1. A first power connection unit PC1 and a first power connection electrode VSE1 may be integrally formed. Because the first power connection unit PC1 is disposed on or at a different layer from the vertical scan line VRSL, it may be connected to a first power bottom line VSBL through the first power connection hole PCH1 across the vertical scan line VRSL.

An example of the first display device 11 taken along the line U-U' of FIG. 47 may be substantially the same as any one of FIGS. 21, 22, and 23 except that the vertical scan line VRSL is disposed between the first power line VSL and the first power connection hole PCH1 and overlaps the first power connection unit PC1 in the third direction (e.g., the Z-axis direction).

For example, similar to FIG. 21, the first power connection unit PC1 may be connected to the first power bottom line VSBL through the first power connection hole PCH1 penetrating a second barrier layer BR2, a second substrate SUB2, a third barrier layer BR3, a gate insulating layer 130, and an interlayer insulating film 140.

Alternatively, similar to FIG. 22, the first power connection unit PC1 may be connected to the first power bottom line VSBL through the first power connection hole PCH1 penetrating the second barrier layer BR2, the third barrier layer BR3, the gate insulating layer 130, and the interlayer insulating film 140.

Alternatively, similar to FIG. 23, the first power connection unit PC1 may be connected to the first power bottom line VSBL through the first power connection hole PCH1 penetrating the third barrier layer BR3, a fourth barrier layer BR4, the gate insulating layer 130, and the interlayer insulating film 140.

Figure 48:
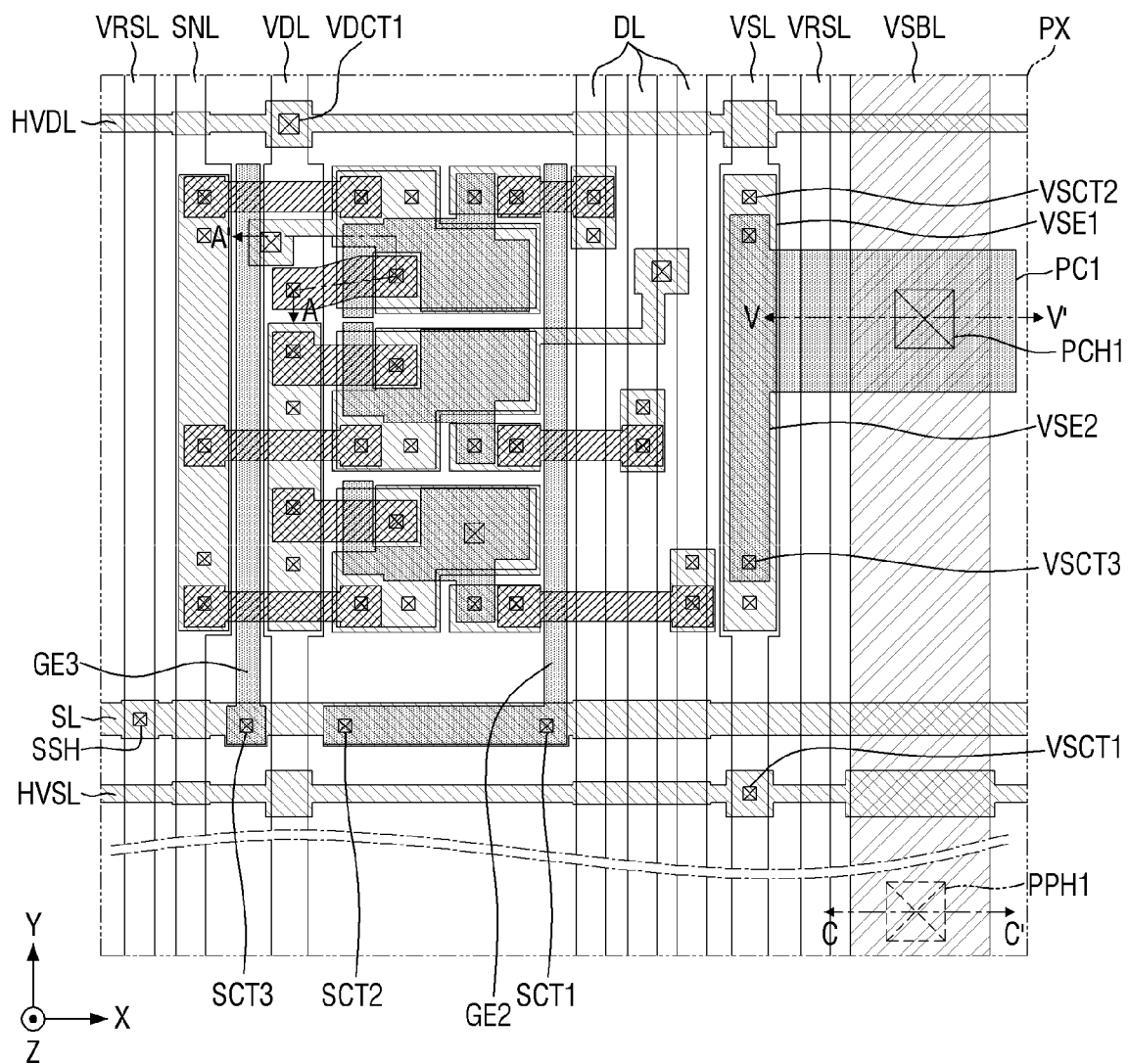
FIG. 48 is a layout view illustrating an example of a first pixel driving unit, a second pixel driving unit, a third pixel driving unit, a first power connection hole, and a first power pad hole of FIG. 46.

FIG. 48 is a layout view illustrating an example of a first pixel driving unit, a second pixel driving unit, a third pixel driving unit, a first power connection hole PCH1, and a first power pad hole of FIG. 46.

The embodiment of FIG. 48 is different from the embodiment of FIG. 24 in that vertical scan lines VRSL are added. With reference to FIG. 48, differences from the embodiment of FIG. 24 will be primarily described.

Referring to FIG. 48, a vertical scan line VRSL may be disposed between a first power line VSL and a first power connection hole PCH1. A first power connection unit PC1 and a second power connection electrode VSE2 may be integrally formed. Because the first power connection unit PC1 is disposed on or at a different layer from the vertical scan line VRSL, it may be connected to a first power bottom line VSBL through the first power connection hole PCH1 across the vertical scan line VRSL.

An example of the first display device 11 taken along the line V-V' of FIG. 48 may be substantially the same as any one of FIGS. 25, 26, and 27 except that the vertical scan line VRSL is disposed between the first power line VSL and the first power connection hole PCH1 and overlaps the first power connection unit PC1 in the third direction (e.g., the Z-axis direction).

For example, similar to FIG. 25, the first power connection unit PC1 may be connected to the first power bottom line VSBL through the first power connection hole PCH1 penetrating a second barrier layer BR2, a second substrate SUB2, a third barrier layer BR3, and a gate insulating layer 130.

Alternatively, similar to FIG. 26, the first power connection unit PC1 may be connected to the first power bottom line VSBL through the first power connection hole PCH1 penetrating the second barrier layer BR2, the third barrier layer BR3, and the gate insulating layer 130.

Alternatively, similar to FIG. 27, the first power connection unit PC1 may be connected to the first power bottom line VSBL through the first power connection hole PCH1 penetrating the third barrier layer BR3, a fourth barrier layer BR4, and the gate insulating layer 130.

Figure 49:
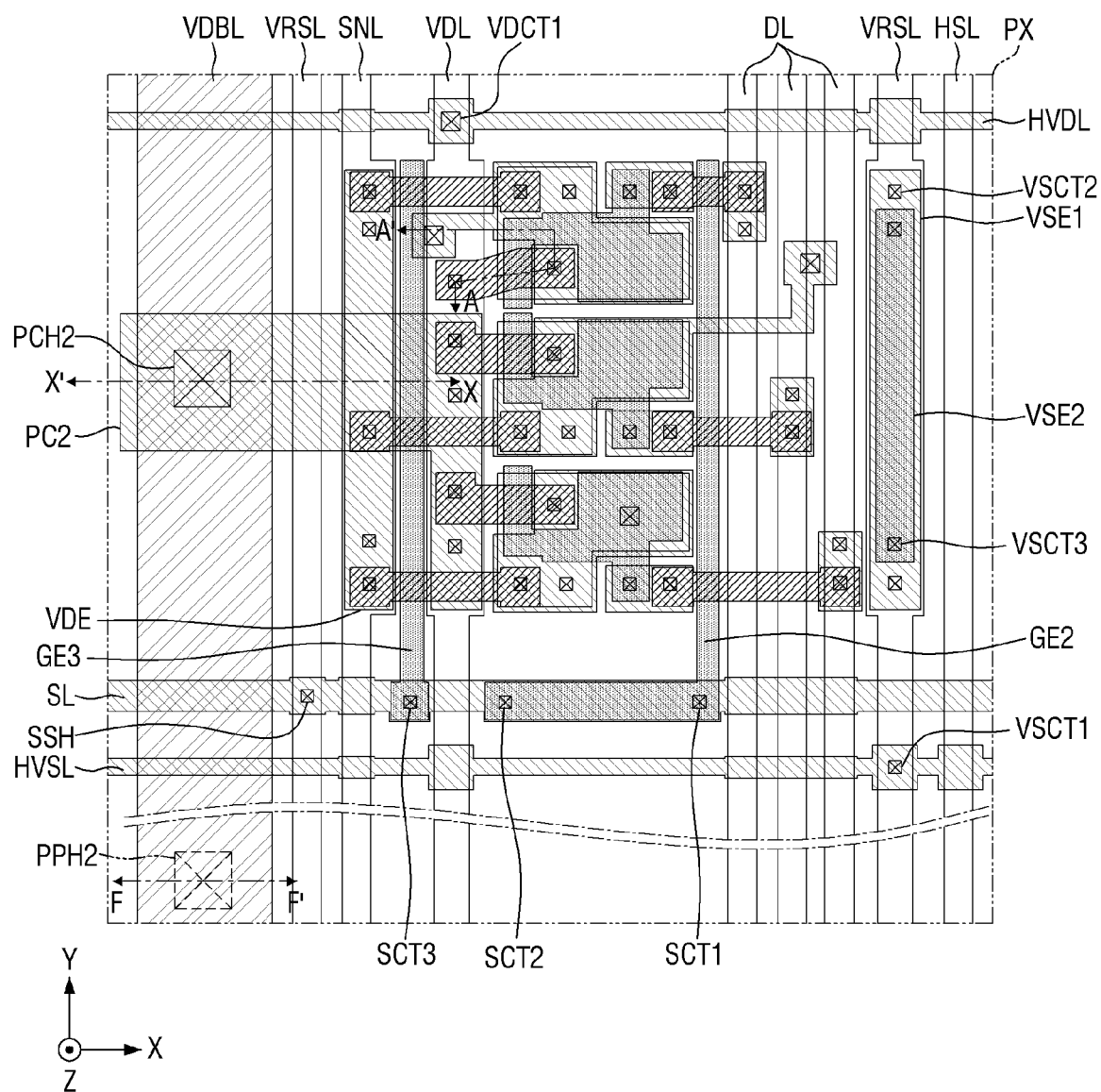
FIG. 49 is a layout view illustrating an example of a first pixel driving unit, a second pixel driving unit, a third pixel driving unit, a second power connection hole, and a second power pad hole of FIG. 46.

FIG. 49 is a layout view illustrating an example of a first pixel driving unit, a second pixel driving unit, a third pixel driving unit, a second power connection hole PCH2, and a second power pad hole of FIG. 46.

Referring to FIG. 49, a vertical scan line VRSL may be disposed between a second power line VDL and a second power connection hole PCH2. A second power connection unit PC2 and a third power connection electrode VDE may be integrally formed. Because the second power connection unit PC2 is disposed on or at a different layer from the vertical scan line VRSL, it may be connected to a second power bottom line VDBL through the second power connection hole PCH2 across the vertical scan line VRSL.

An example of the first display device 11 taken along the line X-X' of FIG. 49 may be substantially the same as any one of FIGS. 29, 30, and 31 except that the vertical scan line VRSL is disposed between the second power line VDL and the second power connection hole PCH2 and overlaps the second power connection unit PC2 in the third direction (e.g., the Z-axis direction).

For example, similar to FIG. 29, the second power connection unit PC2 may be connected to the second power bottom line VDBL through the second power connection hole PCH2 penetrating a second barrier layer BR2, a second substrate SUB2, a third barrier layer BR3, a gate insulating layer 130, and an interlayer insulating film 140.

Alternatively, similar to FIG. 30, the second power connection unit PC2 may be connected to the second power bottom line VDBL through the second power connection hole PCH2 penetrating the second barrier layer BR2, the third barrier layer BR3, the gate insulating layer 130, and the interlayer insulating film 140.

Alternatively, similar to FIG. 31, the second power connection unit PC2 may be connected to the second power bottom line VDBL through the second power connection hole PCH2 penetrating the third barrier layer BR3, a fourth barrier layer BR4, the gate insulating layer 130, and the interlayer insulating film 140.

Figure 50:
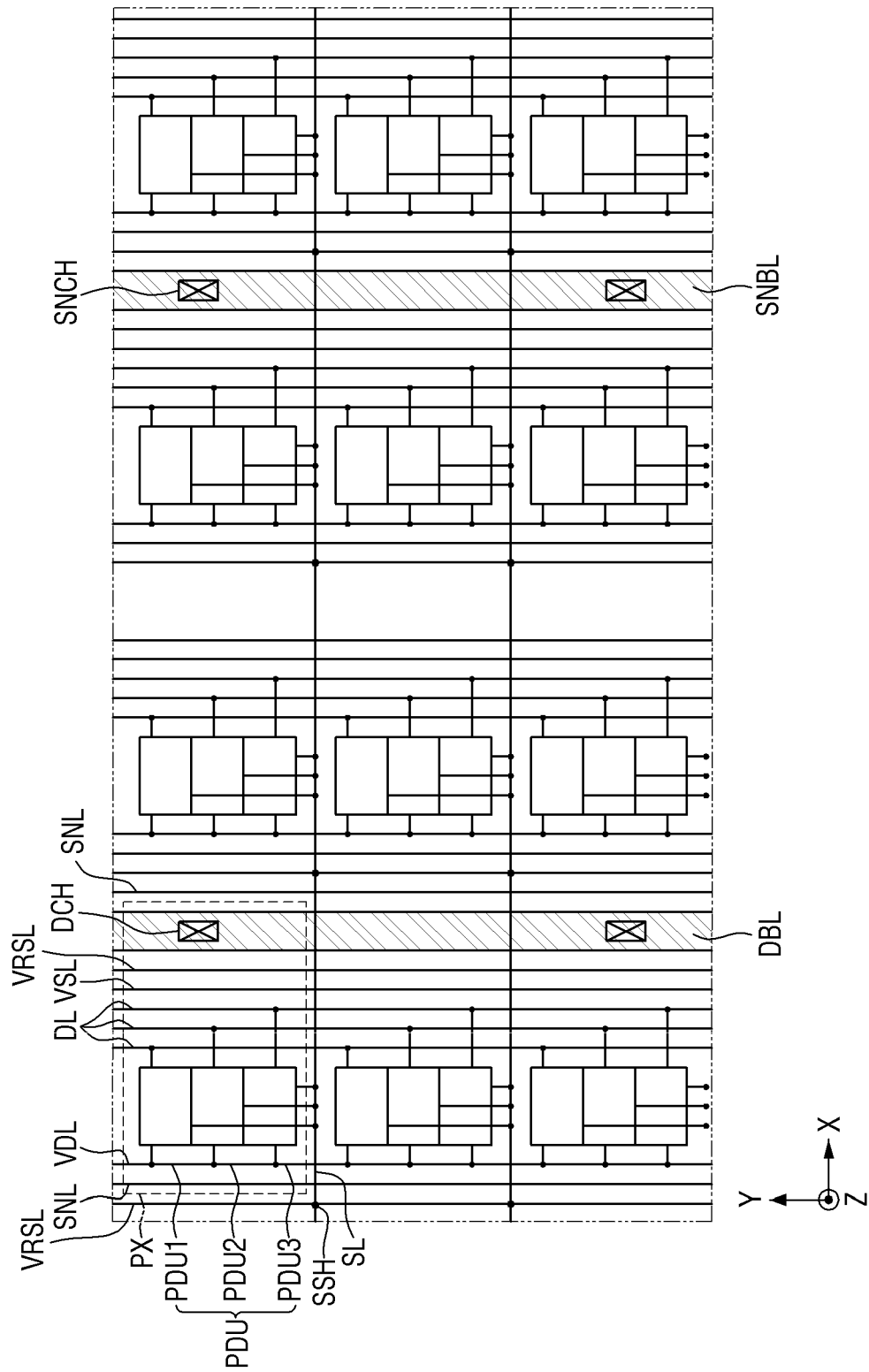
FIG. 50 is a layout view illustrating subpixels of a first display device according to one or more embodiments of the present disclosure.

FIG. 50 is a layout view illustrating subpixels of a first display device according to one or more embodiments of the present disclosure.

The embodiment of FIG. 50 is different from the embodiment of FIG. 32 in that vertical scan lines VRSL are added. With reference to FIG. 50, differences from the embodiment of FIG. 32 will be primarily described.

Referring to FIG. 50, the vertical scan lines VRSL may be connected to scan lines SL through scan holes SSH. Therefore, scan signals of the vertical scan lines VRSL may be supplied to the scan lines SL.

A vertical scan line VRSL may be disposed between a first power line VSL and data connection holes DCH. In addition, the vertical scan line VRSL may be disposed between a sensing line SNL and the data connection holes DCH.

A vertical scan line VRSL may be disposed between a first power line VSL and sensing connection holes SNCH. In addition, the vertical scan line VRSL may be disposed between a sensing line SNL and the sensing connection holes SNCH.

When the data connection holes DCH and the sensing connection holes SNCH are not disposed between the first power lines VSL and the sensing lines SNL, the vertical scan lines VRSL may be disposed between the first power lines VSL and the sensing lines SNL.

Figure 51:
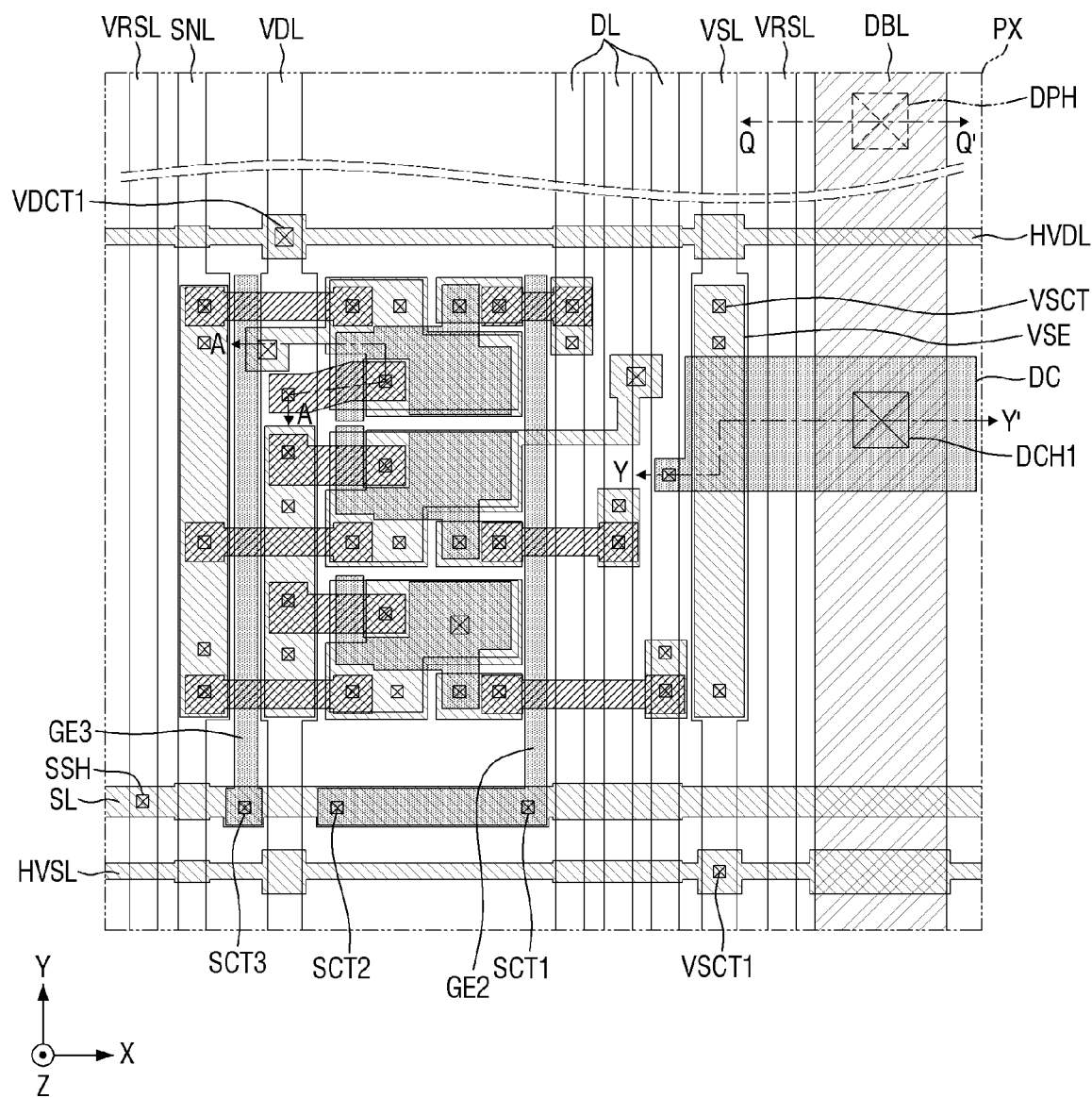
FIG. 51 is a layout view illustrating an example of a first pixel driving unit, a second pixel driving unit, a third pixel driving unit, a data connection hole, and a data pad hole of FIG. 50.

FIG. 51 is a layout view illustrating an example of a first pixel driving unit, a second pixel driving unit, a third pixel driving unit, a data connection hole, and a data pad hole of FIG. 50.

The embodiment of FIG. 51 is different from the embodiment of FIG. 33 in that vertical scan lines VRSL are added. With reference to FIG. 51, differences from the embodiment of FIG. 33 will be primarily described.

Referring to FIG. 51, a vertical scan line VRSL may be disposed between a first power line VSL and a first data connection hole DCH1. Because a data connection unit DC is disposed on or at a different layer from the vertical scan line VRSL, it may be connected to a data bottom line DBL through the first data connection hole DCH1 across the vertical scan line VRSL.

An example of the first display device taken along the line Y-Y' of FIG. 51 may be substantially the same as FIG. 34 except that the vertical scan line VRSL is disposed between the first power line VSL and the first data connection hole DCH1 and overlaps the data connection unit DC in the third direction (e.g., the Z-axis direction).

For example, similar to FIG. 34, the data connection unit DC may be connected to the data bottom line DBL through the first data connection hole DCH1 penetrating a second barrier layer BR2, a second substrate SUB2, a third barrier layer BR3, and a gate insulating layer 130.

Alternatively, when the data bottom line DBL is disposed on the second substrate SUB2, the data connection unit DC may be connected to the data bottom line DBL through the first data connection hole DCH1 penetrating the second barrier layer BR2, the third barrier layer BR3, and the gate insulating layer 130.

Alternatively, when the data bottom line DBL is disposed on the second barrier layer BR2 disposed on the second substrate SUB2, the data connection unit DC may be connected to the data bottom line DBL through the first data connection hole DCH1 penetrating the third barrier layer BR3, a fourth barrier layer BR4, and the gate insulating layer 130.

Figure 52:
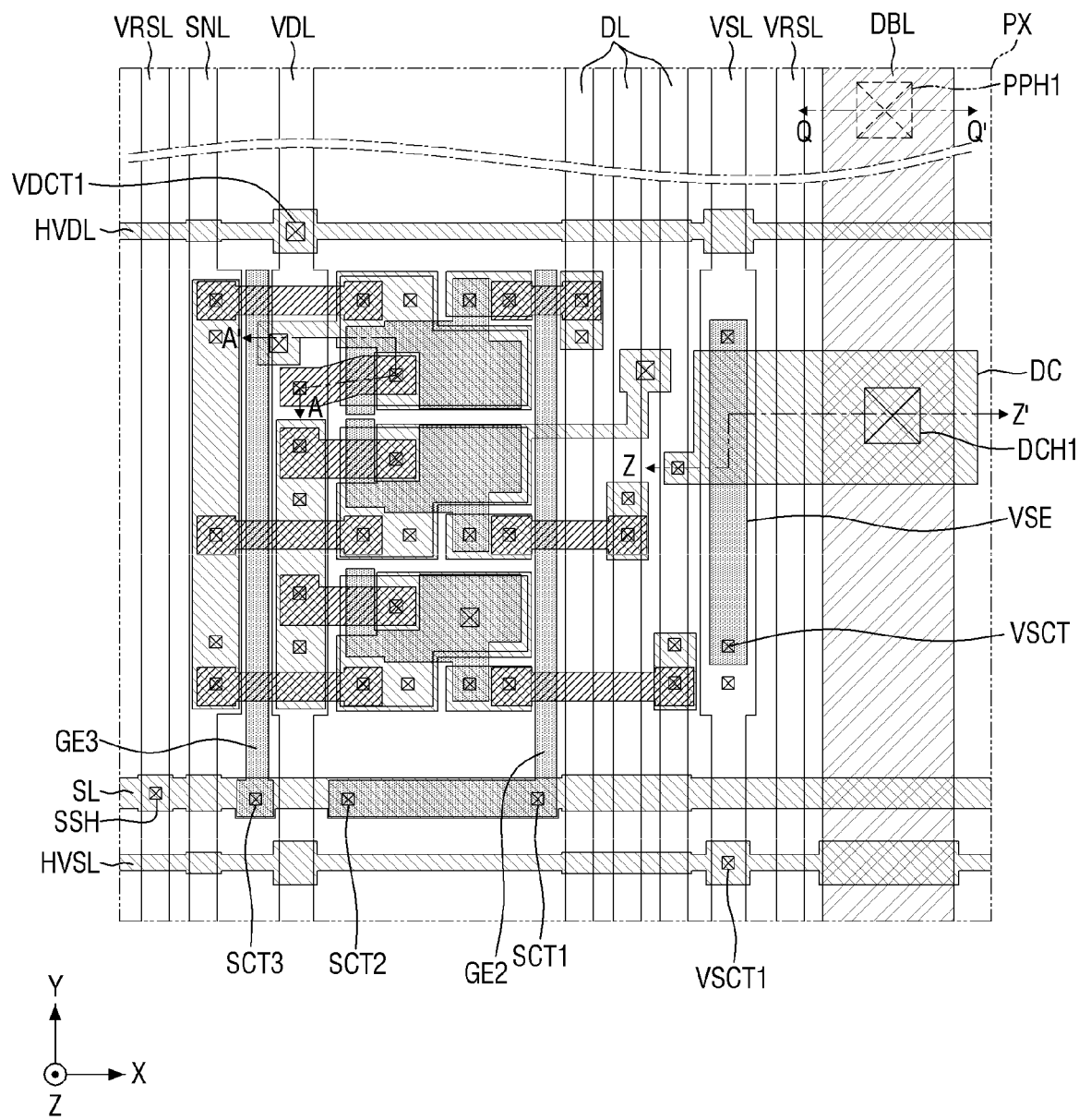
FIG. 52 is a layout view illustrating an example of a first pixel driving unit, a second pixel driving unit, a third pixel driving unit, a data connection hole, and a data pad hole of FIG. 50.

FIG. 52 is a layout view illustrating an example of a first pixel driving unit, a second pixel driving unit, a third pixel driving unit, a data connection hole, and a data pad hole of FIG. 50.

The embodiment of FIG. 52 is different from the embodiment of FIG. 35 in that vertical scan lines VRSL are added. With reference to FIG. 52, differences from the embodiment of FIG. 35 will be primarily described.

Referring to FIG. 52, a vertical scan line VRSL may be disposed between a first power line VSL and a first data connection hole DCH1. Because a data connection unit DC is disposed on or at a different layer from the vertical scan line VRSL, it may be connected to a data bottom line DBL through the first data connection hole DCH1 across the vertical scan line VRSL.

An example of the first display device taken along the line Z-Z' of FIG. 52 may be substantially the same as FIG. 36 except that the vertical scan line VRSL is disposed between the first power line VSL and the first data connection hole DCH1 and overlaps the data connection unit DC in the third direction (e.g., the Z-axis direction).

For example, similar to FIG. 36, the data connection unit DC may be connected to the data bottom line DBL through the first data connection hole DCH1 penetrating a second barrier layer BR2, a second substrate SUB2, a third barrier layer BR3, a gate insulating layer 130, and an interlayer insulating film 140.

Alternatively, when the data bottom line DBL is disposed on the second substrate SUB2, the data connection unit DC may be connected to the data bottom line DBL through the first data connection hole DCH1 penetrating the second barrier layer BR2, the third barrier layer BR3, the gate insulating layer 130, and the interlayer insulating film 140.

Alternatively, when the data bottom line DBL is disposed on the second barrier layer BR2 disposed on the second substrate SUB2, the data connection unit DC may be connected to the data bottom line DBL through the first data connection hole DCH1 penetrating the third barrier layer BR3, a fourth barrier layer BR4, the gate insulating layer 130, and the interlayer insulating film 140.

Figure 53:
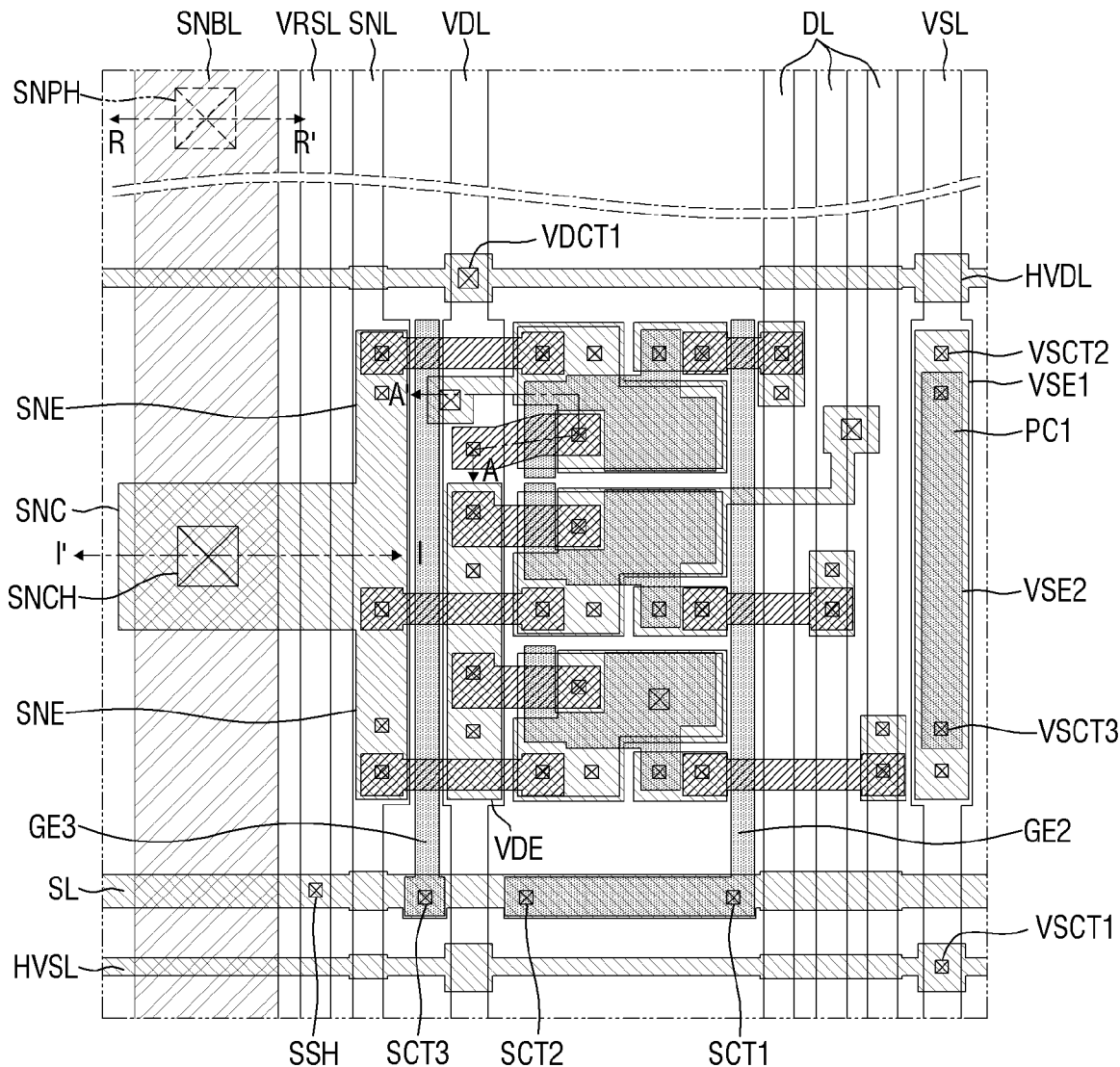
FIG. 53 is a layout view illustrating an example of a first pixel driving unit, a second pixel driving unit, a third pixel driving unit, a sensing connection hole, and a sensing pad hole of FIG. 50.

FIG. 53 is a layout view illustrating an example of a first pixel driving unit, a second pixel driving unit, a third pixel driving unit, a sensing connection hole SNCH, and a sensing pad hole of FIG. 50.

The embodiment of FIG. 53 is different from the embodiment of FIG. 37 in that vertical scan lines VRSL are added. With reference to FIG. 53, differences from the embodiment of FIG. 37 will be primarily described.

Referring to FIG. 53, a vertical scan line VRSL may be disposed between a sensing line SNL and a sensing connection hole SNCH. Because a sensing connection unit SNC is disposed on or at a different layer from the vertical scan line VRSL, it may be connected to a sensing bottom line SNBL through the sensing connection hole SNCH across the vertical scan line VRSL.

An example of the first display device taken along the line I-I' of FIG. 53 may be substantially the same as FIG. 38 except that the vertical scan line VRSL is disposed between the sensing line SNL and the sensing connection hole SNCH and overlaps the sensing connection unit SNC in the third direction (e.g., the Z-axis direction).

For example, similar to FIG. 38, the sensing connection unit SNC may be connected to the sensing bottom line SNBL through the sensing connection hole SNCH penetrating a second barrier layer BR2, a second substrate SUB2, a third barrier layer BR3, a gate insulating layer 130, and an interlayer insulating film 140. Alternatively, when the sensing bottom line SNBL is disposed on the second substrate SUB2, the sensing connection unit SNC may be connected to the sensing bottom line SNBL through the sensing connection hole SNCH penetrating the second barrier layer BR2, the third barrier layer BR3, the gate insulating layer 130, and the interlayer insulating film 140.

Alternatively, when the sensing bottom line SNBL is disposed on the second barrier layer BR2 disposed on the second substrate SUB2, the sensing connection unit SNC may be connected to the sensing bottom line SNBL through the sensing connection hole SNCH penetrating the third barrier layer BR3, a fourth barrier layer BR4, the gate insulating layer 130, and the interlayer insulating film 140.

Figure 54:
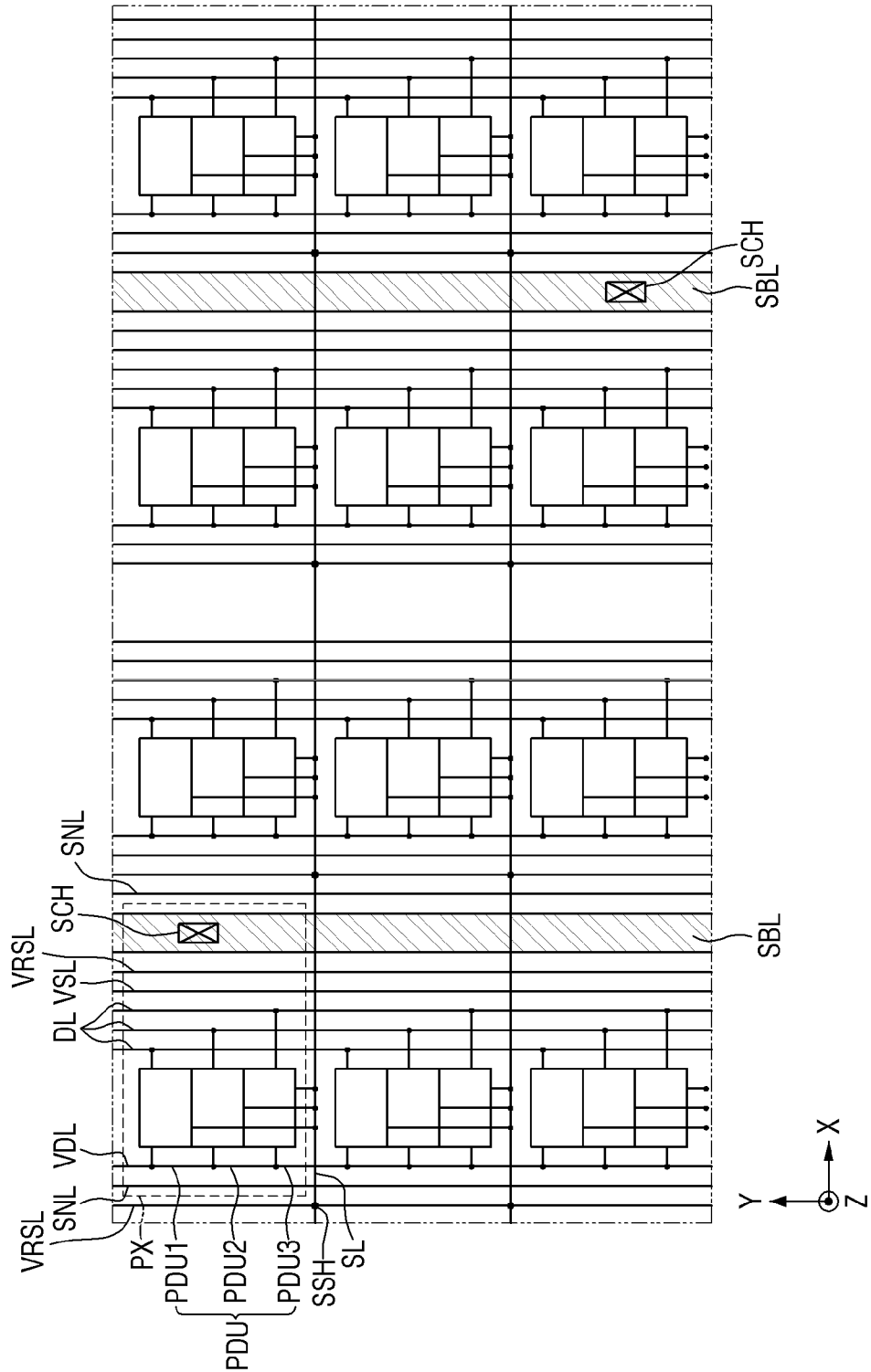
FIG. 54 is a layout view illustrating subpixels of a first display device according to one or more embodiments of the present disclosure.

FIG. 54 is a layout view illustrating subpixels of a first display device according to one or more embodiments of the present disclosure.

The embodiment of FIG. 54 is different from the embodiment of FIG. 41 in that vertical scan lines VRSL are added. With reference to FIG. 54, differences from the embodiment of FIG. 41 will be primarily described.

Referring to FIG. 54, the vertical scan lines VRSL may be connected to scan lines SL through scan holes SSH. Therefore, scan signals of the vertical scan lines VRSL may be supplied to the scan lines SL.

A vertical scan line VRSL may be disposed between a first power line VSL and a scan connection hole SCH. In addition, the vertical scan line VRSL may be disposed between a sensing line SNL and the scan connection hole SCH.

A vertical scan line VRSL may be disposed between another first power line VSL and another scan connection hole SCH. In addition, the vertical scan line VRSL may be disposed between another sensing line SNL and the scan connection hole SCH.

When the first power connection hole PCH1 and the scan connection holes SCH are not disposed between the first power lines VSL and the sensing lines SNL, the vertical scan lines VRSL may be disposed between the first power lines VSL and the sensing lines SNL.

Figure 55:
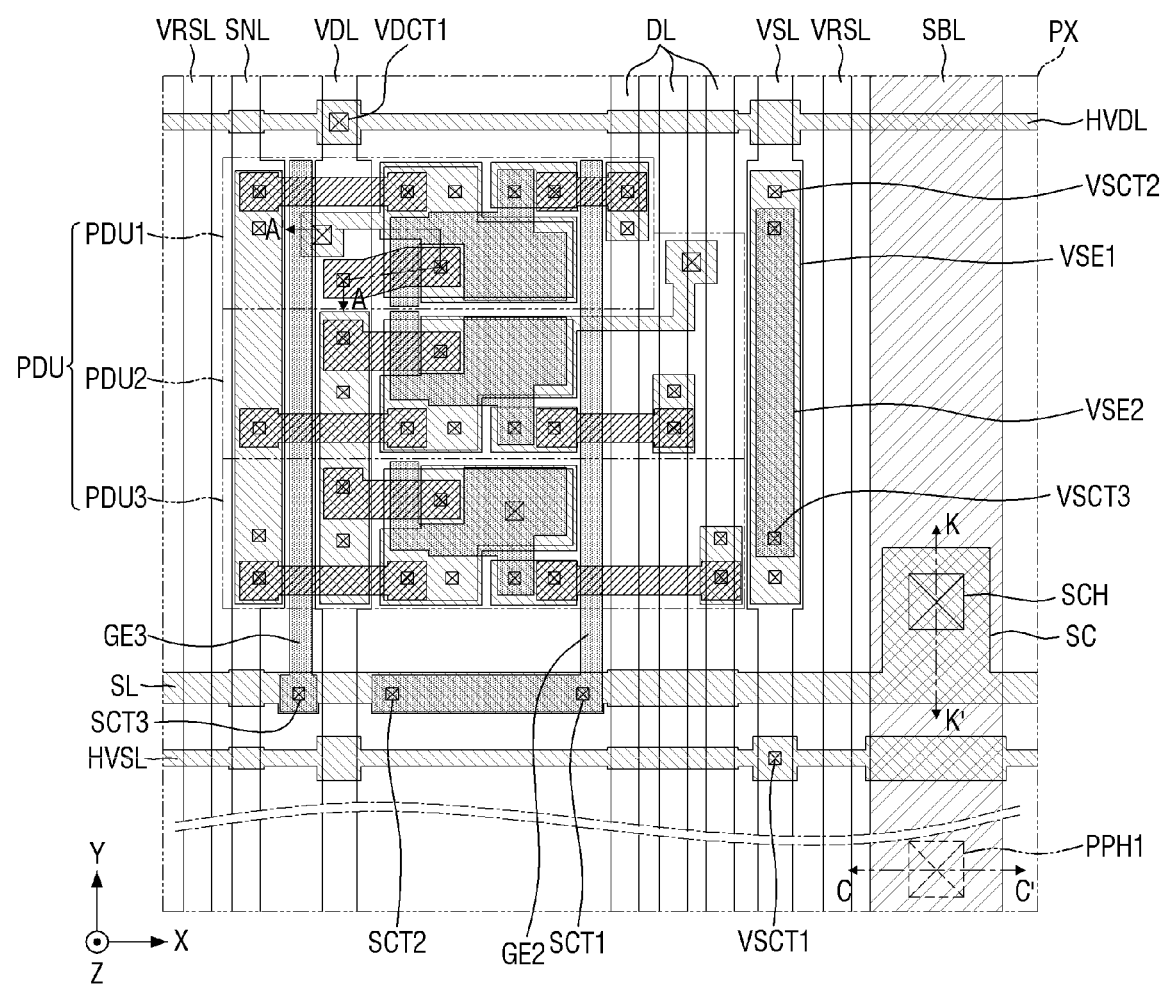
FIG. 55 is a layout view illustrating an example of a first pixel driving unit, a second pixel driving unit, a third pixel driving unit, a scan connection hole, and a scan pad hole of FIG. 54.

FIG. 55 is a layout view illustrating an example of a first pixel driving unit, a second pixel driving unit, a third pixel driving unit, a scan connection hole, and a scan pad hole of FIG. 54.

The embodiment of FIG. 55 is different from the embodiment of FIG. 42 in that vertical scan lines VRSL are added. An example of the first display device taken along the line K-K' of FIG. 55 has already been described above with reference to FIG. 43. In the present disclosure, a scan line SL, a data line DL, a sensing line SNL, a first power line VSL, and a second power line VDL may be collectively referred to as a conductive line. That is, the conductive line may include the scan line SL, the data line DL, the sensing line SNL, the first power line VSL, and the second power line VDL.

In addition, a first power bottom line VSBL, a second power bottom line VDBL, a data bottom line DBL, a sensing bottom line SNBL, and a scan bottom line SBL may be collectively referred to as a conductive bottom line. That is, the conductive bottom line may include the first power bottom line VSBL, the second power bottom line VDBL, the data bottom line DBL, the sensing bottom line SNBL, and the scan bottom line SBL.

In addition, a first power connection hole PCH1, a second power connection hole PCH2, a first data connection hole DCH1, a sensing connection hole SNCH, and a scan connection hole SCH may be collectively referred to as a conductive connection hole. That is, the conductive connection hole may include the first power connection hole PCH1, the second power connection hole PCH2, the first data connection hole DCH1, the sensing connection hole SNCH, and the scan connection hole SCH.

In addition, a first power connection unit PC1, a second power connection unit PC2, a data connection unit DC, a sensing connection unit SNC, and a scan connection unit SC may be collectively referred to as a conductive connection unit. That is, the conductive connection unit may include the first power connection unit PC1, the second power connection unit PC2, the data connection unit DC, the sensing connection unit SNC, and the scan connection unit SC.

Further, a first power pad hole PPH1, a second power pad hole PPH2, a data pad hole DPH, a sensing pad hole SNPH, and a scan pad hole SPH may be collectively referred to as a conductive pad hole. That is, the conductive pad hole may include the first power pad hole PPH1, the second power pad hole PPH2, the data pad hole DPH, the sensing pad hole SNPH, and the scan pad hole SPH.

In a display device and a tiled display device including the same according to embodiments, a scan circuit board and source circuit boards are connected to power lines, scan lines, and data lines through connection holes at a rear surface of the display device. For this reason, the scan circuit board and the source circuit boards may not be disposed on front and/or side surfaces of the display device. Therefore, it is possible to minimize or reduce a width of a coupling area disposed between a plurality of display devices in the tiled display device, thereby preventing or substantially preventing the coupling area from being recognized by a user. Accordingly, this can eliminate or reduce a sense of separation between the display devices and improve the degree of immersion in images.

In a display device and a tiled display device according to embodiments, conductive connection holes do not overlap a pixel driving unit in the third direction (e.g., the Z-axis direction). In addition, the conductive connection holes may not overlap conductive lines in the third direction (e.g., the Z-axis direction). Therefore, it is possible to prevent or substantially prevent switching elements of the pixel driving unit and the conductive lines from being stepped due to the conductive connection holes. Accordingly, it is possible to prevent or substantially prevent cracks from being generated in the switching elements of the pixel driving unit and the conductive lines by the pressure applied when circuit boards are attached.

However, the effects of the present disclosure are not restricted to the one set forth herein. The above and other effects of the present disclosure will become more apparent to one of daily skill in the art to which the present disclosure pertains by referencing the claims, and equivalents thereof.

What is claimed is:

1. A display device comprising:
a first substrate;
a first power bottom line on the first substrate;
a second substrate on the first power bottom line, the second substrate having a first power connection hole to expose the first power bottom line;
a pixel-driving unit comprising a plurality of switching elements on the second substrate; and
a light-emitting unit on the pixel-driving unit, and comprising a light-emitting element configured to receive a first power supply voltage via the first power bottom line to emit light.

2. The display device of claim 1, wherein the first power connection hole does not overlap the pixel-driving unit in a thickness direction of the second substrate.

3. The display device of claim 1, wherein the first substrate has a first power pad hole to expose the first power bottom line.

4. The display device of claim 3, further comprising:
a circuit board comprising a bump electrically connected to the first power bottom line through the first power pad hole; and
a conductive adhesive between the first power bottom line and the bump.

5. The display device of claim 4, further comprising a heat dissipation layer under the first substrate, the heat dissipation layer comprising a metal material.

6. The display device of claim 5, wherein the heat dissipation layer is on the circuit board.

7. The display device of claim 1, wherein the first power supply voltage is to be applied to the first power bottom line.

8. The display device of claim 7, further comprising a first power line on the second substrate, the first power line being electrically connected to the first power bottom line.

9. The display device of claim 8, further comprising a first power connection unit protruding from the first power line, the first power connection unit being connected to the first power bottom line through the first power connection hole.

10. The display device of claim 8, further comprising a first power connection electrode overlapping the first power line, the first power connection electrode being connected to the first power line through a first power contact hole.

11. The display device of claim 10, further comprising a first power connection unit protruding from the first power connection electrode, the first power connection unit being connected to the first power bottom line through the first power connection hole.

12. The display device of claim 11, further comprising:
a scan line extending in a first direction; and a vertical scan line extending in a second direction intersecting the first direction, the vertical scan line being connected to the scan line through a scan contact hole,
wherein the first power connection unit overlaps the vertical scan line in a thickness direction of the second substrate.

13. The display device of claim 10, further comprising a second power connection electrode overlapping the first power line and the first power connection electrode, the second power connection electrode being connected to the first power line through a second power contact hole.

14. The display device of claim 13, further comprising a first power connection unit protruding from the second power connection electrode, the first power connection unit being connected to the first power bottom line though the first power connection hole.

15. The display device of claim 14, further comprising:
a scan line extending in a first direction; and
a vertical scan line extending in a second direction intersecting the first direction, the vertical scan line being connected to the scan line through a scan contact hole,
wherein the first power connection unit overlaps the vertical scan line in a thickness direction of the second substrate.

16. The display device of claim 8, further comprising a data bottom line on the first substrate and to which a data voltage is to be applied.

17. The display device of claim 16, wherein the second substrate has a first data connection hole to expose the data bottom line.

18. The display device of claim 17, wherein the first data connection hole does not overlap the pixel-driving unit in a thickness direction of the second substrate.

19. The display device of claim 17, wherein the first substrate has a data pad hole to expose the data bottom line.

20. The display device of claim 17, further comprising a data connection unit connected to the data bottom line through the first data connection hole.

21. The display device of claim 20, further comprising a data line on the second substrate, the data line being electrically connected to the data bottom line through the data connection unit.

22. The display device of claim 20, wherein the data connection unit overlaps the first power line in a thickness direction of the second substrate.

23. The display device of claim 20, further comprising:
a scan line extending in a first direction; and
a vertical scan line extending in a second direction intersecting the first direction, the vertical scan line being connected to the scan line through a scan contact hole,
wherein the data connection unit overlaps the vertical scan line in a thickness direction of the second substrate.

24. The display device of claim 7, further comprising a second power bottom line on the first substrate and to which a second power supply voltage different from the first power supply voltage is to be applied.

25. The display device of claim 24, wherein the second substrate has a second power connection hole to expose the second power bottom line.

26. The display device of claim 25, wherein the second power connection hole does not overlap the pixel-driving unit in a thickness direction of the second substrate.

27. The display device of claim 25, wherein the first substrate has a second power pad hole to expose the second power bottom line.

28. The display device of claim 25, further comprising:
a second power line on the second substrate, the second power line being electrically connected to the second power bottom line; and
a second power connection electrode overlapping the second power line, the second power connection electrode being connected to the second power line through a second power contact hole.

29. The display device of claim 28, further comprising a second power connection unit protruding from the second power connection electrode, the second power connection unit being connected to the second power bottom line through the second power connection hole.

30. The display device of claim 29, further comprising:
a scan line extending in a first direction; and
a vertical scan line extending in a second direction intersecting the first direction, the vertical scan line being connected to the scan line through a scan contact hole,
wherein the second power connection unit overlaps the vertical scan line in a thickness direction of the second substrate.

31. The display device of claim 1, further comprising:
a wavelength conversion layer on the light-emitting unit, the wavelength conversion layer being configured to convert a wavelength of light emitted from the light-emitting unit;
a color filter layer on the wavelength conversion layer, the color filter layer being configured to transmit light having a wavelength in a range; and
an antireflection layer on the color filter layer.

32. The display device of claim 31, wherein the antireflection layer comprises a first inorganic layer, a second inorganic layer, and an organic layer, the first inorganic layer and the second inorganic layer comprising different materials from each other.

33. The display device of claim 31, further comprising:
an overcoat layer on the antireflection layer; and
a window on the overcoat layer.

34. A display device comprising:
a first substrate;
a second substrate on the first substrate;
a conductive bottom line on the second substrate;
a first barrier layer on the conductive bottom line, the first barrier layer having a conductive connection hole to expose the conductive bottom line;
a pixel-driving unit comprising a plurality of switching elements on the first barrier layer; and
a light-emitting unit on the pixel-driving unit, and comprising a light-emitting element configured to receive a first power supply voltage via the conductive bottom line to emit light.

35. The display device of claim 34, wherein the conductive connection hole does not overlap the pixel-driving unit in a thickness direction of the second substrate.

36. The display device of claim 34, wherein the first substrate and the second substrate have a conductive pad hole to expose the conductive bottom line.

37. The display device of claim 34, further comprising a second barrier layer on the second substrate, the second barrier layer being under the conductive bottom line.

38. A tiled display device comprising a plurality of display devices and a coupling area between the display devices, wherein each of the display devices comprises:

a substrate;

a pixel-driving unit comprising a plurality of switching elements on a surface of the substrate;

a first power bottom line on the surface of the substrate and to which a first power supply voltage is to be applied;

a first power line on the surface of the substrate or an other surface of the substrate, the first power line being electrically connected to the first power bottom line;

a first power connection unit protruding from the first power line, the first power connection unit being connected to the first power bottom line though a first power connection hole; and a light-emitting unit on the pixel-driving unit, and comprising a light-emitting element configured to receive the first power supply voltage via the first power bottom line to emit light, wherein the first power connection hole does not overlap the pixel-driving unit in a thickness direction of the substrate.

39. The tiled display device of claim 38, further comprising:

a second power bottom line on a surface of a first substrate and to which a second power supply voltage different from the first power supply voltage is to be applied;

a second power line on the surface of the first substrate or an other surface of the first substrate, the second power line being electrically connected to the second power bottom line; and a second power connection unit protruding from the second power line, the second power connection unit contacting the second power bottom line through a second power connection hole, wherein the second power connection hole does not overlap the pixel-driving unit in the thickness direction of the substrate.

* * * * *

UNITED STATES PATENT AND TRADEMARK OFFICE
CERTIFICATE OF CORRECTION

| | | |
|---|---|---|
| PATENT NO. | : 12,170,307 B2 | Page 1 of 1 |
| APPLICATION NO. | : 17/452763 | |
| DATED | : December 17, 2024 | |
| INVENTOR(S) | : Seung Min Lee et al. | |

It is certified that error appears in the above-identified patent and that said Letters Patent is hereby corrected as shown below:

On the Title Page

Item (72), in Column 1, under "Inventors", Line 6, delete "Anyang-si" and insert -- Asan-si --.

Signed and Sealed this
Fifteenth Day of July, 2025

Coke Morgan Stewart
*Acting Director of the United States Patent and Trademark Office*